(12) United States Patent
Suzuki et al.

(10) Patent No.: US 11,513,339 B2
(45) Date of Patent: Nov. 29, 2022

(54) OPTICAL MODULE

(71) Applicant: HAMAMATSU PHOTONICS K.K., Hamamatsu (JP)

(72) Inventors: Tomofumi Suzuki, Hamamatsu (JP); Tatsuya Sugimoto, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 111 days.

(21) Appl. No.: 16/492,691

(22) PCT Filed: Mar. 14, 2018

(86) PCT No.: PCT/JP2018/009992
§ 371 (c)(1),
(2) Date: Sep. 10, 2019

(87) PCT Pub. No.: WO2018/168935
PCT Pub. Date: Sep. 20, 2018

(65) Prior Publication Data
US 2020/0049975 A1    Feb. 13, 2020

(30) Foreign Application Priority Data

Mar. 14, 2017  (JP) .............................. JP2017-048561
Mar. 14, 2017  (JP) .............................. JP2017-048566
Apr. 4, 2017   (JP) .............................. JP2017-074492

(51) Int. Cl.
*G02B 26/08*    (2006.01)
*G02B 27/14*    (2006.01)
(Continued)

(52) U.S. Cl.
CPC ......... *G02B 26/0833* (2013.01); *G02B 27/14* (2013.01); *B81B 3/004* (2013.01); *B81B 2201/04* (2013.01); *G01J 3/45* (2013.01)

(58) Field of Classification Search
CPC ................ G02B 26/0833; G02B 27/14; G02B 26/0841; B81B 2201/04; B81B 3/004;
(Continued)

(56) References Cited

U.S. PATENT DOCUMENTS 4,973,160 A    11/1990  Takiguchi et al.
11,067,380 B2   7/2021  Suzuki et al.
(Continued)

FOREIGN PATENT DOCUMENTS

CN    1908702 A    2/2007
CN  101786592 A    7/2010
(Continued)

OTHER PUBLICATIONS

Internationl Preliminary Report on Patentability dated Sep. 26, 2019 for PCT/JP2018/010019.
(Continued)

*Primary Examiner* — Euncha P Cherry
(74) *Attorney, Agent, or Firm* — Faegre Drinker Biddle & Reath LLP

(57) ABSTRACT

An optical module includes a support layer, a device layer which is provided on the support layer, and a movable mirror which is mounted in the device layer. The device layer has a mounting region which is penetrated by the movable mirror, and a driving region which is connected to the mounting region. A space corresponding to at least the mounting region and the driving region is formed between the support layer and the device layer. A portion of the movable mirror is positioned in the space.

11 Claims, 54 Drawing Sheets

(51) Int. Cl.
 *B81B 3/00* (2006.01)
 *G01J 3/45* (2006.01)
(58) Field of Classification Search
 CPC .... G01J 3/45; G01J 3/06; G01J 3/4532; G01J 3/4535; G01J 3/0202; G01J 3/0218; G01J 3/0205; G01J 3/0256
 See application file for complete search history.

(56) References Cited

U.S. PATENT DOCUMENTS

| | | | |
|---|---|---|---|
| 2001/0048784 A1* | 12/2001 | Behin | G02B 26/0833 385/18 |
| 2001/0053261 A1 | 12/2001 | Goldstein et al. | |
| 2002/0186477 A1 | 12/2002 | Wang et al. | |
| 2003/0049879 A1 | 3/2003 | Lin | |
| 2003/0227681 A1 | 12/2003 | Currie | |
| 2004/0028321 A1 | 2/2004 | Sunaga et al. | |
| 2008/0100899 A1 | 5/2008 | Shimokawa et al. | |
| 2010/0103492 A1 | 4/2010 | Maruyama et al. | |
| 2010/0188728 A1 | 7/2010 | Warashina et al. | |
| 2010/0208347 A1 | 8/2010 | Kouma et al. | |
| 2010/0265512 A1 | 10/2010 | Medhat et al. | |
| 2012/0099176 A1 | 4/2012 | Zhou | |
| 2012/0327493 A1 | 12/2012 | Koide et al. | |
| 2014/0019236 A1 | 1/2014 | Argue et al. | |
| 2014/0104687 A1 | 4/2014 | Warashina et al. | |
| 2014/0139924 A1 | 5/2014 | Warashina et al. | |
| 2014/0168736 A1 | 6/2014 | Mizoguchi | |
| 2014/0192365 A1 | 7/2014 | Mortada et al. | |
| 2016/0299335 A1* | 10/2016 | Hofmann | G02B 26/101 |
| 2020/0124469 A1 | 4/2020 | Sugimoto et al. | |
| 2021/0130159 A1 | 5/2021 | Sugimoto et al. | |
| 2021/0148690 A1 | 5/2021 | Suzuki et al. | |
| 2021/0155471 A1 | 5/2021 | Sugimoto et al. | |
| 2021/0191106 A1 | 6/2021 | Sugimoto et al. | |
| 2021/0278274 A1 | 9/2021 | Suzuki et al. | |

FOREIGN PATENT DOCUMENTS

| | | |
|---|---|---|
| CN | 102466828 A | 5/2012 |
| CN | 103210445 A | 7/2013 |
| CN | 103547528 A | 1/2014 |
| CN | 103582830 A | 2/2014 |
| CN | 104216107 A | 12/2014 |
| CN | 104272070 A | 1/2015 |
| CN | 105164568 A | 12/2015 |
| CN | 105552125 A | 5/2016 |
| CN | 105849618 A | 8/2016 |
| CN | 105992964 A | 10/2016 |
| CN | 106444017 A | 2/2017 |
| CN | 106468828 A | 3/2017 |
| JP | 2003-159698 A | 6/2003 |
| JP | 2004-82288 A | 3/2004 |
| JP | 2004-102315 A | 4/2004 |
| JP | 2005-43870 A | 2/2005 |
| JP | 2005-308863 A | 11/2005 |
| JP | 2006-091666 A | 4/2006 |
| JP | 2006-102934 A | 4/2006 |
| JP | 2010-170029 A | 8/2010 |
| JP | 2010-184334 A | 8/2010 |
| JP | 2010-286609 A | 12/2010 |
| JP | 2011-2698 A | 1/2011 |
| JP | 2012-524295 A | 10/2012 |
| JP | 2012-215691 A | 11/2012 |
| JP | 2012-240129 A | 12/2012 |
| JP | 2012-242450 A | 12/2012 |
| JP | 2014-055871 A | 3/2014 |
| JP | 2014-192365 A | 10/2014 |
| WO | WO 2008/084520 A1 | 7/2008 |
| WO | WO-2010/121185 A1 | 10/2010 |
| WO | WO 2007/002101 A1 | 1/2012 |

OTHER PUBLICATIONS

Internationl Preliminary Report on Patentability dated Sep. 26, 2019 for PCT/JP2018/009992.
Internationl Preliminary Report on Patentability dated Sep. 26, 2019 for PCT/JP2018/009975.
Internationl Preliminary Report on Patentability dated Sep. 26, 2019 for PCT/JP2018/009973.
Shujing Su et al., "The Design of Two-kind Wafer Micro-mirror Actuated by Heat," Journal of Test and Measurement Technology, North China Institute of Technology, 030051, vol. 16, Jun. 2002, Dec. 31, 2002.
Zongquan Deng, "Design of Space Deployable and Foldable Mechanisms", Harbin Institute of Technology Press, Jun. 2013 (including abstract).

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(c)

(b)

(a)

(b)

(c)

(a)

(b)

(b)

(c)

(a)

(b)

(c)

(a)

(b)

(a)

(b)

(a)

(b)

OPTICAL MODULE

TECHNICAL FIELD

An aspect of the present disclosure relates to an optical module.

BACKGROUND ART

Optical modules in which an interference optical system is formed on a silicon-on-insulator (SOI) substrate by a micro electro mechanical systems (MEMS) technology are known (for example, refer to Patent Literature 1). Such optical modules have attracted attention because they can provide users with a Fourier transform infrared spectroscopic analyzer (FTIR) in which highly accurate optical disposition is realized.

CITATION LIST

Patent Literature

Patent Literature 1: Japanese Unexamined Patent Publication No. 2012-524295

SUMMARY OF INVENTION

Technical Problem

However, the foregoing optical modules have the following problem in respect that the size of a movable mirror depends on a degree of completion of deep cutting with respect to an SOI substrate, for example. That is, since the degree of completion of deep cutting with respect to an SOI substrate is approximately 500 μm at the maximum, there is a limitation in increasing the size of a movable mirror for the sake of improvement of sensitivity of an FTIR. Here, a technology of mounting a separately formed movable mirror in a device layer (for example, a layer of an SOI substrate in which a driving region is formed) may be taken into consideration.

An object of an aspect of the present disclosure is to provide an optical module in which reliable mounting of a movable mirror with respect to a device layer is realized.

Solution to Problem

According to an aspect of the present disclosure, there is provided an optical module including a support layer, a device layer which is provided on the support layer, and a movable mirror which is mounted in the device layer. The device layer has a mounting region which is penetrated by the movable mirror, and a driving region which is connected to the mounting region. A space corresponding to at least the mounting region and the driving region is formed between the support layer and the device layer. A portion of the movable mirror is positioned in the space.

In this optical module, the movable mirror penetrates the mounting region of the device layer, and a portion of the movable mirror is positioned in the space formed between the support layer and the device layer. Accordingly, the movable mirror can be stably and firmly fixed to the mounting region of the device layer. Thus, according to this optical module, it is possible to realize reliable mounting of the movable mirror with respect to the device layer.

According to the aspect of the present disclosure, the optical module may further include an intermediate layer which is provided between the support layer and the device layer. A first opening may be formed in the intermediate layer. A recess portion or a second opening may be formed in the support layer. The space may include a region inside the first opening and a region inside the recess portion, or a region inside the first opening and a region inside the second opening. The portion of the movable mirror may be positioned in a region inside the recess portion or a region inside the second opening. Accordingly, it is possible to favorably realize a configuration for reliable mounting of the movable mirror with respect to the device layer.

According to the aspect of the present disclosure, in the optical module, the support layer may be a first silicon layer of an SOI substrate. The device layer may be a second silicon layer of the SOI substrate. The intermediate layer may be an insulating layer of the SOI substrate. Accordingly, it is possible to favorably realize a configuration for reliable mounting of the movable mirror with respect to the device layer using the SOI substrate.

According to the aspect of the present disclosure, in the optical module, a recess portion or an opening may be formed in the support layer. The space may include a region inside the recess portion or a region inside the opening. The portion of the movable mirror may be positioned in a region inside the recess portion or a region inside the opening. Accordingly, it is possible to favorably realize a configuration for reliable mounting of the movable mirror with respect to the device layer.

According to the aspect of the present disclosure, in the optical module, a recess portion may be formed in the device layer. The space may include a region inside the recess portion. The portion of the movable mirror may be positioned in a region inside the recess portion. Accordingly, it is possible to favorably realize a configuration for reliable mounting of the movable mirror with respect to the device layer.

According to the aspect of the present disclosure, in the optical module, a first recess portion may be formed in the device layer. A second recess portion or an opening may be formed in the support layer. The space may include a region inside the first recess portion and a region inside the second recess portion, or a region inside the first recess portion and a region inside the opening. The portion of the movable mirror may be positioned in a region inside the second recess portion or a region inside the opening. Accordingly, it is possible to favorably realize a configuration for reliable mounting of the movable mirror with respect to the device layer.

According to the aspect of the present disclosure, in the optical module, a mirror surface of the movable mirror may be positioned on a side opposite to the support layer with respect to the device layer. Accordingly, it is possible to simplify the configuration of the optical module.

According to the aspect of the present disclosure, the optical module may further include a fixed mirror which is mounted in at least one of the support layer, the device layer, and the intermediate layer which is provided between the support layer and the device layer; and a beam splitter which is mounted in at least one of the support layer, the device layer, and the intermediate layer. The movable mirror, the fixed mirror, and the beam splitter may be disposed such that an interference optical system is constituted. Accordingly, it is possible to obtain an FTIR having improved sensitivity.

According to the aspect of the present disclosure, the optical module may further include a light incident unit which is disposed such that measurement light is incident on the interference optical system from outside, and a light emission unit which is disposed such that the measurement light is emitted from the interference optical system to the outside. Accordingly, it is possible to obtain an FTIR including a light incident unit and a light emission unit.

Advantageous Effects of Invention

According to the aspect of the present disclosure, it is possible to provide an optical module in which reliable mounting of a movable mirror with respect to a device layer is realized.

DESCRIPTION OF EMBODIMENTS

First Embodiment

Hereinafter, an embodiment of an aspect of the present disclosure will be described in detail with reference to the drawings. The same reference signs are applied to parts which are the same or corresponding in each of the drawings, and duplicated parts will be omitted.

[Configuration of Optical Module]

Figure 1:
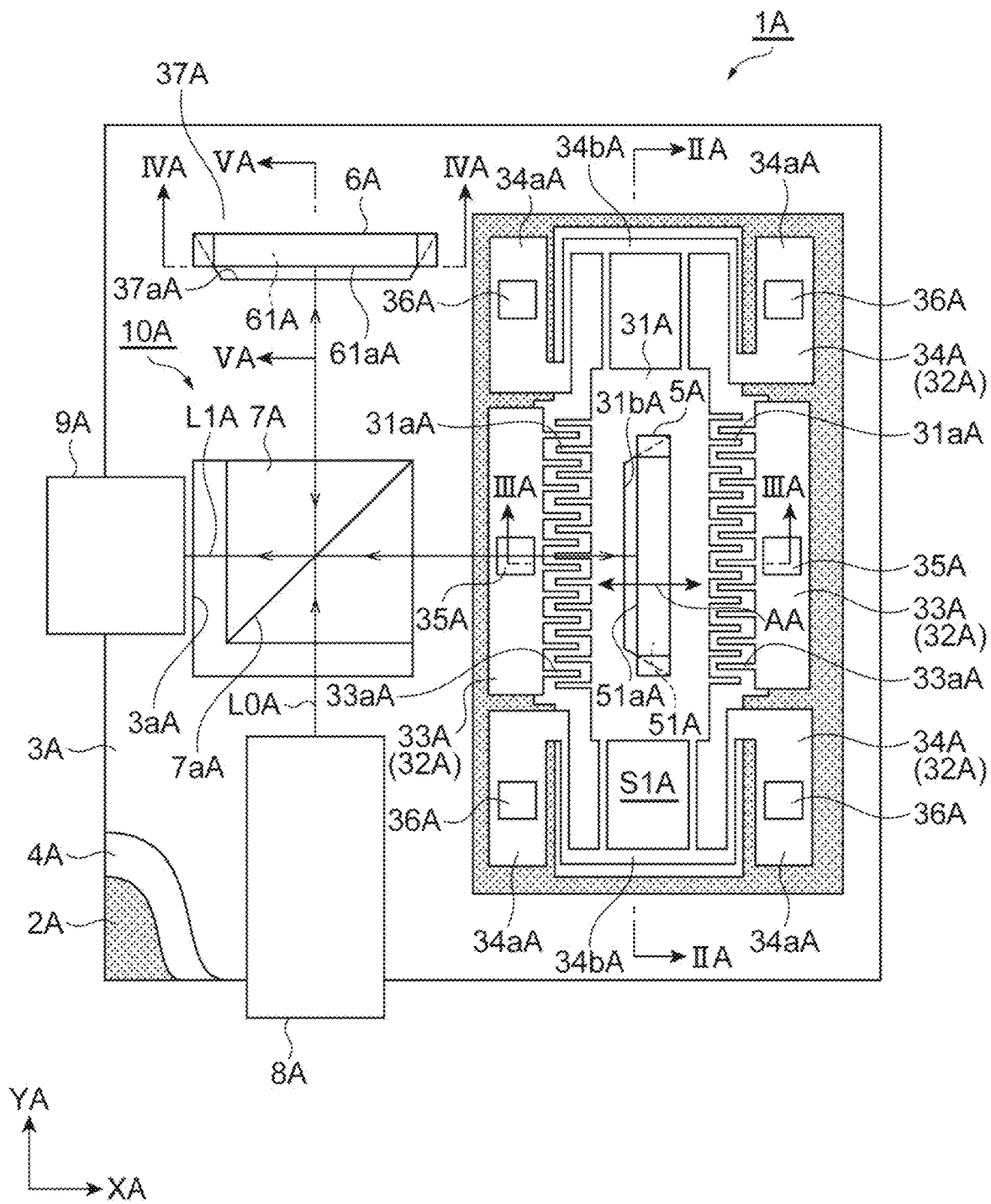
FIG. 1 is a plan view of an optical module of an embodiment.

As illustrated in FIG. 1, an optical module 1A includes a support layer 2A, a device layer 3A which is provided on the support layer 2A, and an intermediate layer 4A which is provided between the support layer 2A and the device layer 3A. The support layer 2A, the device layer 3A, and the intermediate layer 4A are constituted of an SOI substrate. Specifically, the support layer 2A is a first silicon layer of the SOI substrate. The device layer 3A is a second silicon layer of the SOI substrate. The intermediate layer 4A is an insulating layer of the SOI substrate. The support layer 2A, the device layer 3A, and the intermediate layer 4A exhibit a rectangular shape of which one side is approximately 10 mm, for example, when viewed in a ZA-axis direction (direction parallel to a ZA-axis) that is a laminating direction thereof. The thickness of each of the support layer 2A and the device layer 3A is approximately several hundreds of µm, for example. The thickness of the intermediate layer 4A is approximately several µm, for example. FIG. 1 illustrates the device layer 3A and the intermediate layer 4A in a state where one corner portion of the device layer 3A and one corner portion of the intermediate layer 4A are cut out.

The device layer 3A has a mounting region 31A and a driving region 32A which is connected to the mounting region 31A. The driving region 32A includes a pair of actuator regions 33A and a pair of elastic support regions 34A. The mounting region 31A and the driving region 32A (that is, the mounting region 31A, the pair of actuator regions 33A, and the pair of elastic support regions 34A) are integrally formed in a portion of the device layer 3A by a MEMS technology (patterning and etching).

The actuator regions 33A of the pair are disposed on both sides of the mounting region 31A in an XA-axis direction (direction parallel to an XA-axis orthogonal to the ZA-axis). That is, the mounting region 31A is sandwiched between the actuator regions 33A of the pair in the XA-axis direction. Each of the actuator regions 33A is fixed to the support layer 2A with the intermediate layer 4A interposed therebetween. A first comb-teeth portion 33aA is provided on a side surface of each of the actuator regions 33A on the mounting region 31A side. Each of the first comb-teeth portions 33aA is in a state of being floated with respect to the support layer 2A by removing the intermediate layer 4A immediately below thereof. A first electrode 35A is provided in each of the actuator regions 33A.

The elastic support regions 34A of the pair are disposed on both sides of the mounting region 31A in a YA-axis direction (direction parallel to a YA-axis orthogonal to the ZA-axis and the XA-axis). That is, the mounting region 31A is sandwiched between the elastic support regions 34A of the pair in the YA-axis direction. Both end portions 34aA of each of the elastic support regions 34A are fixed to the support layer 2A with the intermediate layer 4A interposed therebetween. An elastic deformation portion 34bA (part between both the end portions 34aA) of each of the elastic support regions 34A has a structure in which a plurality of leaf springs are connected. The elastic deformation portion 34bA of each of the elastic support regions 34A is in a state of being floated with respect to the support layer 2A by removing the intermediate layer 4A immediately below thereof is. A second electrode 36A is provided in each of both the end portions 34aA in each of the elastic support regions 34A.

The elastic deformation portion 34bA of each of the elastic support regions 34A is connected to the mounting region 31A. The mounting region 31A is in a state of being floated with respect to the support layer 2A by removing the intermediate layer 4A immediately below thereof. That is, the mounting region 31A is supported by the pair of elastic support regions 34A. Second comb-teeth portions 31aA are provided on side surfaces of the mounting region 31A on the actuator region 33A side. Each of the second comb-teeth portions 31aA is in a state of being floated with respect to the support layer 2A by removing the intermediate layer 4A immediately below thereof. In the first comb-teeth portions 33aA and the second comb-teeth portions 31aA facing each other, each comb tooth of the first comb-teeth portions 33aA is positioned between comb teeth of the second comb-teeth portions 31aA.

The elastic support regions 34A of the pair sandwich the mounting region 31A from both sides when viewed in a direction AA parallel to the XA-axis. When the mounting region 31A moves in the direction AA, the pair of elastic support regions 34A causes an elastic force to act on the mounting region 31A such that the mounting region 31A returns to the initial position. Therefore, when a voltage is applied to a part between the first electrode 35A and the second electrode 36A such that an electrostatic attraction acts between the first comb-teeth portions 33aA and the second comb-teeth portions 31aA facing each other, the mounting region 31A moves in the direction AA to a position where the electrostatic attraction and the elastic force of the pair of elastic support regions 34A are balanced. In this manner, the driving region 32A functions as an electrostatic actuator.

The optical module 1A further includes a movable mirror 5A, a fixed mirror 6A, a beam splitter 7A, a light incident unit 8A, and a light emission unit 9A. The movable mirror 5A, the fixed mirror 6A, and the beam splitter 7A are disposed on the device layer 3A such that an interference optical system 10A (Michelson interference optical system) is constituted.

The movable mirror 5A is mounted in the mounting region 31A of the device layer 3A on one side of the beam splitter 7A in the XA-axis direction. A mirror surface 51aA of a mirror portion 51A included in the movable mirror 5A is positioned on a side opposite to the support layer 2A with respect to the device layer 3A. For example, the mirror surface 51aA is a surface perpendicular to the XA-axis direction (that is, a surface perpendicular to the direction AA) and is directed to the beam splitter 7A side.

The fixed mirror 6A is mounted in a mounting region 37A of the device layer 3A on one side of the beam splitter 7A in the YA-axis direction. A mirror surface 61aA of a mirror portion 61A included in the fixed mirror 6A is positioned on a side opposite to the support layer 2A with respect to the device layer 3A. For example, the mirror surface 61aA is a surface perpendicular to the YA-axis direction and is directed to the beam splitter 7A side.

The light incident unit 8A is mounted in the device layer 3A on the other side of the beam splitter 7A in the YA-axis direction. For example, the light incident unit 8A is constituted of optical fibers, a collimating lens, and the like. The light incident unit 8A is disposed such that measurement light is incident on the interference optical system 10A from outside.

The light emission unit 9A is mounted in the device layer 3A on the other side of the beam splitter 7A in the XA-axis direction. For example, the light emission unit 9A is constituted of optical fibers, a collimating lens, and the like. The light emission unit 9A is disposed such that measurement light (interference light) is emitted from the interference optical system 10A to the outside.

The beam splitter 7A is a cube-type beam splitter having an optical functional surface 7aA. The optical functional surface 7aA is positioned on a side opposite to the support layer 2A with respect to the device layer 3A. The beam splitter 7A is positionally aligned when one corner portion of the beam splitter 7A on a bottom surface side is brought into contact with one corner of a rectangular opening 3aA formed in the device layer 3A. The beam splitter 7A is mounted in the support layer 2A by being fixed to the support layer 2A through bonding or the like in a positionally aligned state.

In the optical module 1A having a configuration described above, when measurement light L0A is incident on the interference optical system 10A from outside via the light incident unit 8A, a portion of the measurement light L0A is reflected by the optical functional surface 7aA of the beam splitter 7A and travels toward the movable mirror 5A, and the remaining portion of the measurement light L0A is transmitted through the optical functional surface 7aA of the beam splitter 7A and travels toward the fixed mirror 6A. A portion of the measurement light L0A is reflected by the mirror surface 51aA of the movable mirror 5A, travels toward the beam splitter 7A along the same optical path, and is transmitted through the optical functional surface 7aA of the beam splitter 7A. The remaining portion of the measurement light L0A is reflected by the mirror surface 61aA of the fixed mirror 6A, travels toward the beam splitter 7A along the same optical path, and is reflected by the optical functional surface 7aA of the beam splitter 7A. A portion of the measurement light L0A which has been transmitted through the optical functional surface 7aA of the beam splitter 7A, and the remaining portion of the measurement light L0A which has been reflected by the optical functional surface 7aA of the beam splitter 7A become measurement light L1A (interference light). The measurement light L1A is emitted from the interference optical system 10A to the outside via the light emission unit 9A. According to the optical module 1A, since the movable mirror 5A can reciprocate in the direction AA at a high speed, it is possible to provide a small-sized FTIR having high accuracy.

[Movable Mirror and Surrounding Structure Thereof]

Figure 2:
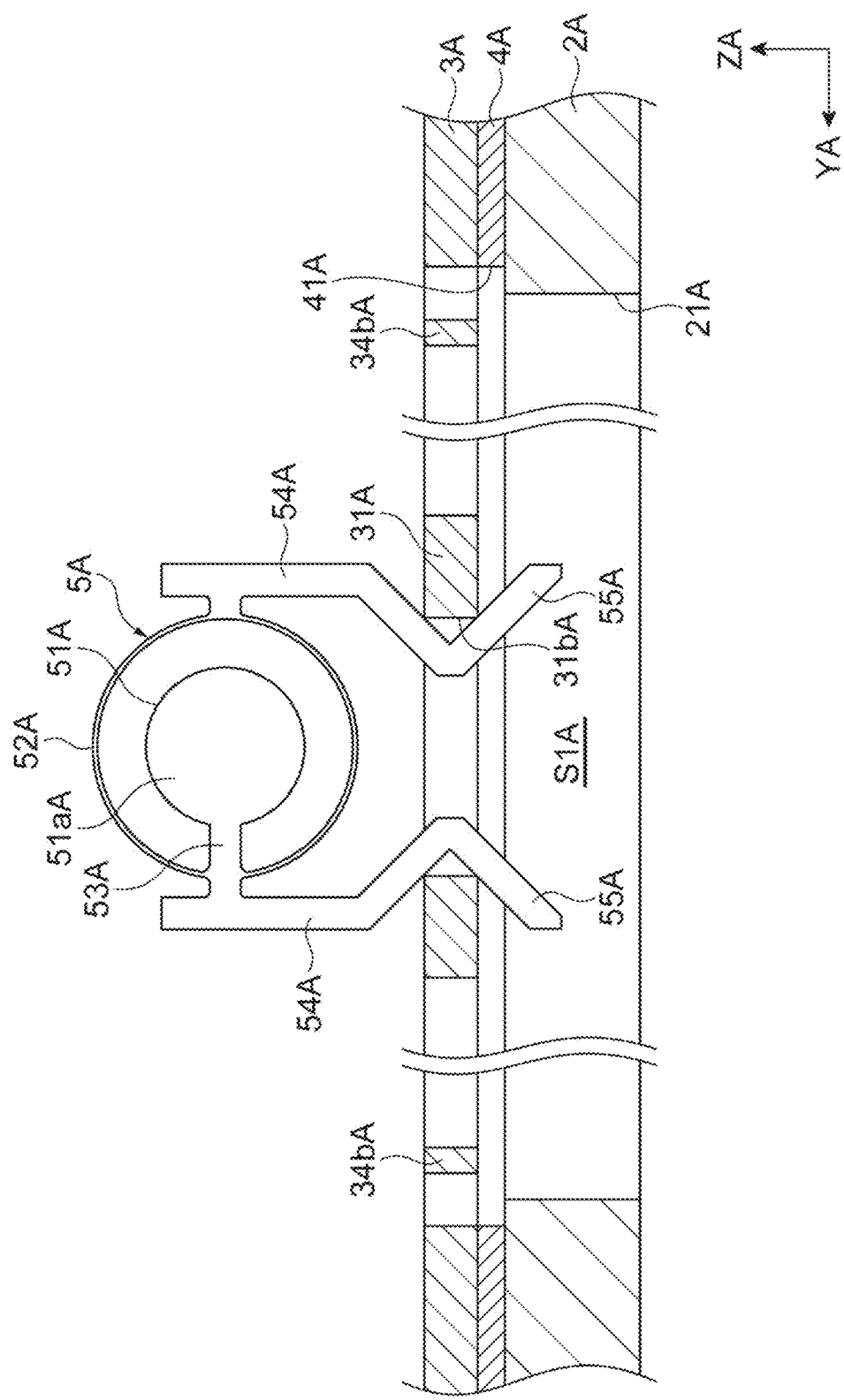
FIG. 2 is a cross-sectional view taken along line IIA-IIA illustrated in FIG. 1.
Figure 3:
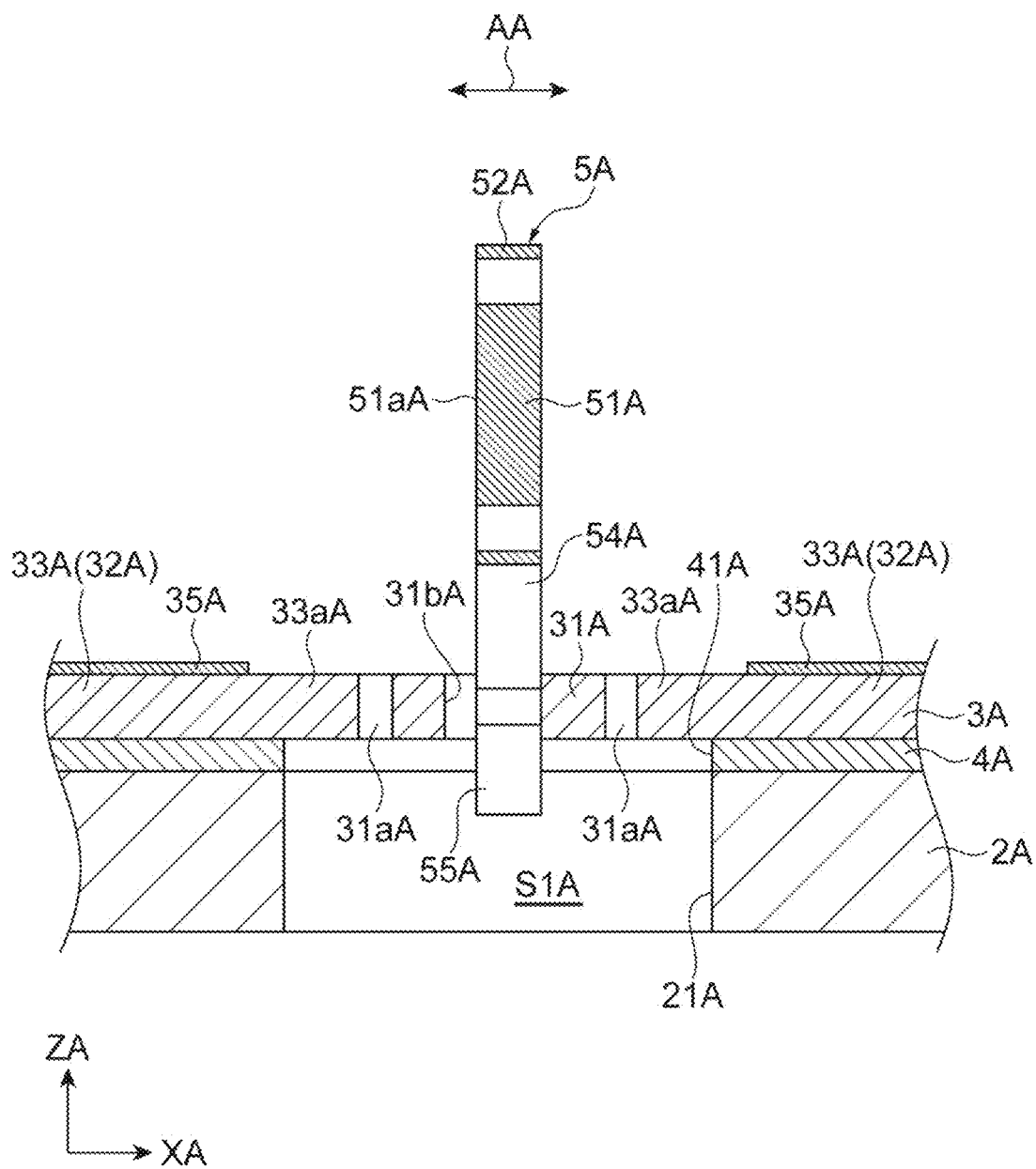
FIG. 3 is a cross-sectional view taken along line IIIA-IIIA illustrated in FIG. 1.

As illustrated in FIGS. 2 and 3, the movable mirror 5A has the mirror portion 51A, an elastic portion 52A, a connecting portion 53A, a pair of leg portions 54A, and a pair of interlock portions 55A. The movable mirror 5A having a configuration described below is integrally formed by a MEMS technology (patterning and etching).

The mirror portion 51A is formed to have a plate shape (for example, a disk shape) having the mirror surface 51aA as a main surface. The elastic portion 52A is formed to have an annular shape (for example, a circular shape) being separated from the mirror portion 51A and surrounding the mirror portion 51A when viewed in the XA-axis direction (direction perpendicular to the mirror surface 51aA). The connecting portion 53A connects the mirror portion 51A and the elastic portion 52A to each other on one side in the YA-axis direction with respect to the center of the mirror portion 51A when viewed in the XA-axis direction.

The leg portions 54A of the pair are connected to an outer surface of the elastic portion 52A on both sides in the YA-axis direction with respect to the center of the mirror portion 51A when viewed in the XA-axis direction. That is, the mirror portion 51A and the elastic portion 52A are sandwiched between the leg portions 54A of the pair in the YA-axis direction. Each of the leg portions 54A extends to the mounting region 31A side beyond the mirror portion 51A and the elastic portion 52A. The interlock portions 55A of the pair are respectively provided in end portions of the leg portions 54A on the mounting region 31A side. The interlock portions 55A are formed to be bent inward (toward each other) in a V-shape, for example, when viewed in the XA-axis direction.

The movable mirror 5A having a configuration described above is mounted in the mounting region 31A when the pair of interlock portions 55A is disposed in an opening 31bA formed in the mounting region 31A. The opening 31bA is open on both sides of the mounting region 31A in the ZA-axis direction. A portion of each of the interlock portions 55A protrudes from a surface of the mounting region 31A on the intermediate layer 4A side. That is, the movable mirror 5A penetrates the mounting region 31A.

Forces act outward (away from each other) on the pair of interlock portions 55A disposed in the opening 31bA of the mounting region 31A. The movable mirror 5A is fixed to the mounting region 31A due to the forces. The forces are generated due to the annular elastic portion 52A which is compressed when the movable mirror 5A is mounted in the mounting region 31A and has a tendency of being restored to the initial state.

As illustrated in FIG. 1, the opening 31bA is formed to have a trapezoidal shape widening toward the end on a side opposite to the beam splitter 7A when viewed in the ZA-axis direction. When the pair of interlock portions 55A exhibiting inwardly bent shapes engages with the opening 31bA exhibiting such a shape, the movable mirror 5A is positionally aligned (self-aligned) in each of the XA-axis direction, the YA-axis direction, and the ZA-axis direction in an automatic manner.

As illustrated in FIGS. 2 and 3, an opening (first opening) 41A is formed in the intermediate layer 4A. The opening 41A is open on both sides of the intermediate layer 4A in the ZA-axis direction. An opening (second opening) 21A is formed in the support layer 2A. The opening 21A is open on both sides of the support layer 2A in the ZA-axis direction. In the optical module 1A, a continuous space S1A is constituted of a region inside the opening 41A of the intermediate layer 4A and a region inside the opening 21A of the support layer 2A. That is, the space S1A includes a region inside the opening 41A of the intermediate layer 4A and a region inside the opening 21A of the support layer 2A.

The space S1A is formed between the support layer 2A and the device layer 3A and corresponds to at least the mounting region 31A and the driving region 32A. Specifically, a region inside the opening 41A of the intermediate layer 4A and a region inside the opening 21A of the support layer 2A include a range in which the mounting region 31A moves when viewed in the ZA-axis direction. A region inside the opening 41A of the intermediate layer 4A forms a clearance for causing a part (that is, a part to be in a floated state with respect to the support layer 2A, for example, the mounting region 31A in its entirety, the elastic deformation portion 34bA of each of the elastic support regions 34A, the first comb-teeth portions 33aA, and the second comb-teeth portions 31aA) of the mounting region 31A and the driving region 32A, which needs to be separated from the support layer 2A, to be separated from the support layer 2A. That is, the space S1A corresponding to at least the mounting region 31A and the driving region 32A means a space formed between the support layer 2A and the device layer 3A such that the mounting region 31A in its entirety and at least a portion of the driving region 32A are separated from the support layer 2A.

A portion of each of the interlock portions 55A included in the movable mirror 5A is positioned in the space MA. Specifically, a portion of each of the interlock portions 55A is positioned in a region inside the opening 21A of the support layer 2A through a region inside the opening 41A of the intermediate layer 4A. A portion of each of the interlock portions 55A protrudes into the space S1A from a surface of the device layer 3A on the intermediate layer 4A side by approximately 100 µm, for example. As described above, since a region inside the opening 41A of the intermediate layer 4A and a region inside the opening 21A of the support layer 2A include the range in which the mounting region 31A moves when viewed in the ZA-axis direction, a portion of each of the interlock portions 55A of the movable mirror 5A positioned in the space S1A does not come into contact with the intermediate layer 4A and the support layer 2A when the mounting region 31A reciprocates in the direction AA.

[Fixed Mirror and Surrounding Structure Thereof]

Figure 4:
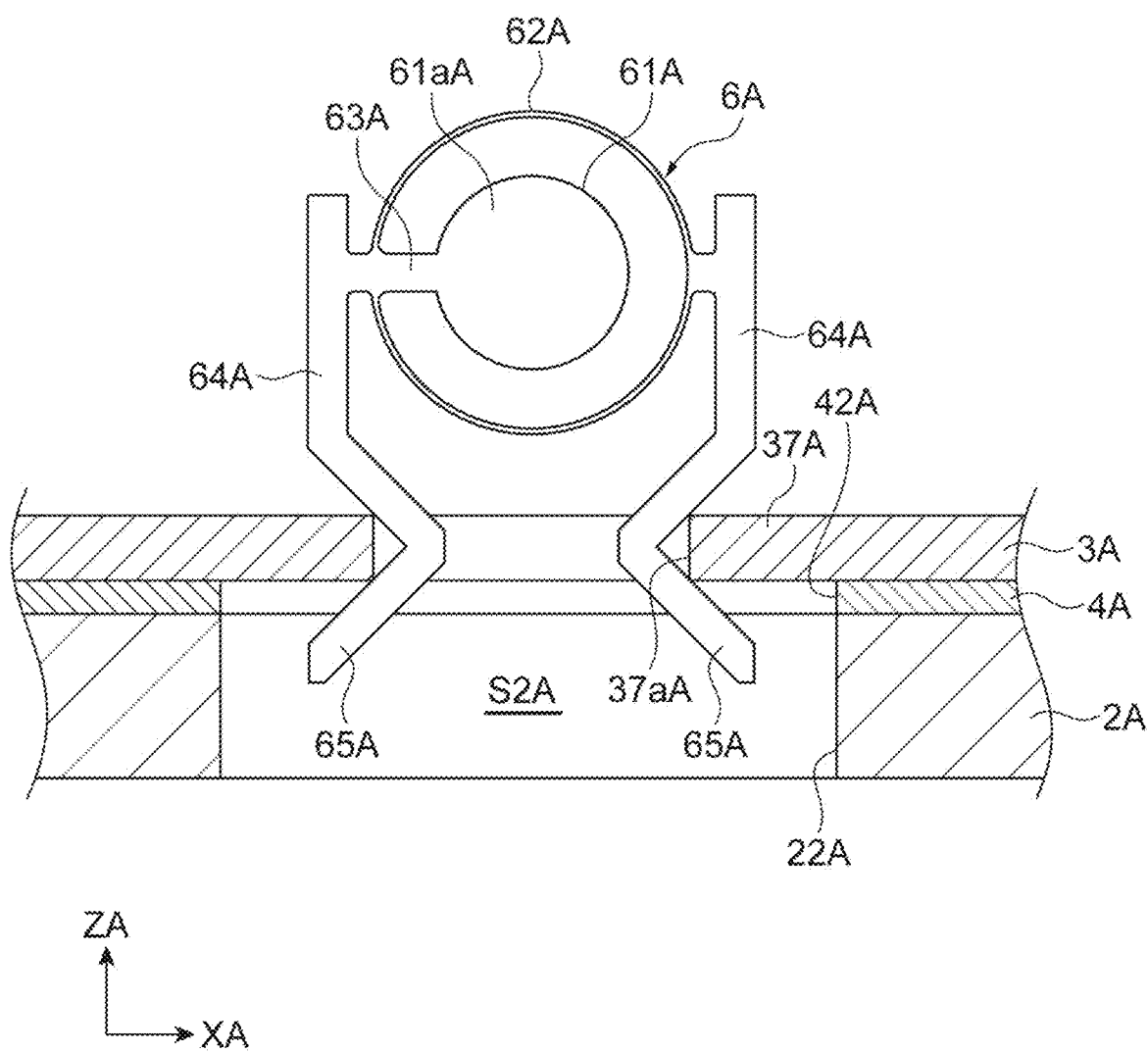
FIG. 4 is a cross-sectional view taken along line IVA-IVA illustrated in FIG. 1.
Figure 5:
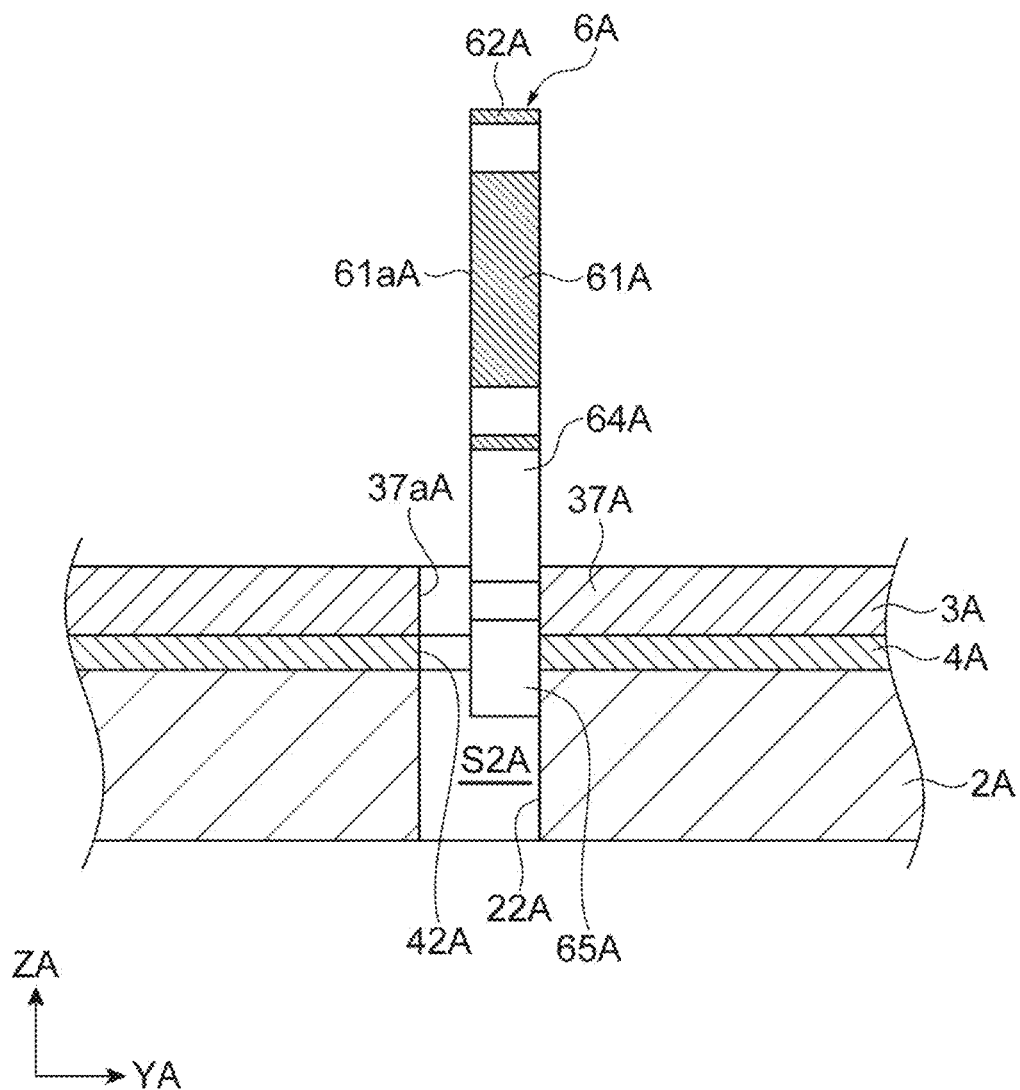
FIG. 5 is a cross-sectional view taken along line VA-VA illustrated in FIG. 1.

As illustrated in FIGS. 4 and 5, the fixed mirror 6A has the mirror portion 61A, an elastic portion 62A, a connecting portion 63A, a pair of leg portions 64A, and a pair of interlock portions 65A. The fixed mirror 6A having a configuration described below is integrally formed by a MEMS technology (patterning and etching).

The mirror portion 61A is formed to have a plate shape (for example, a disk shape) having the mirror surface 61aA as a main surface. The elastic portion 62A is formed to have an annular shape (for example, a circular shape) being separated from the mirror portion 61A and surrounding the mirror portion 61A when viewed in the YA-axis direction (direction perpendicular to the mirror surface 61aA). The connecting portion 63A connects the mirror portion 61A and the elastic portion 62A to each other on one side in the XA-axis direction with respect to the center of the mirror portion 61A when viewed in the YA-axis direction.

The leg portions 64A of the pair are connected to an outer surface of the elastic portion 62A on both sides in the XA-axis direction with respect to the center of the mirror portion 61A when viewed in the YA-axis direction. That is, the mirror portion 61A and the elastic portion 62A are sandwiched between the leg portions 64A of the pair in the XA-axis direction. Each of the leg portions 64A extends to the mounting region 37A side beyond the mirror portion 61A and the elastic portion 62A. The interlock portions 65A of the pair are respectively provided in end portions of the leg portions 64A on the mounting region 37A side. The interlock portions 65A are formed to be bent inward (toward each other) in a V-shape, for example, when viewed in the YA-axis direction.

The fixed mirror 6A having a configuration described above is mounted in the mounting region 37A when the pair of interlock portions 65A are disposed in an opening 37aA formed in the mounting region 37A. The opening 37aA is open on both sides of the mounting region 37A in the ZA-axis direction. A portion of each of the interlock portions 65A protrudes from a surface of the mounting region 37A on the intermediate layer 4A side. That is, the fixed mirror 6A penetrates the mounting region 37A.

Forces act outward (away from each other) on the pair of interlock portions 65A disposed in the opening 37aA of the mounting region 37A. The fixed mirror 6A is fixed to the mounting region 37A due to the forces. The forces are generated due to the annular elastic portion 62A which is compressed when the fixed mirror 6A is mounted in the mounting region 37A and has a tendency of being restored to the initial state.

As illustrated in FIG. 1, the opening 37aA is formed to have a trapezoidal shape widening toward the end on a side opposite to the beam splitter 7A when viewed in the ZA-axis direction. When the pair of interlock portions 65A exhibiting inwardly bent shapes engages with the opening 37aA exhibiting such a shape, the fixed mirror 6A is positionally aligned (self-aligned) in each of the XA-axis direction, the YA-axis direction, and the ZA-axis direction in an automatic manner.

As illustrated in FIGS. 4 and 5, an opening 42A is formed in the intermediate layer 4A. The opening 42A includes the opening 37aA of the mounting region 37A when viewed in the ZA-axis direction and is open on both sides of the intermediate layer 4A in the ZA-axis direction. An opening 22A is formed in the support layer 2A. The opening 22A includes the opening 37aA of the mounting region 37A when viewed in the ZA-axis direction and is open on both sides of the support layer 2A in the ZA-axis direction. In the optical module 1A, a continuous space S2A is constituted of a region inside the opening 42A of the intermediate layer 4A and a region inside the opening 22A of the support layer 2A. That is, the space S2A includes a region inside the opening 42A of the intermediate layer 4A and a region inside the opening 22A of the support layer 2A.

A portion of each of the interlock portions 65A included in the fixed mirror 6A is positioned in the space S2A. Specifically, a portion of each of the interlock portions 65A is positioned in a region inside the opening 22A of the support layer 2A through a region inside the opening 42A of the intermediate layer 4A. A portion of each of the interlock portions 65A protrudes into the space S2A from a surface of the device layer 3A on the intermediate layer 4A side by approximately 100 µm, for example.

[Operations and Effects]

In the optical module 1A, the movable mirror 5A penetrates the mounting region 31A of the device layer 3A, and a portion of each of the interlock portions 55A of the movable mirror 5A is positioned in the space S1A famed between the support layer 2A and the device layer 3A. Accordingly, for example, since there is no limitation on the size and the like of each of the interlock portions 55A, the movable mirror 5A can be stably and firmly fixed to the mounting region 31A of the device layer 3A. Thus, according to the optical module 1A, reliable mounting of the movable mirror 5A with respect to the device layer 3A is realized.

In addition, in the optical module 1A, a portion of each of the interlock portions 55A of the movable mirror 5A is positioned in a region inside the opening 21A of the support layer 2A through a region inside the opening 41A of the intermediate layer 4A. Accordingly, it is possible to favorably realize a configuration for reliable mounting of the movable mirror 5A with respect to the device layer 3A.

In addition, in the optical module 1A, the support layer 2A is the first silicon layer of the SOI substrate, the device layer 3A is the second silicon layer of the SOI substrate, and the intermediate layer 4A is the insulating layer of the SOI substrate. Accordingly, it is possible to favorably realize a configuration for reliable mounting of the movable mirror 5A with respect to the device layer 3A using the SOI substrate.

In addition, in the optical module 1A, the mirror surface 51aA of the movable mirror 5A is positioned on a side opposite to the support layer 2A with respect to the device layer 3A. Accordingly, it is possible to simplify the configuration of the optical module 1A.

In addition, in the optical module 1A, the movable mirror 5A, the fixed mirror 6A, and the beam splitter 7A are disposed such that the interference optical system 10A is constituted. Accordingly, it is possible to obtain an FTIR having improved sensitivity.

In addition, in the optical module 1A, the light incident unit 8A is disposed such that measurement light is incident on the interference optical system 10A from outside, and the light emission unit 9A is disposed such that the measurement light is emitted from the interference optical system 10A to the outside. Accordingly, it is possible to obtain an FTIR including the light incident unit 8A and the light emission unit 9A.

[Modification Examples]

Hereinabove, an embodiment of the aspect of the present disclosure has been described. However, the aspect of the present disclosure is not limited to the foregoing embodiment. For example, the material and the shape of each configuration are not limited to the materials and the shapes described above, and various materials and shapes can be employed. As an example thereof, the shapes of the mirror portion 51A and the mirror surface 51aA are not limited to a circular shape, and other shapes such as a rectangular shape and the like may be adopted.

Figure 6:
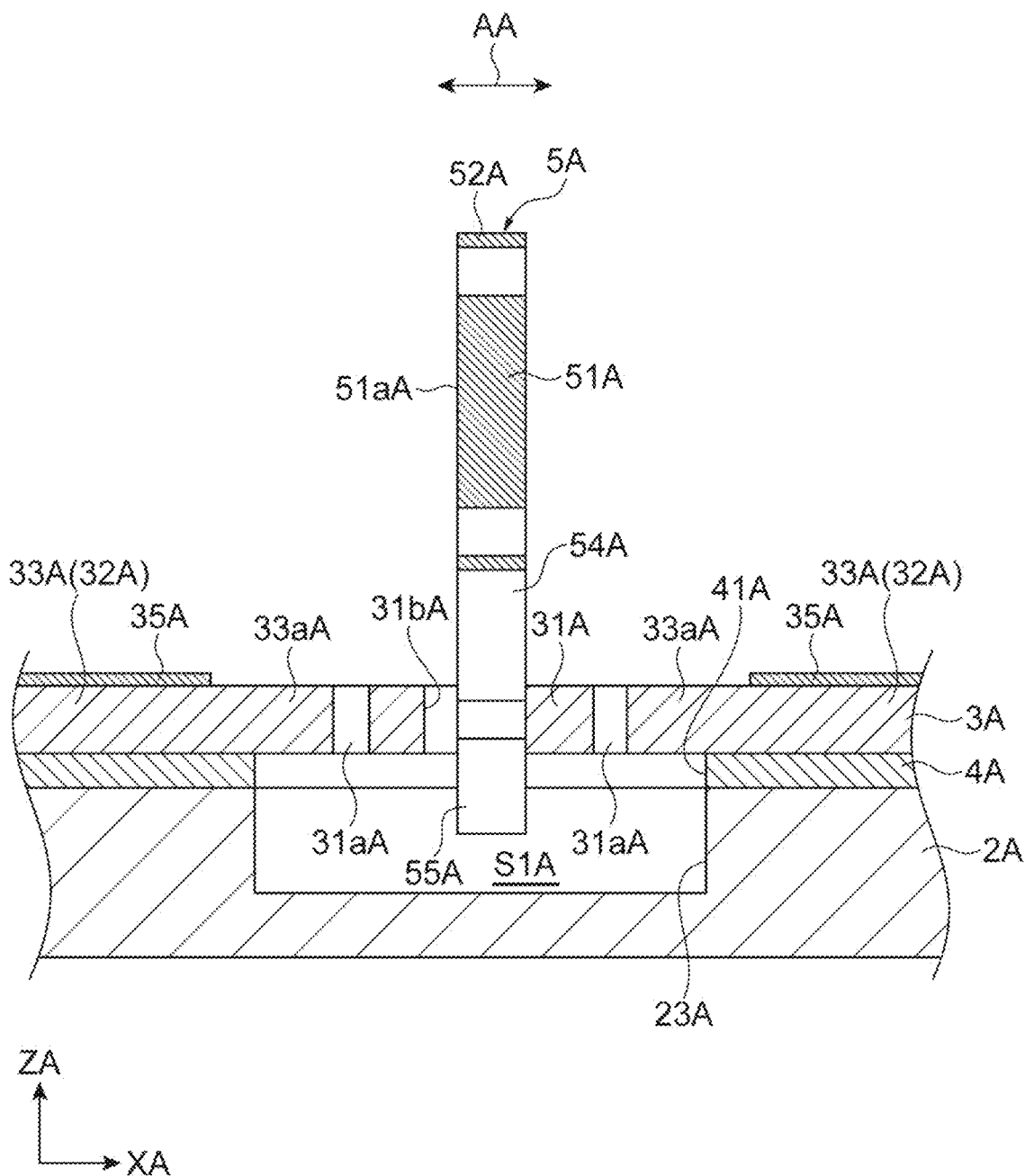
FIG. 6 is a cross-sectional view of a modification example of a surrounding structure of a movable mirror.
Figure 7:
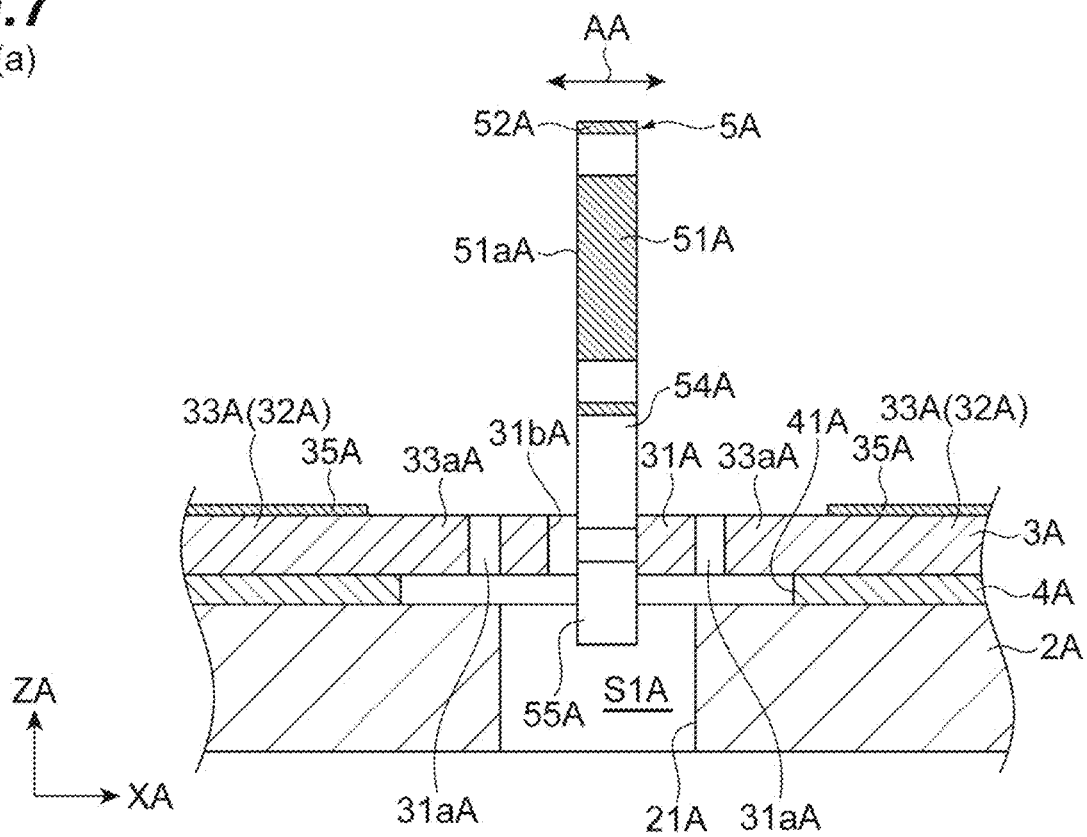
FIG. 7 is a cross-sectional view of another modification example of the surrounding structure of the movable mirror.
Figure 7:
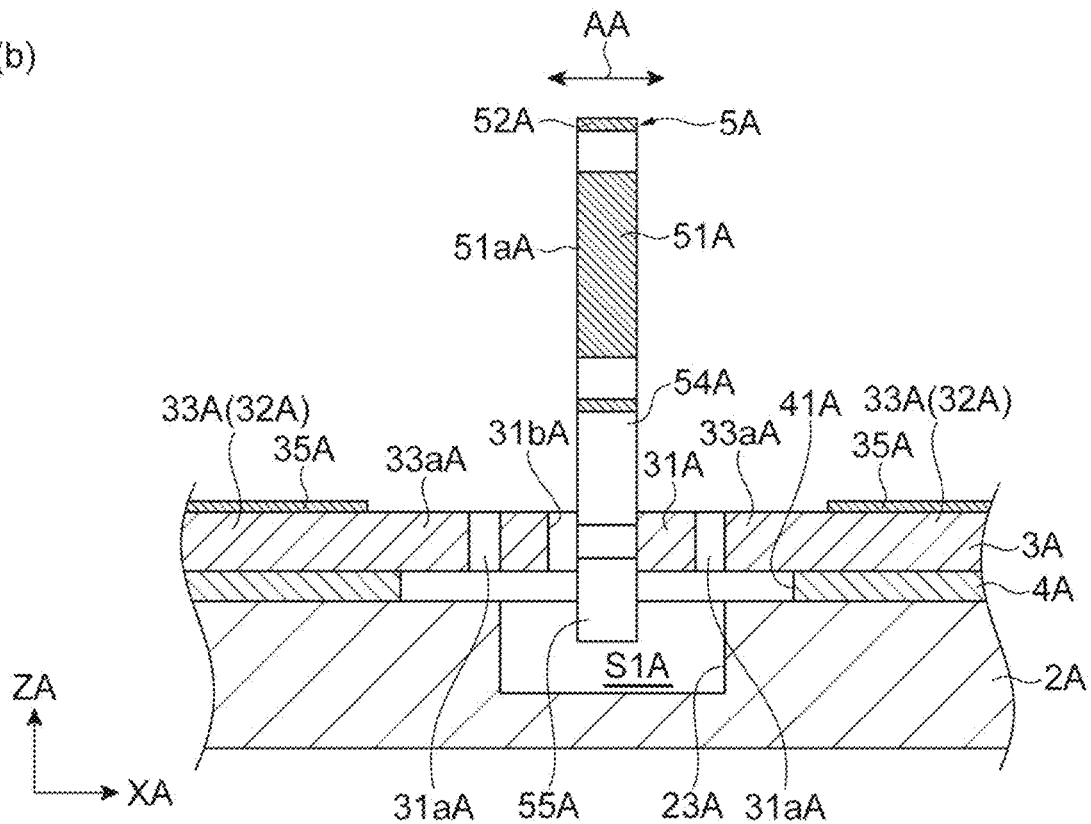
Figure 8:
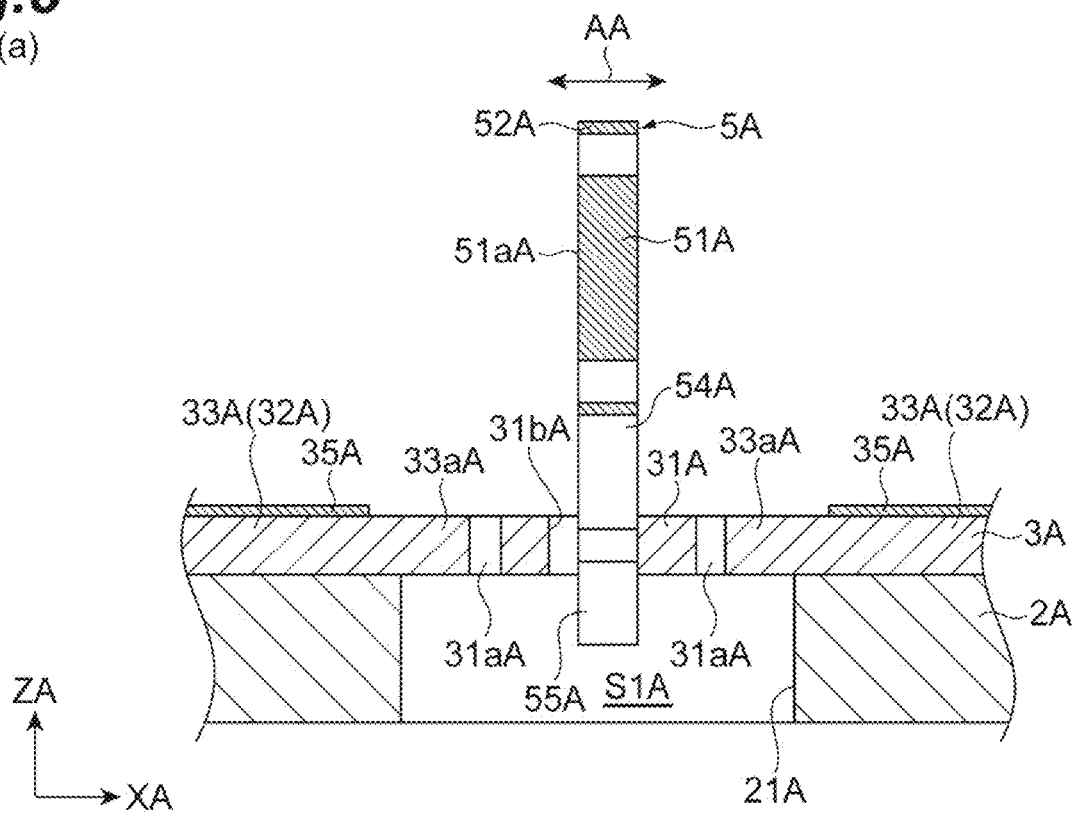
FIG. 8 is a cross-sectional view of another modification example of the surrounding structure of the movable mirror.
Figure 8:
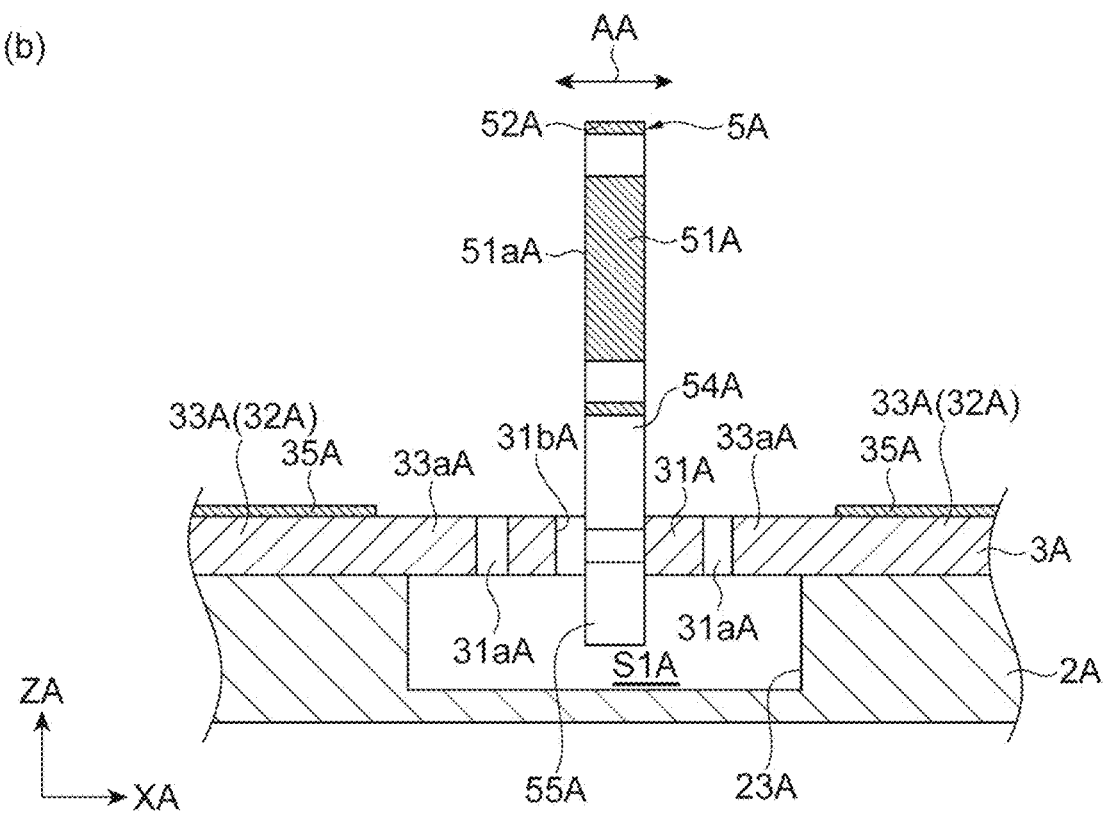
Figure 9:
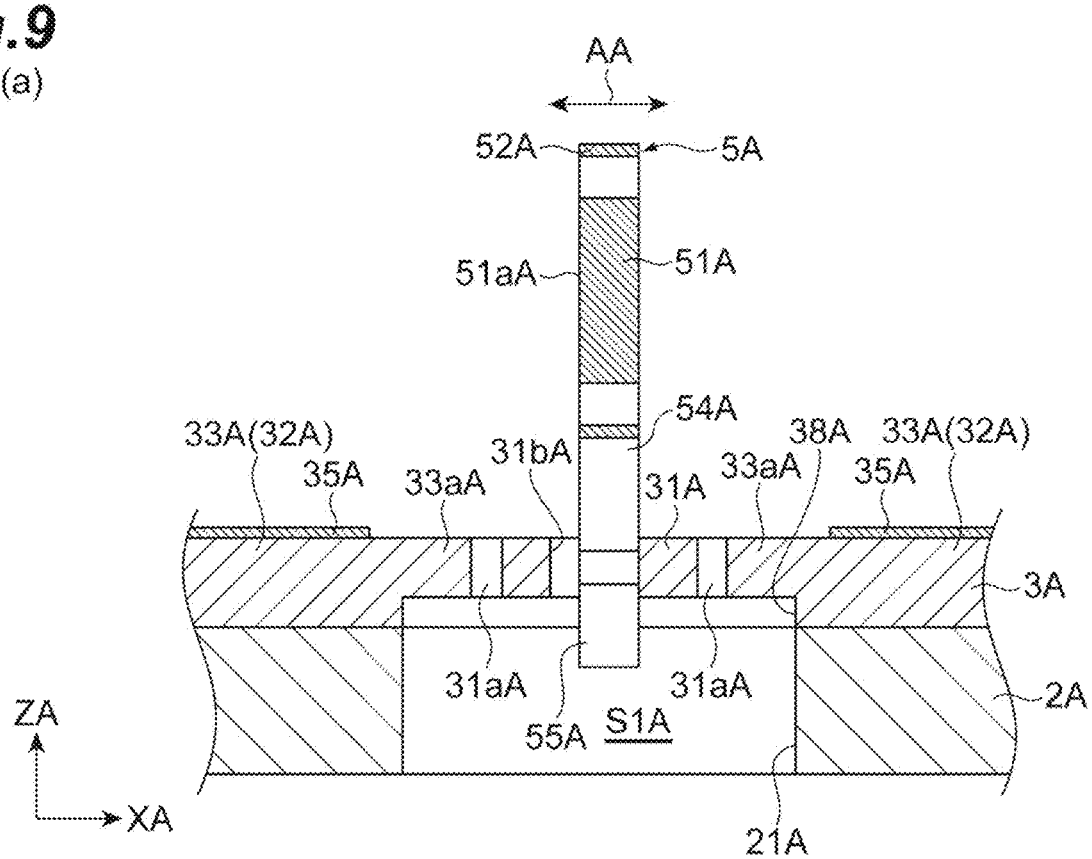
FIG. 9 is a cross-sectional view of another modification example of the surrounding structure of the movable mirror.
Figure 9:
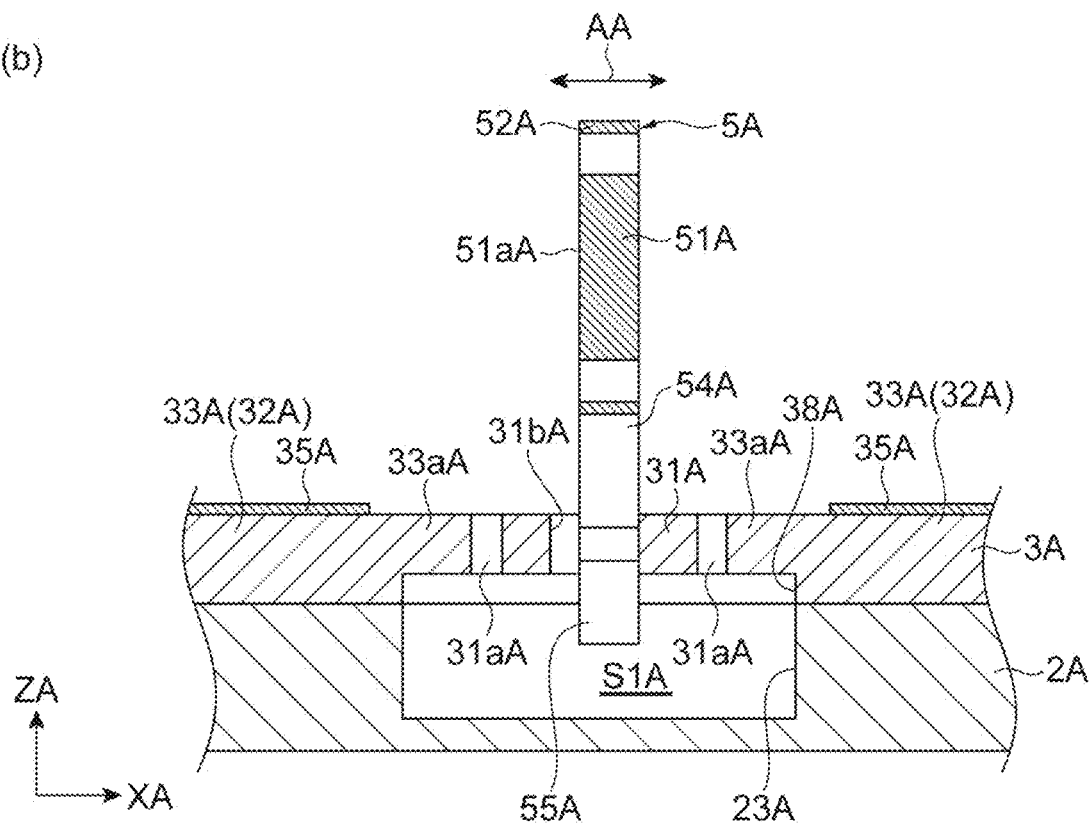
Figure 10:
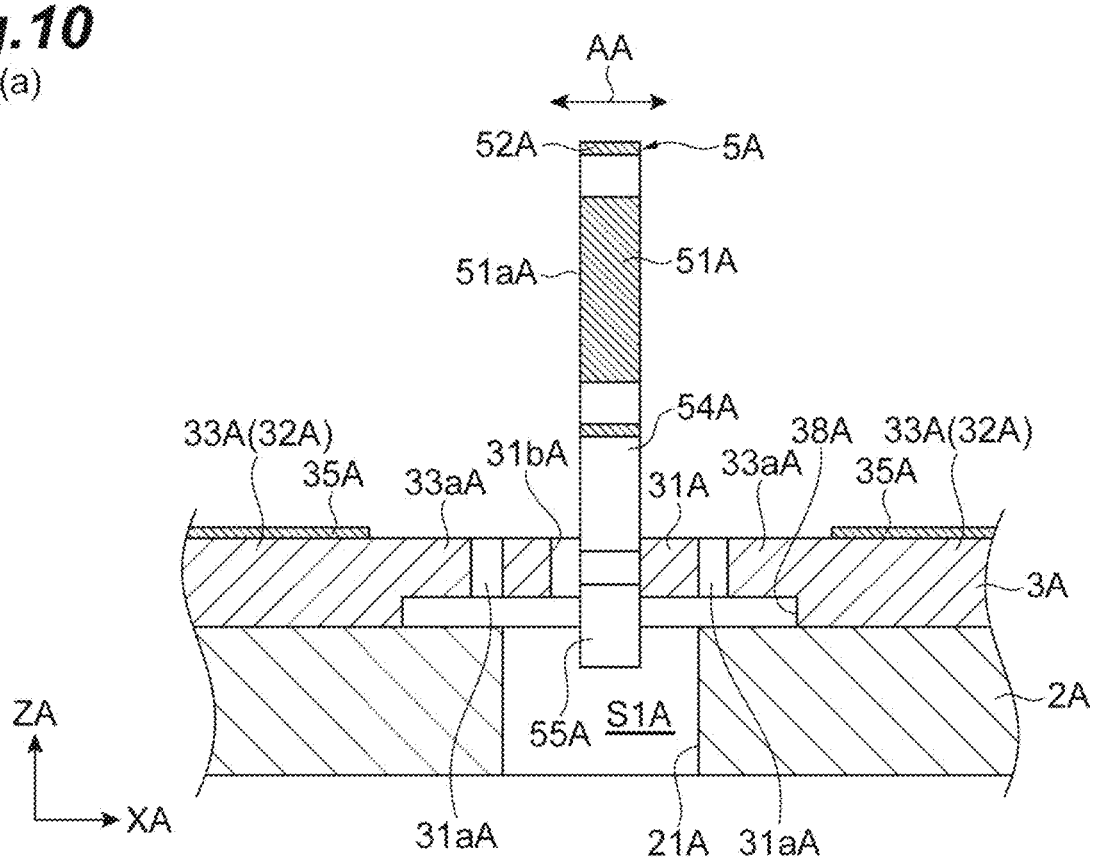
FIG. 10 is a cross-sectional view of another modification example of the surrounding structure of the movable mirror.
Figure 10:
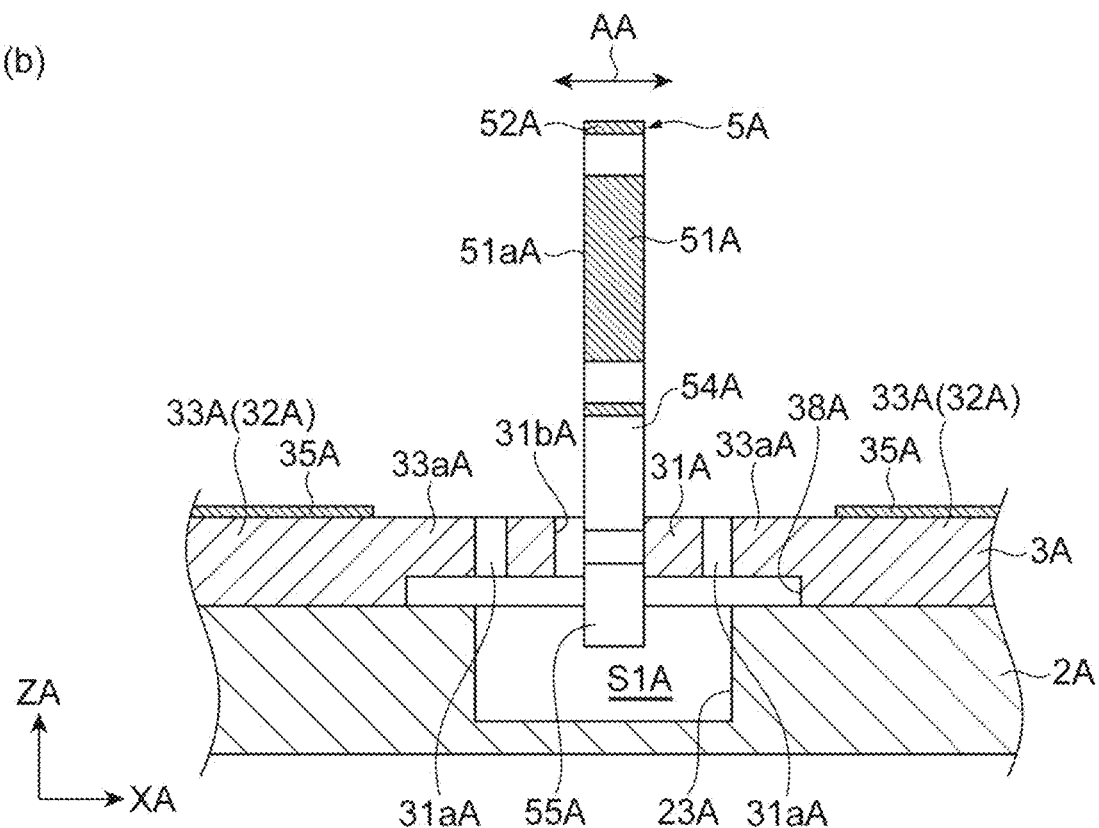

In addition, as long as the space S1A is formed between the support layer 2A and the device layer 3A and corresponds to at least the mounting region 31A and the driving region 32A, various forms can be employed as illustrated in FIGS. 6 and 7.

In the configuration illustrated in FIG. 6, in place of the opening 21A, a recess portion 23A open on the device layer 3A side is formed in the support layer 2A, and the space S1A is constituted of a region inside the opening 41A of the intermediate layer 4A and a region inside the recess portion 23A of the support layer 2A. In this case, a region inside the recess portion 23A of the support layer 2A includes the range in which the mounting region 31A moves when viewed in the ZA-axis direction. A portion of each of the interlock portions 55A of the movable mirror 5A is positioned in a region inside the recess portion 23A through a region inside the opening 41A of the intermediate layer 4A. With this configuration as well, it is possible to favorably realize a configuration for reliable mounting of the movable mirror 5A with respect to the device layer 3A.

In the configuration illustrated in FIG. 7(a), a region inside the opening 21A of the support layer 2A includes a range in which each of the interlock portions 55A of the movable mirror 5A moves when viewed in the ZA-axis direction. In the configuration illustrated in FIG. 7(b), a region inside the recess portion 23A of the support layer 2A includes the range in which each of the interlock portions 55A of the movable mirror 5A moves when viewed in the ZA-axis direction. In these cases, a region inside the opening 41A of the intermediate layer 4A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. In any configuration, a portion of each of the interlock portions 55A of the movable mirror 5A positioned in the space S1A does not come into contact with the intermediate layer 4A and the support layer 2A when the mounting region 31A reciprocates in the direction AA.

In addition, the support layer 2A and the device layer 3A may be joined to each other without having the intermediate layer 4A interposed therebetween. In this case, the support layer 2A is formed of silicon, glass, ceramic, or the like, for example, and the device layer 3A is formed of silicon or the like, for example. The support layer 2A and the device layer 3A are joined to each other through direct joining, surface activation joining, plasma joining, anodic joining, metal joining, resin joining, or the like, for example. In this case as well, as long as the space S1A is formed between the support layer 2A and the device layer 3A and corresponds to at least the mounting region 31A and the driving region 32A, various forms can be employed as illustrated in FIGS. 8, 9, 10, and 11. In any configuration, it is possible to favorably realize a configuration for reliable mounting of the movable mirror 5A with respect to the device layer 3A.

In the configuration illustrated in FIG. 8(a), the space S1A is constituted of a region inside the opening 21A of the support layer 2A. In this case, a region inside the opening 21A of the support layer 2A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the opening 21A of the support layer 2A.

In the configuration illustrated in FIG. 8(b), the space S1A is constituted of a region inside the recess portion 23A of the support layer 2A. In this case, a region inside the recess portion 23A of the support layer 2A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the recess portion 23A of the support layer 2A.

In the configuration illustrated in FIG. 9(a), a recess portion (first recess portion) 38A open on the support layer 2A side is formed in the device layer 3A, and the space S1A is constituted of a region inside the recess portion 38A of the device layer 3A and a region inside the opening 21A of the support layer 2A. In this case, a region inside the recess portion 38A of the device layer 3A and a region inside the opening 21A of the support layer 2A include the range in which the mounting region 31A moves when viewed in the ZA-axis direction. A region inside the recess portion 38A of the device layer 3A forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the opening 21A of the support layer 2A through a region inside the recess portion 38A of the device layer 3A.

In the configuration illustrated in FIG. 9(b), the recess portion 38A is formed in the device layer 3A, and the space S1A is constituted of a region inside the recess portion 38A of the device layer 3A and a region inside the recess portion (second recess portion) 23A of the support layer 2A. In this case, a region inside the recess portion 38A of the device layer 3A and a region inside the recess portion 23A of the support layer 2A include the range in which the mounting region 31A moves when viewed in the ZA-axis direction. A region inside the recess portion 38A of the device layer 3A forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the recess portion 23A of the support layer 2A through a region inside the recess portion 38A of the device layer 3A.

In the configuration illustrated in FIG. 10(a), the recess portion 38A is formed in the device layer 3A, and the space S1A is constituted of a region inside the recess portion 38A of the device layer 3A and a region inside the opening 21A of the support layer 2A. In this case, a region inside the recess portion 38A of the device layer 3A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A region inside the opening 21A of the support layer 2A includes the range in which each of the interlock portions 55A of the movable mirror 5A moves when viewed in the ZA-axis direction. A portion of each of the interlock portions 55A of the movable mirror 5A is positioned in a region inside the opening 21A of the support layer 2A through a region inside the recess portion 38A of the device layer 3A.

In the configuration illustrated in FIG. 10(b), the recess portion 38A is formed in the device layer 3A, and the space S1A is constituted of a region inside the recess portion 38A of the device layer 3A and a region inside the recess portion (second recess portion) 23A of the support layer 2A. In this case, a region inside the recess portion 38A of the device layer 3A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A region inside the recess portion 23A of the support layer 2A includes the range in which each of the interlock portions 55A of the movable mirror 5A moves when viewed in the ZA-axis direction. A portion of each of the interlock portions 55A of the movable mirror 5A is positioned in a region inside the recess portion 23A of the support layer 2A through a region inside the recess portion 38A of the device layer 3A.

Figure 11:
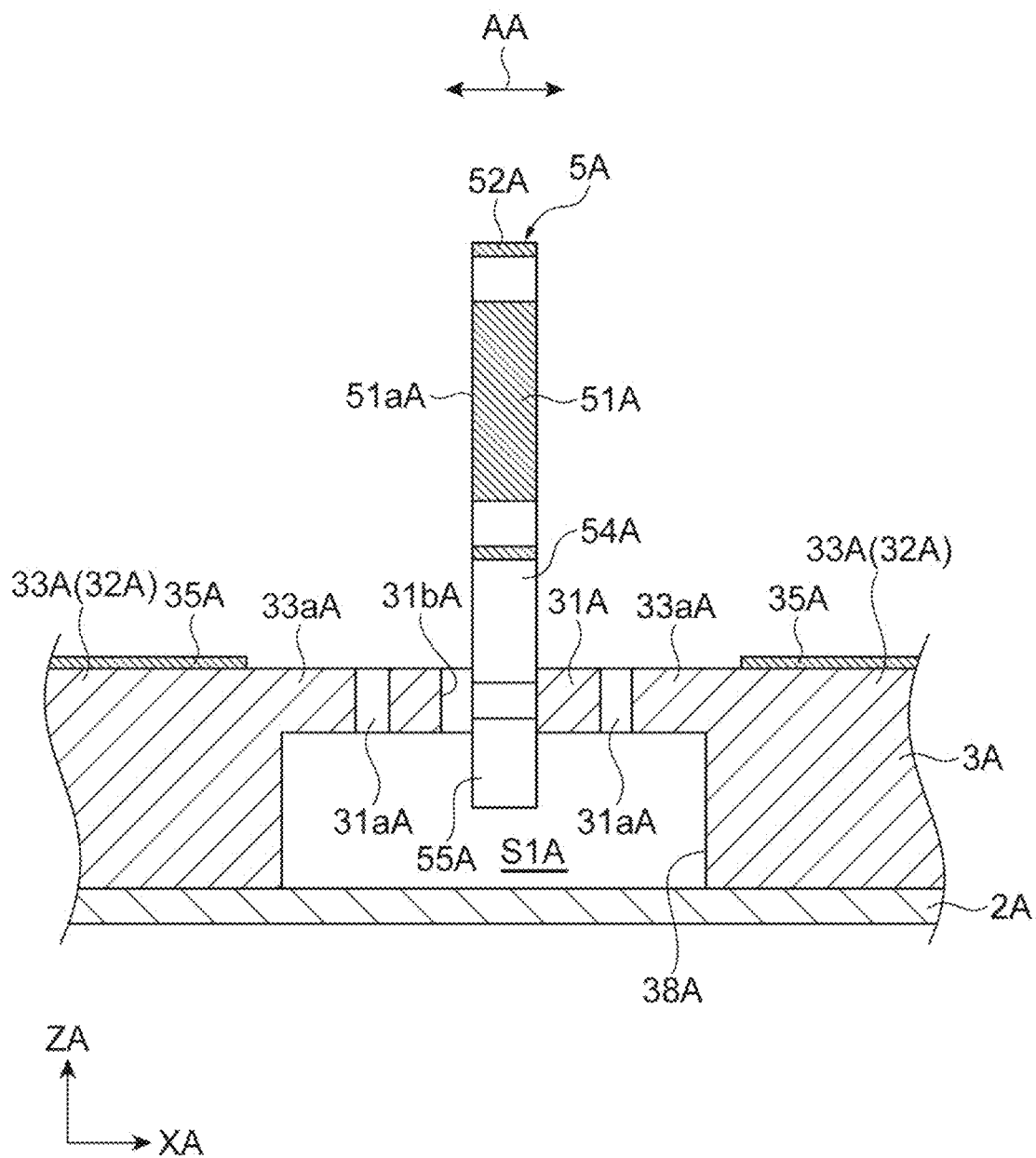
FIG. 11 is a cross-sectional view of another modification example of the surrounding structure of the movable mirror.

In the configuration illustrated in FIG. 11, the recess portion 38A is formed in the device layer 3A, and the space S1A is constituted of a region inside the recess portion 38A of the device layer 3A. In this case, a region inside the recess portion 38A of the device layer 3A includes the range in which the mounting region 31A moves when viewed in the ZA-axis direction, and forms a clearance for causing a part of the mounting region 31A and the driving region 32A, which needs to be separated from the support layer 2A, to be separated from the support layer 2A. A portion of each of the interlock portions 55A of the movable mirror 5A is positioned in a region inside the recess portion 38A of the device layer 3A.

Figure 12:
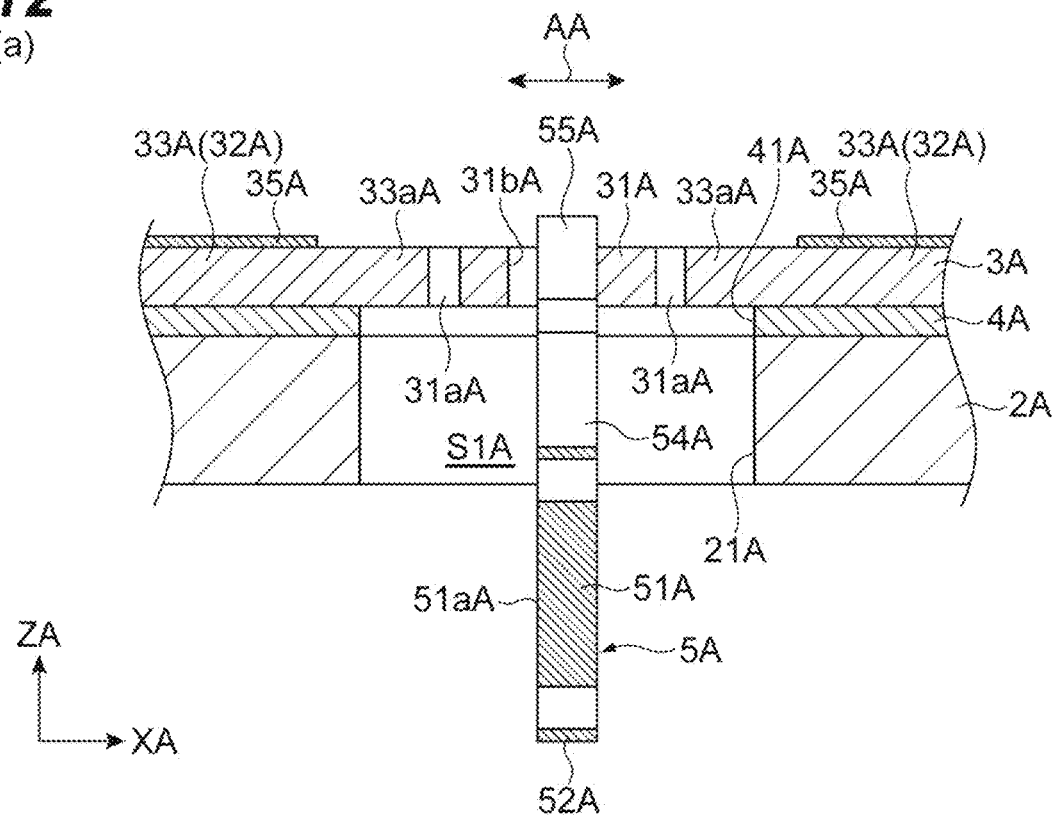
FIG. 12 is a cross-sectional view of another modification example of the surrounding structure of the movable mirror.
Figure 12:
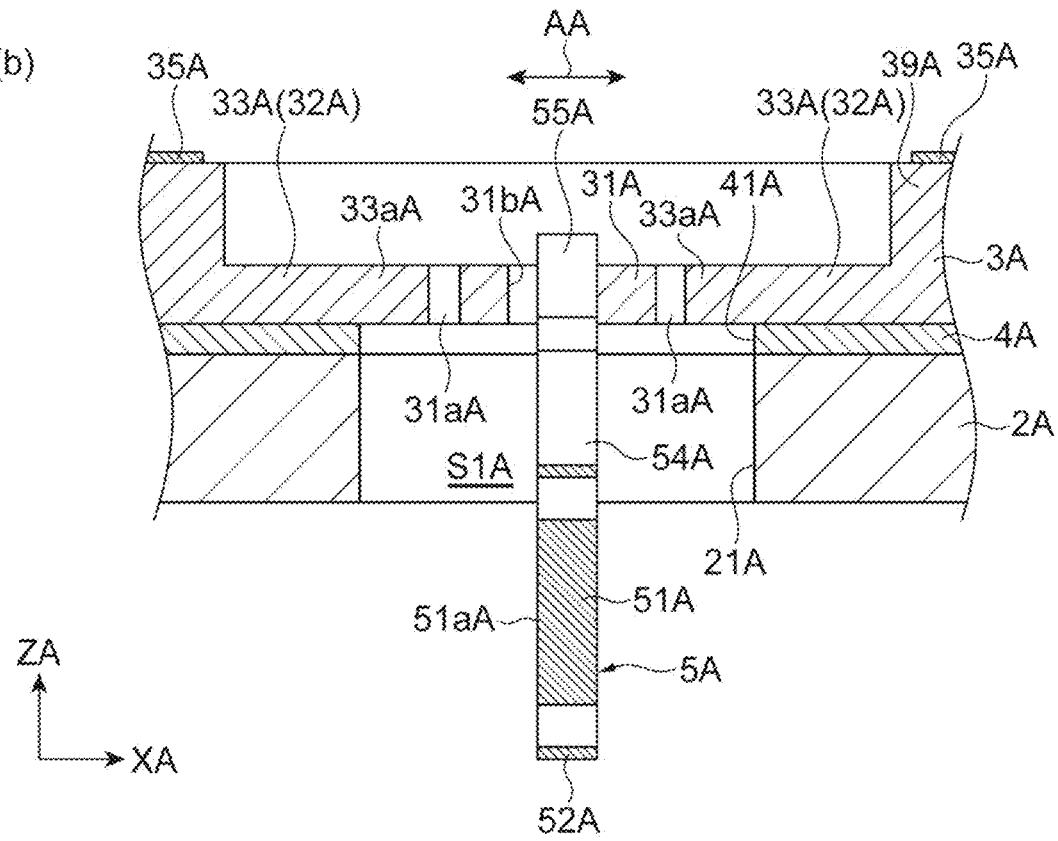

In addition, as illustrated in FIGS. 12(a) and 12(b), a portion of each of the leg portions 54A and a portion of each of the interlock portions 55A of the movable mirror 5A may be positioned in the space S1A, and the mirror surface 51aA of the movable mirror 5A may be positioned on a side opposite to the device layer 3A with respect to the support layer 2A. In this case, the mirror surface 61aA of the fixed mirror 6A and the optical functional surface 7aA of the beam splitter 7A are also positioned on a side opposite to the device layer 3A with respect to the support layer 2A. In the configuration illustrated in FIG. 12(b), a spacer 39A protruding to a side opposite to the support layer 2A is integrally provided in the device layer 3A. The spacer 39A protrudes beyond a part of each of the interlock portions 55A of the movable mirror 5A protruding from the device layer 3A to a side opposite to the support layer 2A, thereby protecting the part.

Figure 13:
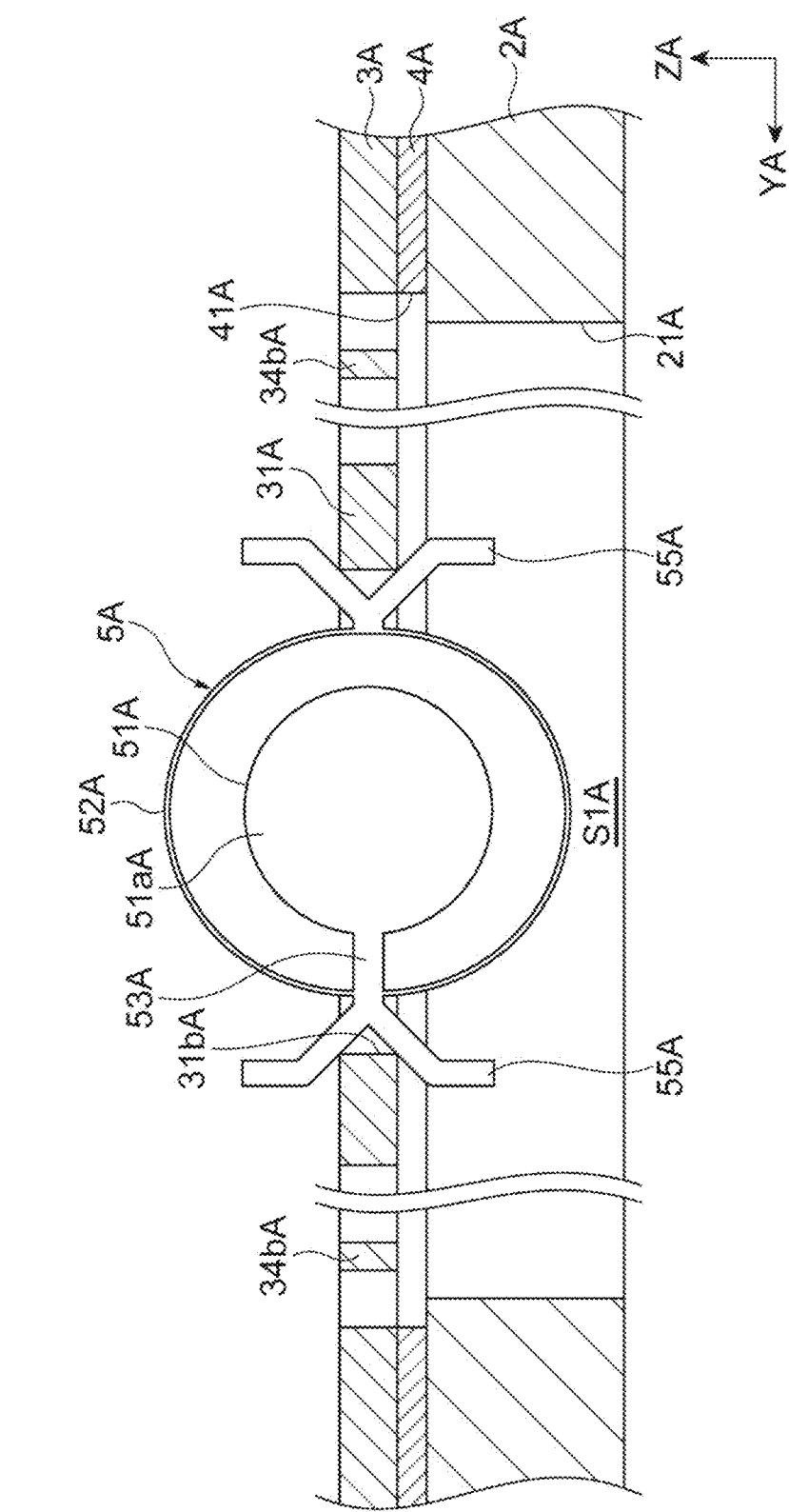
FIG. 13 is a cross-sectional view of another modification example of the surrounding structure of the movable mirror.

In addition, as illustrated in FIG. 13, the movable mirror 5A may penetrate the mounting region 31A in a state where the mirror surface 51aA intersects the mounting region 31A. In the movable mirror 5A illustrated in FIG. 13, the pair of leg portions 54A is not provided, and the interlock portions 55A of the pair are connected to the outer surface of the elastic portion 52A on both sides in the YA-axis direction with respect to the center of the mirror portion 51A when viewed in the XA-axis direction. That is, the mirror portion 51A and the elastic portion 52A are sandwiched between the interlock portions 55A of the pair in the YA-axis direction. In this case, a part facing the mirror surface 51aA, of a part defining the opening 31bA in the mounting region 31A, is cut out to allow the measurement light L0A to pass therethrough. In the movable mirror 5A illustrated in FIG. 13, the mirror surface 51aA intersects the mounting region 31A. Accordingly, a centroid position of the movable mirror 5A can be brought closer to the mounting region 31A. Therefore, it is possible to more stably move the mounting region 31A in which the movable mirror 5A is mounted.

Figure 14:
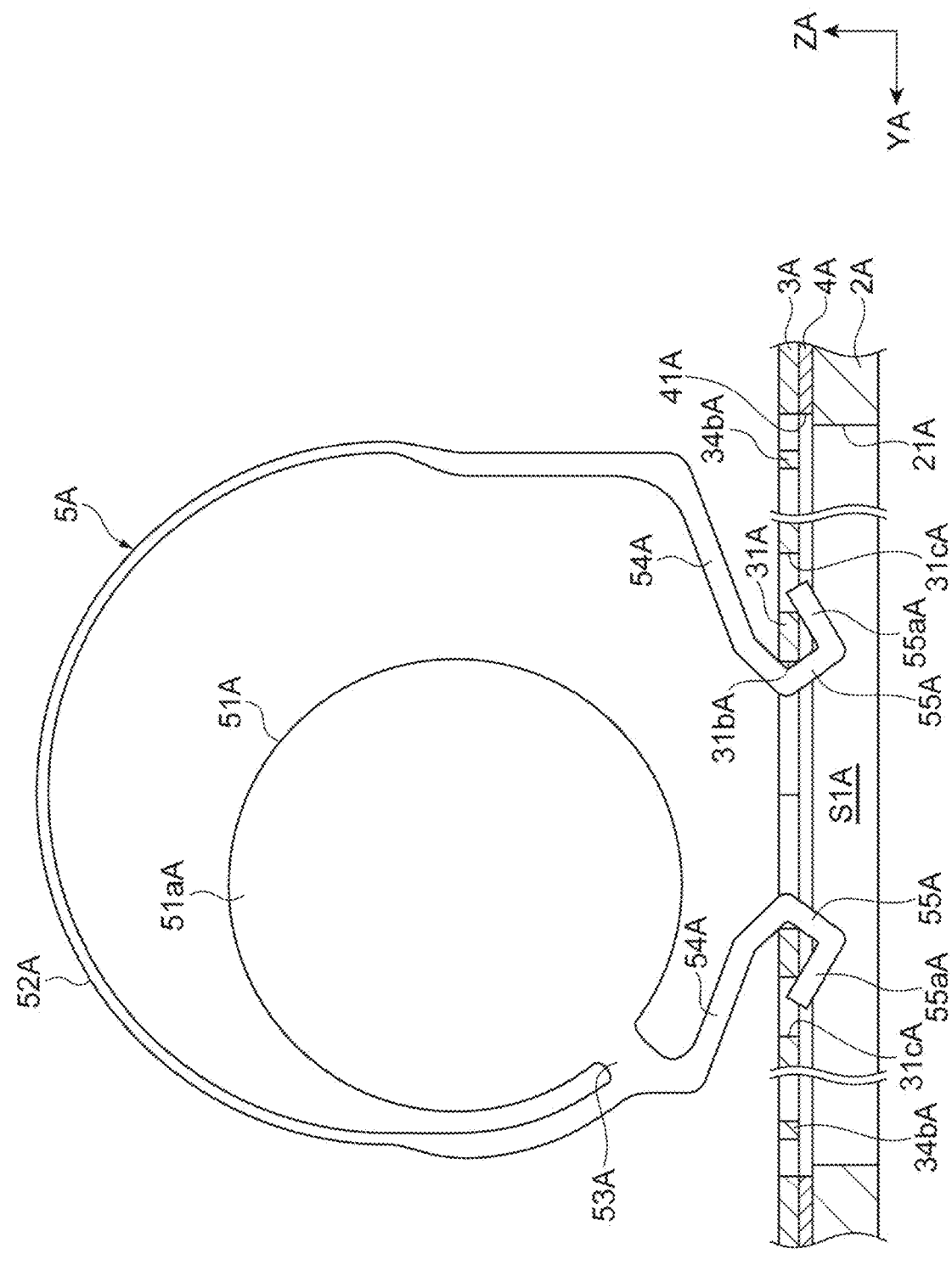
FIG. 14 is a cross-sectional view of another modification example of the surrounding structure of the movable mirror.
Figure 15:
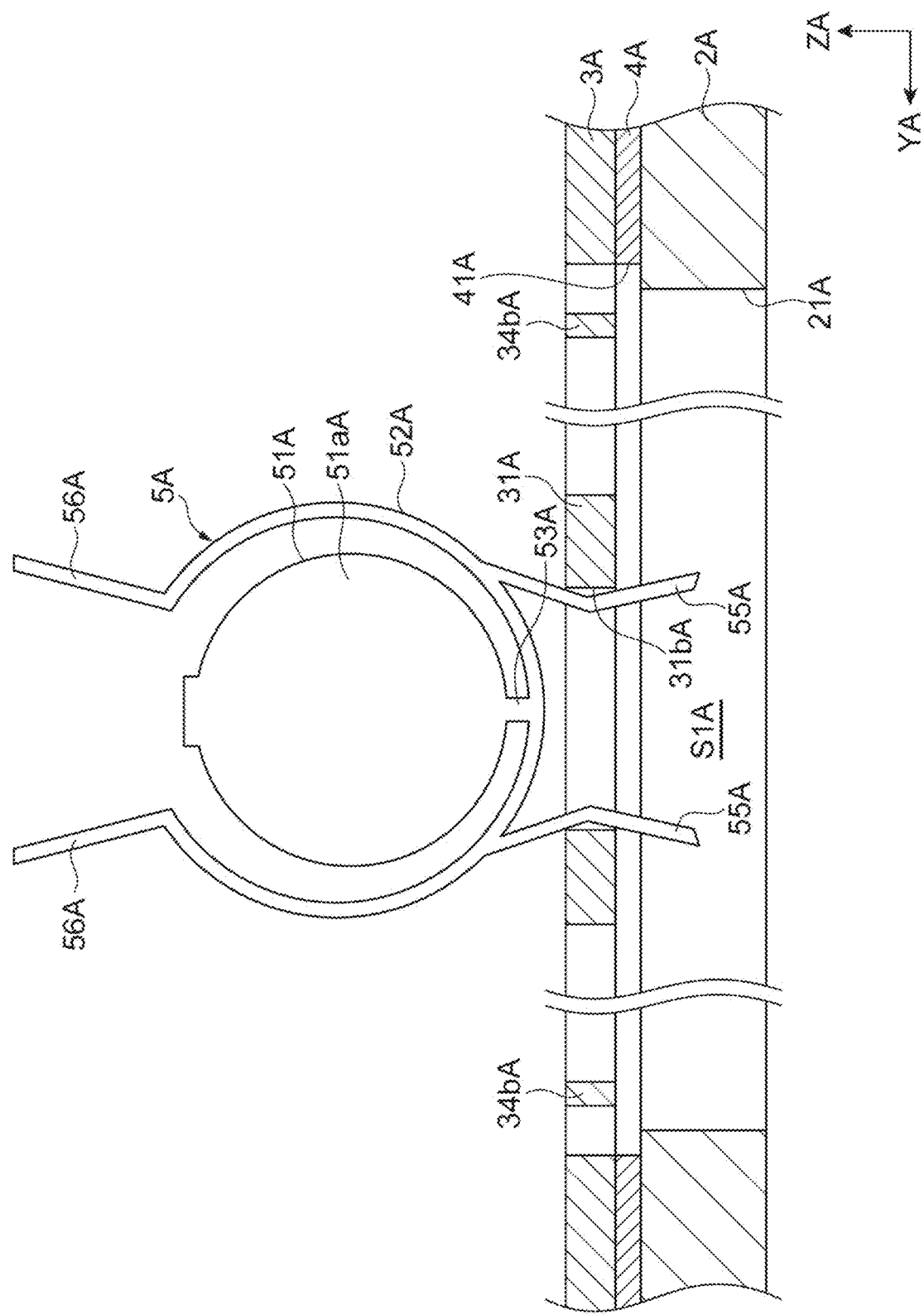
FIG. 15 is a cross-sectional view of another modification example of the surrounding structure of the movable mirror.

In addition, as illustrated in FIGS. 14 and 15, the connecting portion 53A may be provided on the mounting region 31A side of the center of the mirror surface 51aA. According to this configuration, for example, compared to a case where the connecting portion 53A is provided on a side opposite to the mounting region 31A of the center of the mirror surface 51aA, the centroid position of the movable mirror 5A can be brought closer to the mounting region 31A. Therefore, it is possible to more stably move the mounting region 31A in which the movable mirror 5A is mounted. In addition, as illustrated in FIG. 14, each of the interlock portions 55A may have a folded portion 55aA which is disposed inside an opening 31cA provided separately from the opening 31bA. According to this configuration, the movable mirror 5A can be more reliably fixed to the mounting region 31A. In addition, as illustrated in FIG. 15, handles 56A for causing the elastic portion 52A to be elastically deformed to change the distance between the interlock portions 55A of the pair may be provided in the elastic portion 52A. According to this configuration, the distance between the interlock portions 55A of the pair can be changed by operating the handles 56A. Therefore, when the pair of interlock portions 55A is inserted into the opening 31bA in a state where the distance between the interlock portions 55A of the pair is changed, and when the handles 56A are released from the operation thereafter, each of the interlock portions 55A can be brought into contact with an inner surface of the opening 31bA. Accordingly, the movable mirror 5A is supported in the mounting region 31A by a reaction force applied from the inner surface of the opening 31bA to each of the interlock portions 55A. In all of the examples, the movable mirror 5A can be supported in the mounting region 31A by a reaction force applied from the inner surface of the opening 31bA to each of the interlock portions 55A. However, in order to more reliably fix the movable mirror 5A to the mounting region 31A, a bonding agent may be disposed between each of the interlock portions 55A and the mounting region 31A.

In addition, in the foregoing embodiment, the fixed mirror 6A is mounted in the device layer 3A. However, the fixed mirror 6A need only be mounted in at least one of the support layer 2A, the device layer 3A, and the intermediate layer 4A. In addition, in the foregoing embodiment, the beam splitter 7A is mounted in the support layer 2A. However, the beam splitter 7A need only be mounted in at least one of the support layer 2A, the device layer 3A, and the intermediate layer 4A. In addition, the beam splitter 7A is not limited to a cube-type beam splitter and may be a plate-type beam splitter.

In addition, the optical module 1A may include a light emitting element for generating measurement light to be incident on the light incident unit 8A, in addition to the light incident unit 8A. Alternatively, the optical module 1A may include a light emitting element for generating measurement light to be incident on the interference optical system 10A, in place of the light incident unit 8A. In addition, the optical module 1A may include a light receiving element for detecting measurement light (interference light) emitted from the light emission unit 9A, in addition to the light emission unit 9A. Alternatively, the optical module 1A may include a light receiving element for detecting measurement light (interference light) emitted from the interference optical system 10A, in place of the light emission unit 9A.

In addition, a first penetration electrode which is electrically connected to each of the actuator regions 33A and a second penetration electrode which is electrically connected to each of both the end portions 34aA of each of the elastic support regions 34A may be provided in the support layer 2A and the intermediate layer 4A (in only the support layer 2A when the intermediate layer 4A is not present), and a voltage may be applied to a part between the first penetration electrode and the second penetration electrode. In addition, the actuator for moving the mounting region 31A is not limited to an electrostatic actuator, a piezoelectric actuator, and an electromagnetic actuator, or the like may be adopted, for example. In addition, the optical module 1A is not limited to a module for constituting an FTIR and may be a module for constituting other optical systems.

Second Embodiment

Regarding an MEMS device, optical modules including a base that has a main surface in which a recess portion is formed, and an optical element which is mounted on the base in the recess portion are known (for example, refer to the specification of United States Patent Application, Publication No. 2002/0186477). In such an optical module, an optical element is inserted into a recess portion, and the optical element is bonded to a base due to a reflow of a bond pad formed on a bottom surface of the recess portion.

In the optical module described above, from the viewpoint of ensuring tolerance to an impact applied during installation to a portable instrument or transportation, the optical element needs to be reliably mounted on the base. However, in the optical module described above, there is concern that tolerance to an impact may not be sufficient and the optical element may easily fall off from the recess portion when an impact acts thereon.

An object of another aspect of the present disclosure is to provide an optical module in which reliable mounting of an optical element can be realized.

According to another aspect of the present disclosure, there is provided an optical module including a base, and an optical element which is mounted on the base. The base has a first surface and a second surface which face each other, and a first opening which is open on the first surface and the second surface and a second opening which is open on the second surface are provided in the base. The optical element has an optical portion which has an optical surface and a support portion which supports the optical portion on the base. The support portion includes a protrusion portion which protrudes from the second surface via the first opening and a folded portion which extends from the protrusion portion toward the second surface and enters the second opening from the second surface side.

In this optical module, the first opening which is open on the first surface and the second surface and the second opening which is open on the second surface are provided in the base. In addition, the support portion supporting the optical portion on the base includes the protrusion portion which protrudes from the second surface via the first opening and the folded portion which extends from the protrusion portion toward the second surface and enters the second opening from the second surface side. Accordingly, even when the optical element has a tendency of being deviated in a direction intersecting the first surface due to an impact, for example, since the folded portion comes into contact with an edge portion of the second opening on the second surface side, it is possible to curb falling off of the optical element. Thus, according to this optical module, it is possible to realize reliable mounting of the optical element.

In the optical module according to another aspect of the present disclosure, a pair of second openings may be provided such that the first opening is sandwiched therebetween. A pair of protrusion portions may be provided. The folded portion may be provided in each of the pair of protrusion portions and may enter each of the pair of second openings. Accordingly, it is possible to more reliably curb falling off of the optical element.

In the optical module according to another aspect of the present disclosure, the protrusion portion may come into contact with at least an edge portion of the first opening on the first surface side. Accordingly, it is possible to even more reliably curb falling off of the optical element.

In the optical module according to another aspect of the present disclosure, the folded portion may come into contact with an edge portion of the second opening on the second surface side. Accordingly, it is possible to even more reliably curb falling off of the optical element.

In the optical module according to another aspect of the present disclosure, the optical element may further have an elastic portion. A pair of protrusion portions may be provided. The pair of protrusion portions, in which an elastic force is applied and a distance therebetween is able to be changed in accordance with elastic deformation of the elastic portion, may be inserted into the first opening in a state where an elastic force of the elastic portion is applied. The optical element may be supported in the base by a reaction force of the elastic force applied from an inner surface of the first opening to the pair of protrusion portions. Accordingly, the optical element can be mounted on the base utilizing an elastic force of the elastic portion. In this case, the optical element is mounted on the base utilizing an elastic force. Furthermore, since falling off of the optical element is curbed by the folded portion, it is possible to reduce a using amount of a bonding agent or to eliminate the need for a bonding agent. The following advantages can be achieved by reducing the using amount of a bonding agent. That is, occurrence of contamination or the like on the optical surface or occurrence of destruction or malfunction in a driving region of the optical module caused by a sticking-out bonding material can be curbed. In addition, it is possible to reduce the size of the optical module by reducing a region (space between constituent elements) for forming a bonding material.

In the optical module according to another aspect of the present disclosure, the pair of protrusion portions may be inserted into the first opening in a state where an elastic force of the elastic portion is applied in a direction away from each other. Accordingly, it is possible to favorably mount the optical element on the base utilizing an elastic force.

In the optical module according to another aspect of the present disclosure, the inner surface of the first opening may include a pair of inclined surfaces which is inclined such that a distance therebetween increases from one end toward the other end when viewed in a direction intersecting the first surface, and a facing surface which faces the pair of inclined surfaces in a direction intersecting a direction in which the pair of inclined surfaces faces each other. Accordingly, when the protrusion portion is inserted into the first opening and an elastic deformation of the elastic portion is partially released, it is possible to positionally align the optical element in a direction along the first surface by causing the protrusion portion to slide on the inclined surface and to abut the facing surface due to an elastic force.

In the optical module according to another aspect of the present disclosure, when viewed in a direction intersecting the first surface, an inclination angle of the pair of inclined surfaces with respect to a straight line passing through the other end of one inclined surface and the other end of the other inclined surface may be 45 degrees or smaller. Accordingly, a reaction force of an elastic force applied to the protrusion portion can be further dispersed in a direction intersecting the direction in which the pair of inclined surfaces faces each other than in the direction in which the pair of inclined surfaces faces each other. Therefore, it is possible to improve the tolerance to an impact in a direction intersecting the direction in which the pair of inclined surfaces faces each other.

In the optical module according to another aspect of the present disclosure, the base may have a support layer, and a device layer which is provided on the support layer and includes the first surface and the second surface. Accordingly, it is possible to favorably realize a configuration for reliable mounting of the optical element.

In the optical module according to another aspect of the present disclosure, the base may have an intermediate layer which is provided between the support layer and the device layer. Accordingly, it is possible to more favorably realize a configuration for reliable mounting of the optical element.

The optical module according to another aspect of the present disclosure may further include a fixed mirror which is mounted in the support layer, the device layer, or the intermediate layer; and a beam splitter which is mounted in the support layer, the device layer, or the intermediate layer. The optical element may be a movable mirror which includes the optical surface serving as a mirror surface. The device layer may have a mounting region in which the optical element is mounted and a driving region which is connected to the mounting region. The movable mirror, the fixed mirror, and the beam splitter may be disposed such that an interference optical system is constituted. For example, when a Fourier transform infrared spectroscopic analyzer (FTIR) is constituted by forming an interference optical system on a silicon-on-insulator (SOI) substrate using an MEMS technology, the following problem arises in respect that the size of a movable mirror depends on a degree of completion of deep cutting with respect to an SOI substrate. That is, since the degree of completion of deep cutting with respect to an SOI substrate is approximately 500 μm at the maximum, there is a limitation in increasing the size of a movable mirror for the sake of improvement of sensitivity of an FTIR. In contrast, according to this optical module, a separately formed movable mirror is mounted in the device layer. Therefore, it is possible to obtain an FTIR having improved sensitivity.

In the optical module according to another aspect of the present disclosure, the support layer may be a first silicon layer of an SOI substrate. The device layer may be a second silicon layer of the SOI substrate. The intermediate layer may be an insulating layer of the SOI substrate. Accordingly, it is possible to favorably realize a configuration for reliable mounting of the movable mirror with respect to the device layer using the SOI substrate.

The optical module according to another aspect of the present disclosure may further include a light incident unit which is disposed such that measurement light is incident on the interference optical system from outside, and a light emission unit which is disposed such that the measurement light is emitted from the interference optical system to the outside. Accordingly, it is possible to obtain an FTIR including a light incident unit and a light emission unit.

According to another aspect of the present disclosure, it is possible to provide an optical module in which reliable mounting of an optical element can be realized.

Hereinafter, an embodiment of another aspect of the present disclosure will be described in detail with reference to the drawings. The same reference signs are applied to parts which are the same or corresponding in each of the drawings, and duplicated parts will be omitted.

[Configuration of Optical Module]

Figure 16:
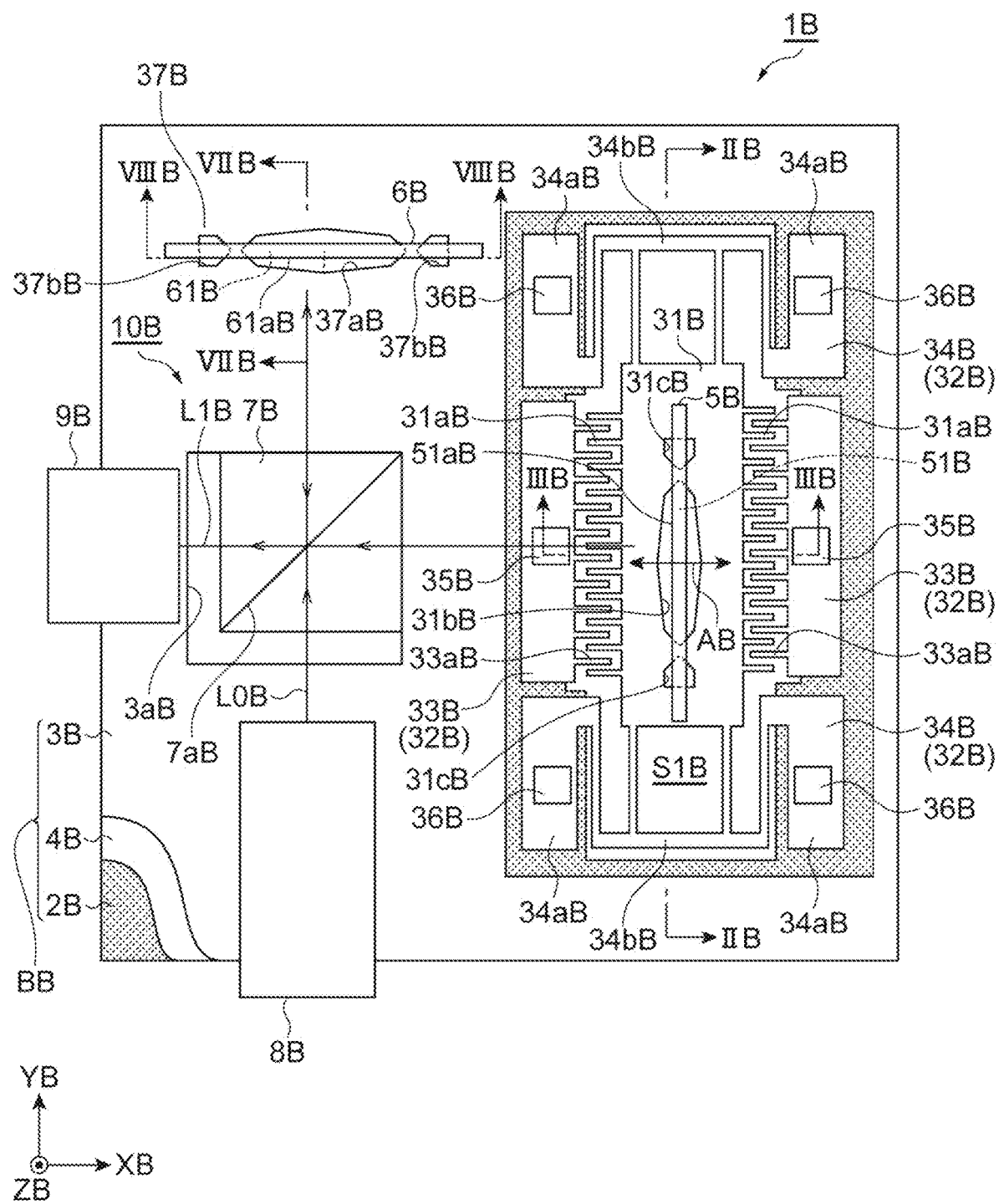
FIG. 16 is a plan view of an optical module of another embodiment.

As illustrated in FIG. 16, an optical module 1B includes a base BB. The base BB includes a support layer 2B, a device layer 3B which is provided on the support layer 2B, and an intermediate layer 4B which is provided between the support layer 2B and the device layer 3B. The support layer 2B, the device layer 3B, and the intermediate layer 4B are constituted of an SOI substrate. Specifically, the support layer 2B is a first silicon layer of the SOI substrate. The device layer 3B is a second silicon layer of the SOI substrate. The intermediate layer 4B is an insulating layer of the SOI substrate. The support layer 2B, the device layer 3B, and the intermediate layer 4B exhibit a rectangular shape of which one side is approximately 10 mm, for example, when viewed in a ZB-axis direction (direction parallel to a ZB-axis) that is a stacking direction thereof. The thickness of each of the support layer 2B and the device layer 3B is approximately several hundreds of μm, for example. The thickness of the intermediate layer 4B is approximately several μm, for example. FIG. 16 illustrates the device layer 3B and the intermediate layer 4B in a state where one corner portion of the device layer 3B and one corner portion of the intermediate layer 4B are cut out.

The device layer 3B has a mounting region 31B and a driving region 32B which is connected to the mounting region 31B. The driving region 32B includes a pair of actuator regions 33B and a pair of elastic support regions 34B. The mounting region 31B and the driving region 32B (that is, the mounting region 31B, the pair of actuator regions 33B, and the pair of elastic support regions 34B) are integrally formed in a portion of the device layer 3B by a MEMS technology (patterning and etching).

The actuator regions 33B of the pair are disposed on both sides of the mounting region 31B in an XB-axis direction (direction parallel to an XB-axis orthogonal to the ZB-axis). That is, the mounting region 31B is sandwiched between the actuator regions 33B of the pair in the XB-axis direction. Each of the actuator regions 33B is fixed to the support layer 2B with the intermediate layer 4B interposed therebetween. A first comb-teeth portion 33aB is provided on a side surface of each of the actuator regions 33B on the mounting region 31B side. Each of the first comb-teeth portions 33aB is in a state of being floated with respect to the support layer 2B after the intermediate layer 4B immediately below thereof is removed. A first electrode 35B is provided in each of the actuator regions 33B.

The elastic support regions 34B of the pair are disposed on both sides of the mounting region 31B in a YB-axis direction (direction parallel to a YB-axis orthogonal to the ZB-axis and the XB-axis). That is, the mounting region 31B is sandwiched between the pair of elastic support regions 34B in the YB-axis direction. Both end portions 34aB of each of the elastic support regions 34B are fixed to the support layer 2B with the intermediate layer 4B interposed therebetween. An elastic deformation portion 34bB (part between both the end portions 34aB) of each of the elastic support regions 34B has a structure in which a plurality of leaf springs are connected. The elastic deformation portion 34bB of each of the elastic support regions 34B is in a state of being floated with respect to the support layer 2B by removing the intermediate layer 4B immediately below thereof. A second electrode 36B is provided in each of both the end portions 34aB in each of the elastic support regions 34B.

The elastic deformation portion 34bB of each of the elastic support regions 34B is connected to the mounting region 31B. The mounting region 31B is in a state of being floated with respect to the support layer 2B by removing the intermediate layer 4B immediately below thereof. That is, the mounting region 31B is supported by the pair of elastic support regions 34B. Second comb-teeth portions 31aB are provided on side surfaces of the mounting region 31B on the actuator region 33B side. Each of the second comb-teeth portions 31aB is in a state of being floated with respect to the support layer 2B by removing the intermediate layer 4B immediately below thereof. In the first comb-teeth portions 33aB and the second comb-teeth portions 31aB facing each other, each comb tooth of the first comb-teeth portions 33aB is positioned between comb teeth of the second comb-teeth portions 31aB.

The elastic support regions 34B of the pair sandwich the mounting region 31B from both sides with respect to a direction AB parallel to the XB-axis. When the mounting region 31B moves in the direction AB, the pair of elastic support regions 34B causes an elastic force to act on the mounting region 31B such that the mounting region 31B returns to the initial position. Therefore, when a voltage is applied to a part between the first electrode 35B and the second electrode 36B such that an electrostatic attraction acts between the first comb-teeth portions 33aB and the second comb-teeth portions 31aB facing each other, the mounting region 31B moves in the direction AB to a position where the electrostatic attraction and the elastic force of the pair of elastic support regions 34B are balanced. In this manner, the driving region 32B functions as an electrostatic actuator.

The optical module 1B further includes a movable mirror 5B, a fixed mirror 6B, a beam splitter 7B, a light incident unit 8B, and a light emission unit 9B. The movable mirror 5B, the fixed mirror 6B, and the beam splitter 7B are disposed on the device layer 3B such that an interference optical system 10B (Michelson interference optical system) is constituted.

The movable mirror 5B is mounted in the mounting region 31B of the device layer 3B on one side of the beam splitter 7B in the XB-axis direction. A mirror surface 51aB of a mirror portion 51B included in the movable mirror 5B is positioned on a side opposite to the support layer 2B with respect to the device layer 3B. For example, the mirror surface 51aB is a surface perpendicular to the XB-axis direction (that is, a surface perpendicular to the direction AB) and is directed to the beam splitter 7B side.

The fixed mirror 6B is mounted in a mounting region 37B of the device layer 3B on one side of the beam splitter 7B in the YB-axis direction. A mirror surface 61aB of a mirror portion 61B included in the fixed mirror 6B is positioned on a side opposite to the support layer 2B with respect to the device layer 3B. For example, the mirror surface 61aB is a surface perpendicular to the YB-axis direction and is directed to the beam splitter 7B side.

The light incident unit 8B is mounted in the device layer 3B on the other side of the beam splitter 7B in the YB-axis direction. For example, the light incident unit 8B is constituted of optical fibers, a collimating lens, and the like. The light incident unit 8B is disposed such that measurement light is incident on the interference optical system 10B from outside.

The light emission unit 9B is mounted in the device layer 3B on the other side of the beam splitter 7B in the XB-axis direction. For example, the light emission unit 9B is constituted of optical fibers, a collimating lens, and the like. The light emission unit 9B is disposed such that measurement light (interference light) is emitted from the interference optical system 10B to the outside.

The beam splitter 7B is a cube-type beam splitter having an optical functional surface 7aB. The optical functional surface 7aB is positioned on a side opposite to the support layer 2B with respect to the device layer 3B. The beam splitter 7B is positionally aligned when one corner portion of the beam splitter 7B on a bottom surface side is brought into contact with one corner of a rectangular opening 3aB formed in the device layer 3B. The beam splitter 7B is mounted in the support layer 2B by being fixed to the support layer 2B through bonding or the like in a positionally aligned state.

In the optical module 1B having a configuration described above, when measurement light L0B is incident on the interference optical system 10B from outside via the light incident unit 8B, a portion of the measurement light L0B is reflected by the optical functional surface 7aB of the beam splitter 7B and travels toward the movable mirror 5B, and the remaining portion of the measurement light L0B is transmitted through the optical functional surface 7aB of the beam splitter 7B and travels toward the fixed mirror 6B. A portion of the measurement light L0B is reflected by the mirror surface 51aB of the movable mirror 5B, travels toward the beam splitter 7B along the same optical path, and is transmitted through the optical functional surface 7aB of the beam splitter 7B. The remaining portion of the measurement light L0B is reflected by the mirror surface 61aB of the fixed mirror 6B, travels toward the beam splitter 7B along the same optical path, and is reflected by the optical functional surface 7aB of the beam splitter 7B. A portion of the measurement light L0B which has been transmitted through the optical functional surface 7aB of the beam splitter 7B, and the remaining portion of the measurement light L0B which has been reflected by the optical functional surface 7aB of the beam splitter 7B become measurement light L1B (interference light). The measurement light L1B is emitted from the interference optical system 10B to the outside via the light emission unit 9B. According to the optical module 1B, since the movable mirror 5B can reciprocate in the direction AB at a high speed, it is possible to provide a small-sized FTIR having high accuracy.

[Movable Mirror and Surrounding Structure Thereof]

Figure 17:
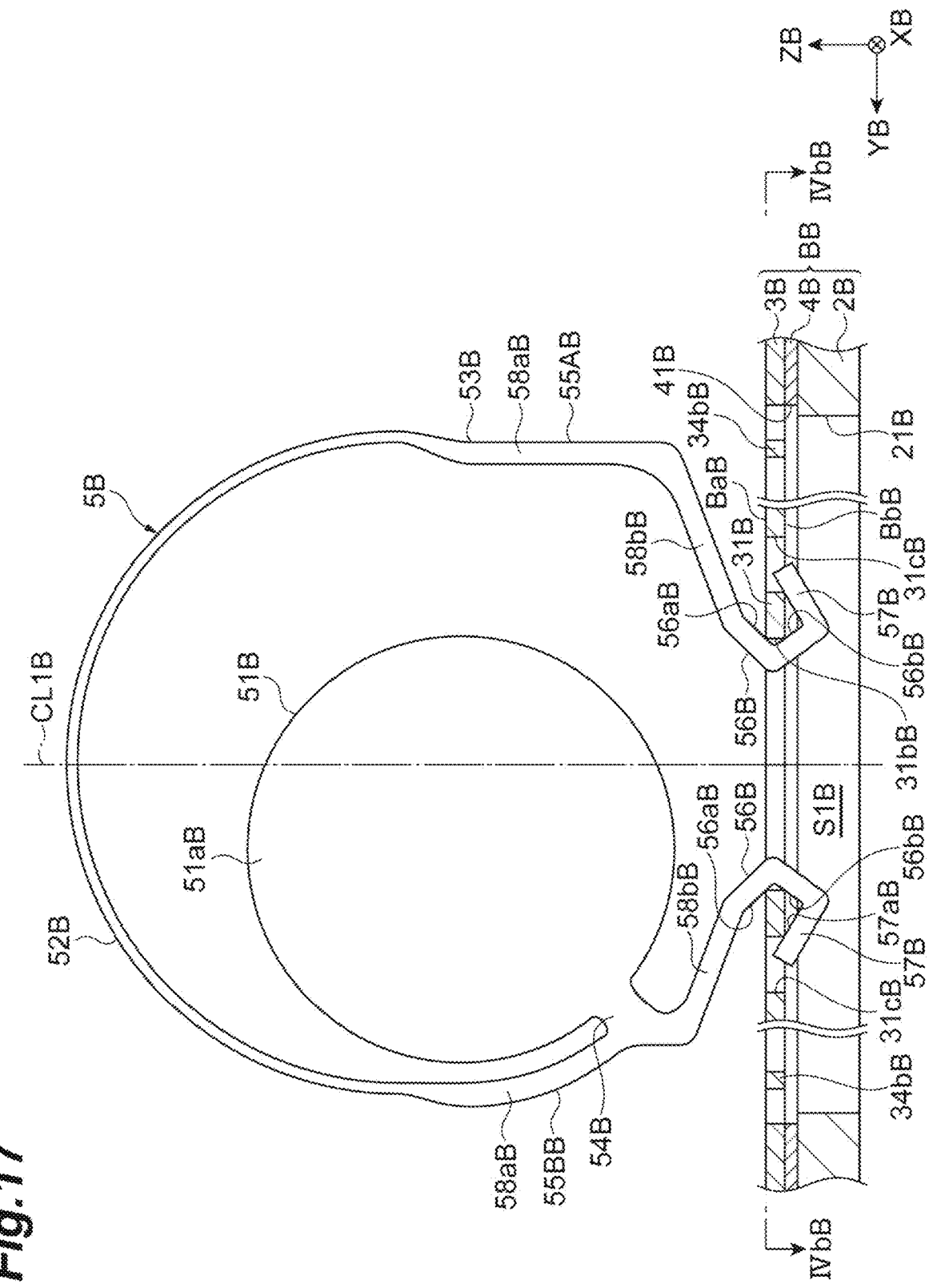
FIG. 17 is a cross-sectional view taken along line IIB-IIB illustrated in FIG. 16.
Figure 18:
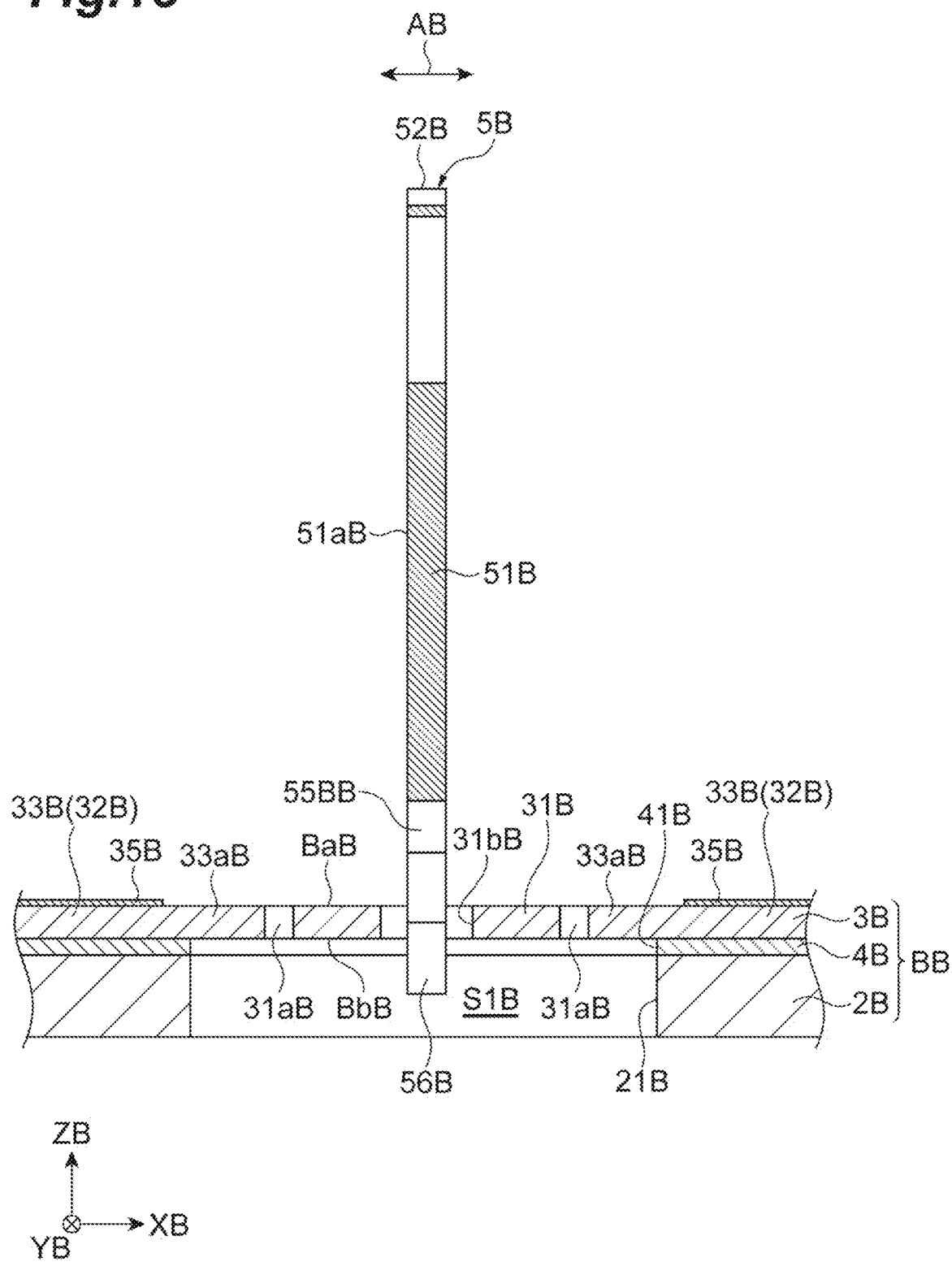
FIG. 18 is a cross-sectional view taken along line IIIB-IIIB illustrated in FIG. 16.
Figure 19:
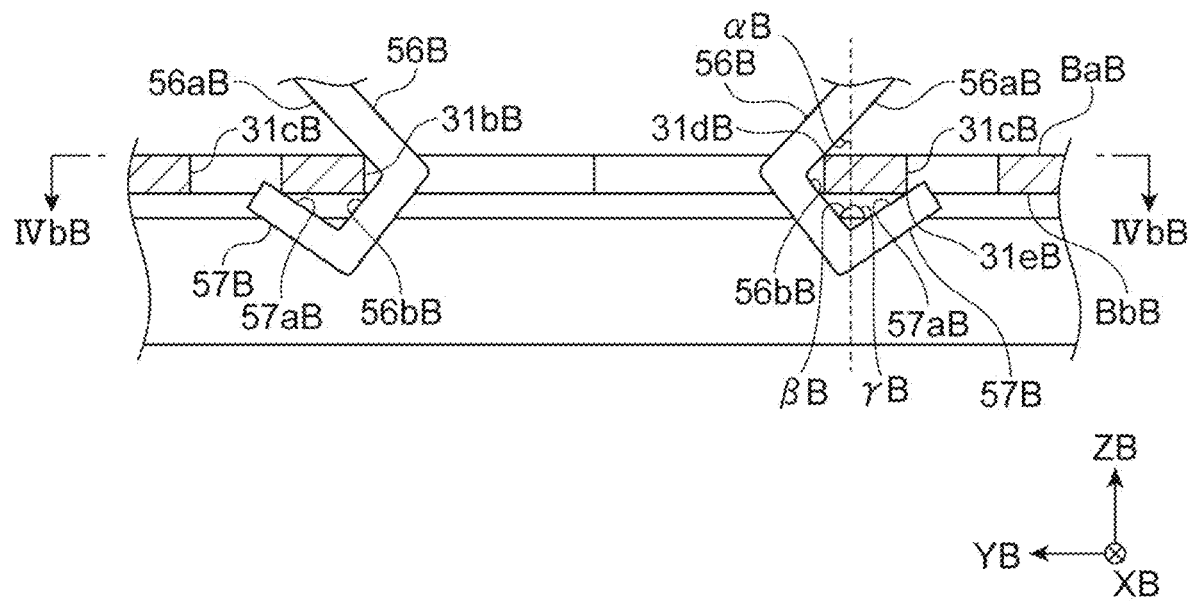
FIG. 19(a) is an enlarged view of a portion in FIG. 17.
FIG. 19(b) is a cross-sectional view taken along line IVbB-IVbB illustrated in FIG. 17.
Figure 19:
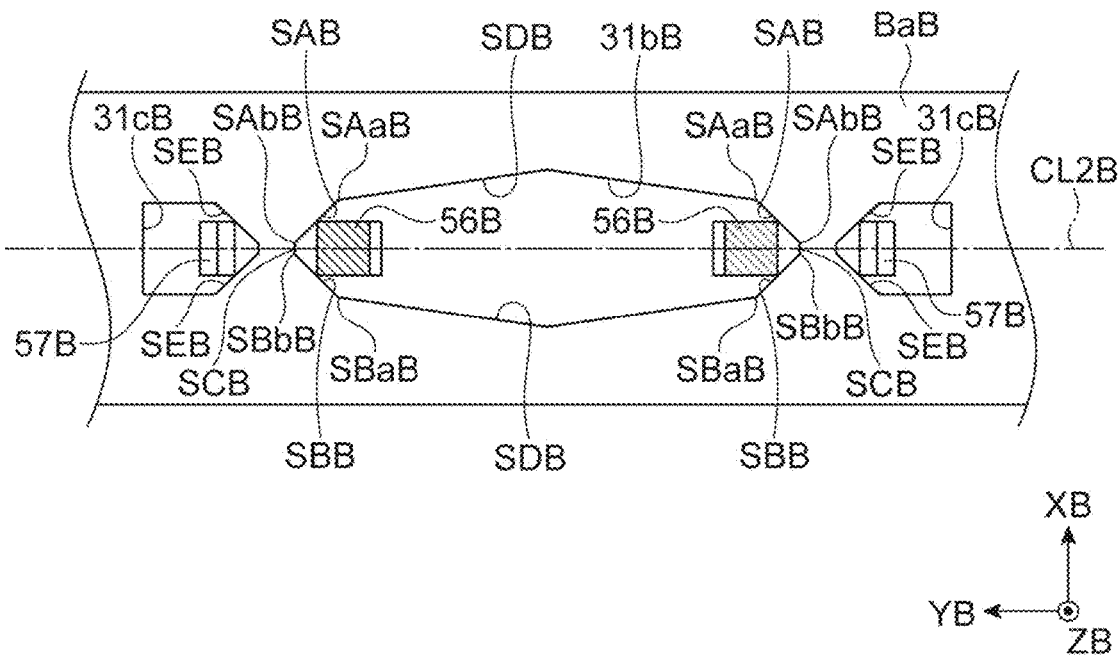

As illustrated in FIGS. 17, 18, and 19, the base BB includes a first surface BaB and a second surface BbB facing each other. The first surface BaB is a surface of the device layer 3B on a side opposite to the support layer 2B, and the second surface BbB is a surface of the device layer 3B on the support layer 2B side. The movable mirror 5B is mounted on the base BB in a state where the mirror surface 51aB is positioned on a plane intersecting (for example, orthogonal to) the first surface BaB and the mirror surface 51aB is positioned on the first surface BaB side of the base BB.

The movable mirror (optical element) 5B has the mirror portion (optical portion) 51B, an elastic portion 52B, a support portion 53B, and a connecting portion 54B. The movable mirror 5B is integrally formed by a MEMS technology (patterning and etching). Therefore, the thickness (size in the XB-axis direction orthogonal to the mirror surface 51aB) of the movable mirror 5B is uniform in each portion. For example, the thickness thereof is within a range of approximately 10 μm to 20 μm. In addition, the mirror portion 51B, the elastic portion 52B, the support portion 53B, and the connecting portion 54B are provided to be positioned on the same plane when viewed in the YB-axis direction (direction along both the mirror surface 51aB and the first surface BaB).

The mirror portion 51B is formed to have a plate shape (for example, a disk shape) having the mirror surface (optical surface) 51aB as a main surface. The diameter of the mirror surface 51aB is approximately 1 mm, for example. The elastic portion 52B is formed to have an arc shape (for example, a semicircular arc shape) being separated from the mirror portion 51B and surrounding the mirror portion 51B when viewed in the XB-axis direction.

The support portion 53B has a pair of leg portions 55AB and 55BB, a pair of interlock portions (protrusion portions) 56B, and a pair of folded portions 57B. The leg portions 55AB and 55BB of the pair are provided such that the mirror portion 51B is sandwiched therebetween in the YB-axis direction and are respectively connected to both end portions of the elastic portion 52B.

Each of the leg portion 55AB and the leg portion 55BB has a first part 58aB of which one end is connected to the elastic portion 52B and a second part 58bB which is connected to the other end of the first part 58aB. The first part 58aB of the leg portion 55AB extends in the ZB-axis direction (direction orthogonal to the first surface BaB. The first part 58aB of the leg portion 55BB extends in an arc shape along an outer edge of the mirror portion 51B when viewed in the XB-axis direction. The second parts 58bB of the leg portion 55AB and the leg portion 55BB extend in a manner inclined toward each other while being away from the elastic portion 52B (in the negative ZB-axis direction).

The interlock portions 56B of the pair are respectively provided in end portions of the second parts 58bB on a side opposite to the elastic portion 52B. The pair of interlock portions 56B is formed to be bent inward (toward each other) in a V-shape, for example, when viewed in the XB-axis direction. Each of the interlock portions 56B includes an inclined surface 56aB and an inclined surface 56bB. The inclined surface 56aB and the inclined surface 56bB are surfaces (outer surfaces) of the pair of interlock portions 56B on sides opposite to surfaces facing each other.

The inclined surfaces 56aB are inclined toward each other in the negative ZB-axis direction between the interlock portions 56B of the pair. The inclined surfaces 56bB are inclined away from each other in the negative ZB-axis direction. When viewed in the XB-axis direction, an inclination angle αB of the inclined surface 56aB with respect to the ZB-axis is equivalent to or slightly larger than an inclination angle βB of the inclined surface 56bB with respect to the ZB-axis direction. For example, the inclination angle αB is approximately 45 degrees, and the inclination angle βB is approximately 35 degrees.

The pair of interlock portions 56B is connected to the elastic portion 52B via the pair of leg portions 55AB and 55BB, respectively. Accordingly, for example, when a force is applied to the leg portions 55AB and 55BB of the pair such that they are sandwiched from both sides in the YB-axis direction, the elastic portion 52B can be elastically deformed to be compressed in the YB-axis direction, and the distance between the interlock portions 56B of the pair can be shortened. That is, the distance between the interlock portions 56B of the pair in the YB-axis direction can be changed in accordance with elastic deformation of the elastic portion 52B. In addition, an elastic force of the elastic portion 52B can be applied to the pair of interlock portions 56B.

The folded portions 57B of the pair are respectively provided in end portions of the interlock portions 56B on a side opposite to the elastic portion 52B. The pair of folded portions 57B extends outward (away from each other) and toward a side in the positive ZB-axis direction when viewed in the XB-axis direction. Each of the folded portions 57B includes an inclined surface 57aB. The inclined surface 57aB is a surface of the folded portion 57B facing the interlock portion 56B. The inclined surfaces 57aB are inclined away from each other in the positive ZB-axis direction between the folded portions 57B of the pair. When viewed in the XB-axis direction, an inclination angle γB of the inclined surface 57aB with respect to the ZB-axis direction is slightly larger than the inclination angle αB. The inclination angle γB is approximately 60 degrees, for example.

The connecting portion 54B connects the mirror portion 51B and the leg portion 55BB to each other. When viewed in the XB-axis direction, the connecting portion 54B is connected to the mirror portion 51B on a side opposite to the elastic portion 52B with respect to the center of the mirror portion 51B in a predetermined direction. This predetermined direction is a direction intersecting both the YB-axis direction and the ZB-axis direction. The connecting portion 54B is connected to the leg portion 55BB in a connection part between the first part 58aB and the second part 58bB. The center of the mirror portion 51B is positioned on one side (leg portion 55BB side) in the YB-axis direction with respect to a center line CL1B. The center line CL1B is an imaginary straight line passing through the center of a first opening 31bB (which will be described below) and extending in the ZB-axis direction.

Here, the first opening 31bB and a pair of second openings 31cB are formed in the mounting region 31B of the base BB. The first opening 31bB and each of the second openings 31cB penetrate the device layer 3B in the ZB-axis direction and are open on both the first surface BaB and the second surface BbB. The second openings 31cB of the pair are provided such that the first opening 31bB is sandwiched therebetween in the YB-axis direction. The first opening 31bB and the second openings 31cB will be described below in detail.

The interlock portions 56B of the pair are inserted into the first opening 31bB in a state where an elastic force of the elastic portion 52B is applied in a direction away from each other. Each of the interlock portions 56B protrudes from the second surface BbB via the first opening 31bB. Each of the interlock portions 56B comes into contact with an edge portion 31dB of the first opening 31bB on the first surface BaB side on the inclined surface 56aB. Each of the folded portions 57B extends from each of the interlock portions 56B toward the second surface BbB and enters the second opening 31cB from the second surface BbB side. Each of the folded portions 57B comes into contact with an edge portion 31eB of the second opening 31cB on the second surface BbB side on the inclined surface 57aB. In this manner, since the interlock portions 56B come into contact with the edge portions 31dB of the first opening 31bB on the first surface BaB side and the folded portions 57B come into contact with the edge portions 31eB of the second openings 31cB on the second surface BbB side, the movable mirror 5B is prevented from being detached in the ZB-axis direction.

Here, an opening 41B is formed in the intermediate layer 4B. The opening 41B is open on both sides of the intermediate layer 4B in the ZB-axis direction. An opening 21B is formed in the support layer 2B. The opening 21B is open on both sides of the support layer 2B in the ZB-axis direction. In the optical module 1B, a continuous space S1B is constituted of a region inside the opening 41B of the intermediate layer 4B and a region inside the opening 21B of the support layer 2B. That is, the space S1B includes a region inside the opening 41B of the intermediate layer 4B and a region inside the opening 21B of the support layer 2B.

The space S1B is formed between the support layer 2B and the device layer 3B and corresponds to at least the mounting region 31B and the driving region 32B. Specifically, a region inside the opening 41B of the intermediate layer 4B and a region inside the opening 21B of the support layer 2B include a range in which the mounting region 31B moves when viewed in the ZB-axis direction. A region inside the opening 41B of the intermediate layer 4B forms a clearance for causing a part (that is, a part to be in a detached state with respect to the support layer 2B, for example, the mounting region 31B in its entirety, the elastic deformation portion 34bB of each of the elastic support regions 34B, the first comb-teeth portions 33aB, and the second comb-teeth portions 31aB) of the mounting region 31B and the driving region 32B, which needs to be separated from the support layer 2B, to be separated from the support layer 2B.

A portion of each of the interlock portions 56B included in the movable mirror 5B is positioned in the space S1B. Specifically, a portion of each of the interlock portions 56B is positioned in a region inside the opening 21B of the support layer 2B through a region inside the opening 41B of the intermediate layer 4B. A portion of each of the interlock portions 56B protrudes into the space S1B from the second surface BbB by approximately 100 μm, for example. As described above, since a region inside the opening 41B of the intermediate layer 4B and a region inside the opening 21B of the support layer 2B include the range in which the mounting region 31B moves when viewed in the ZB-axis direction, a portion of each of the interlock portions 56B of the movable mirror 5B positioned in the space S1B does not come into contact with the intermediate layer 4B and the support layer 2B when the mounting region 31B reciprocates in the direction AB.

Here, as illustrated in FIG. 19(b), an inner surface of the first opening 31bB includes inclined surfaces SAB of a pair facing each other in the YB-axis direction and inclined surfaces SBB of a pair facing each other in the YB-axis direction. Each of the inclined surfaces SAB includes one end SAaB and the other end SAbB, and each of the inclined surfaces SBB includes one end SBaB and the other end SBbB. When viewed in the ZB-axis direction, the inclined surfaces SAB of the pair are inclined such that the distance therebetween increases from the one end SAaB toward the other end SAbB (for example, with respect to the XB-axis direction), and the inclined surfaces SBB of the pair are inclined to a side opposite to the inclined surfaces SAB of the pair such that the distance therebetween increases from the one end SBaB toward the other end SBbB (for example, with respect to the XB-axis direction). The inclined surface SAB and the inclined surface SBB face each other in the XB-axis direction (direction orthogonal to the YB-axis direction in which the inclined surfaces SAB of the pair face each other).

On each of both sides in the YB-axis direction, the other end SAbB on the inclined surface SAB and the other end SBbB on the inclined surface SBB are connected to each other via a connection surface SCB extending in the XB-axis direction. On each of both sides in the YB-axis direction, the inclined surface SAB, the inclined surface SBB, and the connection surface SCB define one corner portion. On each of both sides in the XB-axis direction, the one end SAaB of the inclined surface SAB and the one end SBaB of the inclined surface SBB are connected to each other via a connection surface SDB extending in the YB-axis direction. The connection surface SDB has a V-shape widened outward (away from each other) in an intermediate portion when viewed in the ZB-axis direction. The first opening 31bB has a line symmetrical shape with respect to a center line CL2B passing through the center of the first opening 31bB and being parallel to the YB-axis direction when viewed in the ZB-axis direction. In this case, the first opening 31bB has a decagonal shape when viewed in the ZB-axis direction.

The inner surface of each of the second openings 31cB includes inclined surfaces SEB of a pair facing each other in the XB-axis direction. The inclined surfaces SEB of the pair are inclined away from each other while being away from the first opening 31bB when viewed in the ZB-axis direction. In the YB-axis direction, one inclined surface SEB faces the inclined surface SAB and the other inclined surface SEB faces the inclined surface SBB. The pair of inclined surfaces SEB has line symmetrical shapes with respect to the inclined surface SAB and the inclined surface SBB in the YB-axis direction when viewed in the ZB-axis direction. Each of the second openings 31cB has a line symmetrical shape with respect to the center line CL2B when viewed in the ZB-axis direction. In this case, the second opening 31cB has a hexagonal shape when viewed in the ZB-axis direction.

The maximum value for the size (that is, the gap between the other ends SAbB of the inclined surfaces SAB of the pair) of the first opening 31bB in YB-axis direction is a value allowing only a portion of elastic deformation of the elastic portion 52B to be released (that is, the elastic portion 52B does not reach the natural length) when the pair of interlock portions 56B is disposed inside the first opening 31bB. Therefore, when the pair of interlock portions 56B is disposed inside the first opening 31bB, the pair of interlock portions 56B presses the inner surface of the first opening 31bB due to an elastic force of the elastic portion 52B, and a reaction force from the inner surface of the first opening 31bB is applied to the pair of interlock portions 56B. The movable mirror 5B is supported in the base BB by the reaction force. More specifically, due to an elastic force of the elastic portion 52B, each of the interlock portions 56B comes into internal contact with a corner portion defined by the inclined surface SAB and the inclined surface SBB of the first opening 31bB, and each of the folded portions 57B is in a state of being in contact with the inclined surface SEB. Accordingly, the movable mirror 5B is positionally aligned in the XB-axis direction and the YB-axis direction.

Figure 20:
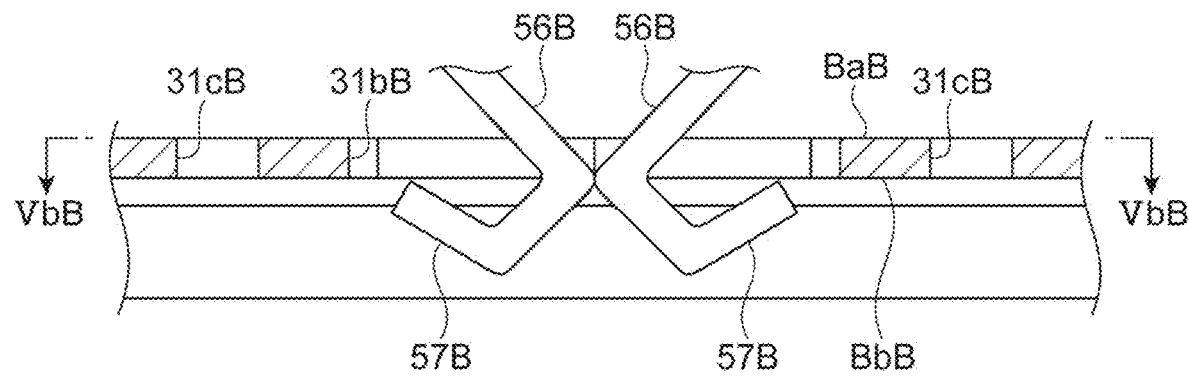
FIG. 20(a) is a cross-sectional view illustrating a process of mounting a movable mirror.
FIG. 20(b) is a cross-sectional view taken along line VbB-VbB illustrated in FIG. 20(a).
Figure 20:
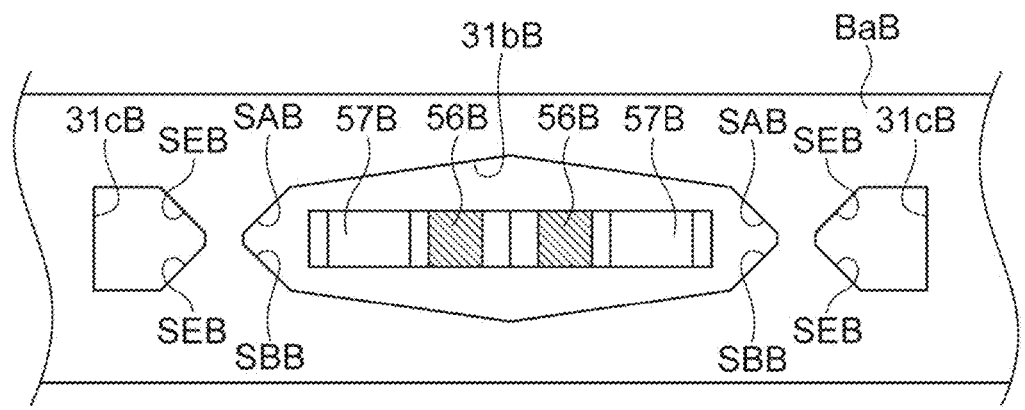
Figure 20:
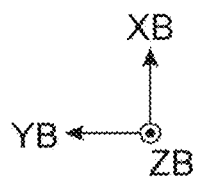

Next, with reference to FIGS. 20 and 21, an example of a process of mounting the movable mirror 5B will be described. First, as illustrated in FIG. 20, in a state where the distance between the interlock portions 56B of the pair is decreased, the pair of interlock portions 56B is inserted into the first opening 31bB from the first surface BaB side. At this time, the pair of interlock portions 56B is not in contact with the inner surface of the first opening 31bB.

Figure 21:
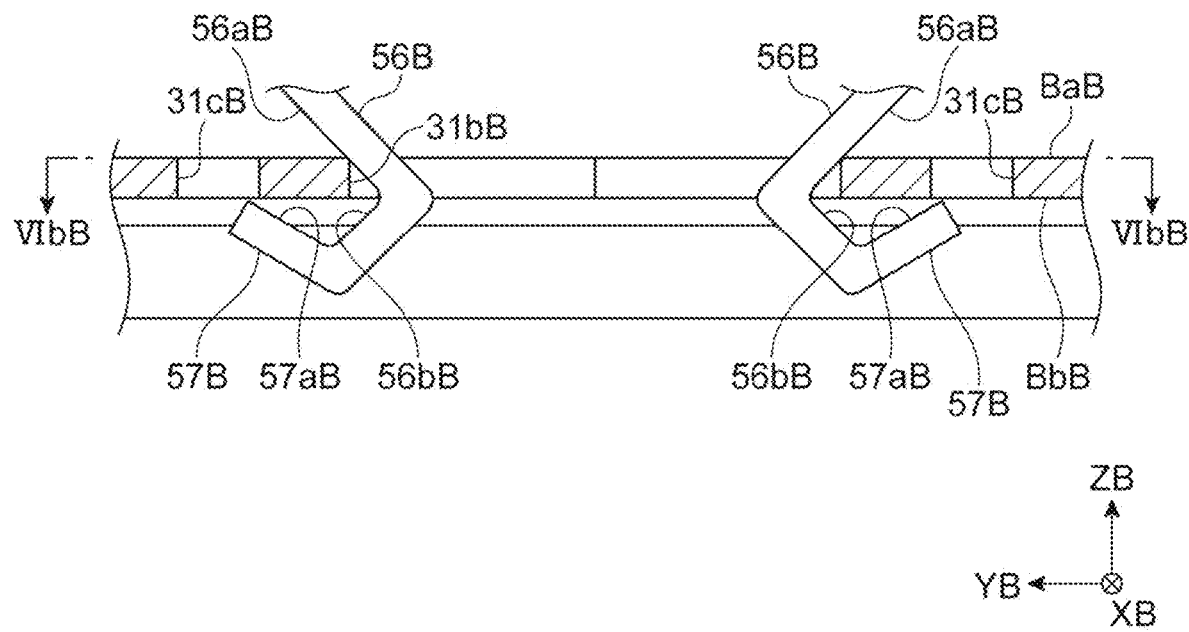
FIG. 21(a) is a cross-sectional view illustrating the process of mounting a movable mirror.
FIG. 21(b) is a cross-sectional view taken along line VIbB-VIbB illustrated in FIG. 21(a).
Figure 21:
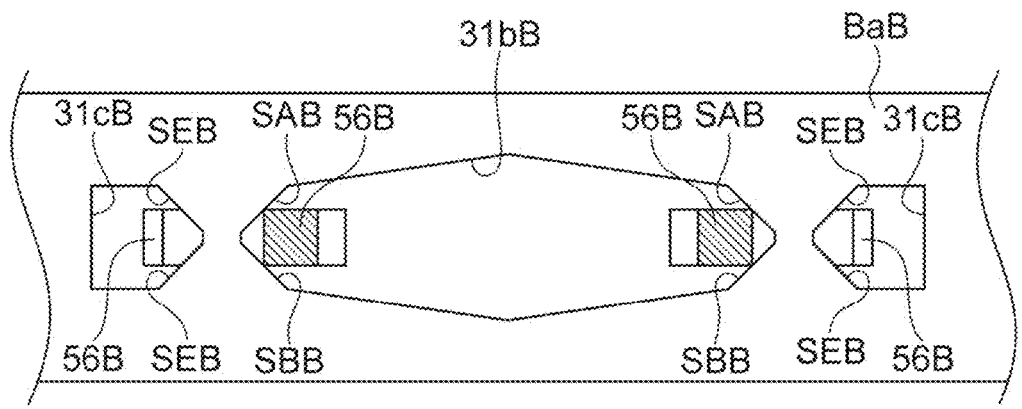

Subsequently, as illustrated in FIG. 21, the distance between the interlock portions 56B of the pair is increased. Accordingly, each of the interlock portions 56B moves toward the corner portion defined by the inclined surface SAB and the inclined surface SBB of the first opening 31bB. At this time, depending on the posture of the movable mirror 5B, there are cases where each of the interlock portions 56B comes into contact with one (which will hereinafter be referred to as a contact surface) of the inclined surface SAB and the inclined surface SBB in advance. In this case, each of the interlock portions 56B slides outward (to the second opening 31cB side) on the contact surface in the YB-axis direction due to an elastic force of the elastic portion 52B and abuts the other (that is, a facing surface facing the contact surface) of the inclined surface SAB and the inclined surface SBB while being in contact with the contact surface. Accordingly, each of the interlock portions 56B comes into internal contact with a corner portion defined by the inclined surface SAB and the inclined surface SBB and is positionally aligned (self-aligned due to an elastic force) in the XB-axis direction and the YB-axis direction.

In addition, each of the interlock portions 56B comes into contact with an edge portion 51dB of the first opening 31bB on the first surface BaB side on the inclined surface 56aB. Each of the interlock portions 56B slides toward a side in the positive ZB-axis direction on the edge portion 51dB due to an elastic force of the elastic portion 52B. Accordingly, each of the folded portions 57B enters the second opening 31cB from the second surface BbB side. Each of the folded portions 57B moves to a position (position in FIG. 19) where the inclined surface 57aB comes into contact with an edge portion 51eB of the second opening 31cB on the second surface BbB side. Accordingly, the pair of interlock portions 56B is interlocked at the position, and the movable mirror 5B is positionally aligned (self-aligned due to an elastic force) in the ZB-axis direction. That is, the movable mirror 5B is self-aligned in a three-dimensional manner utilizing an elastic force of the elastic portion 52B.

[Fixed Mirror and Surrounding Structure Thereof]

Figure 22:
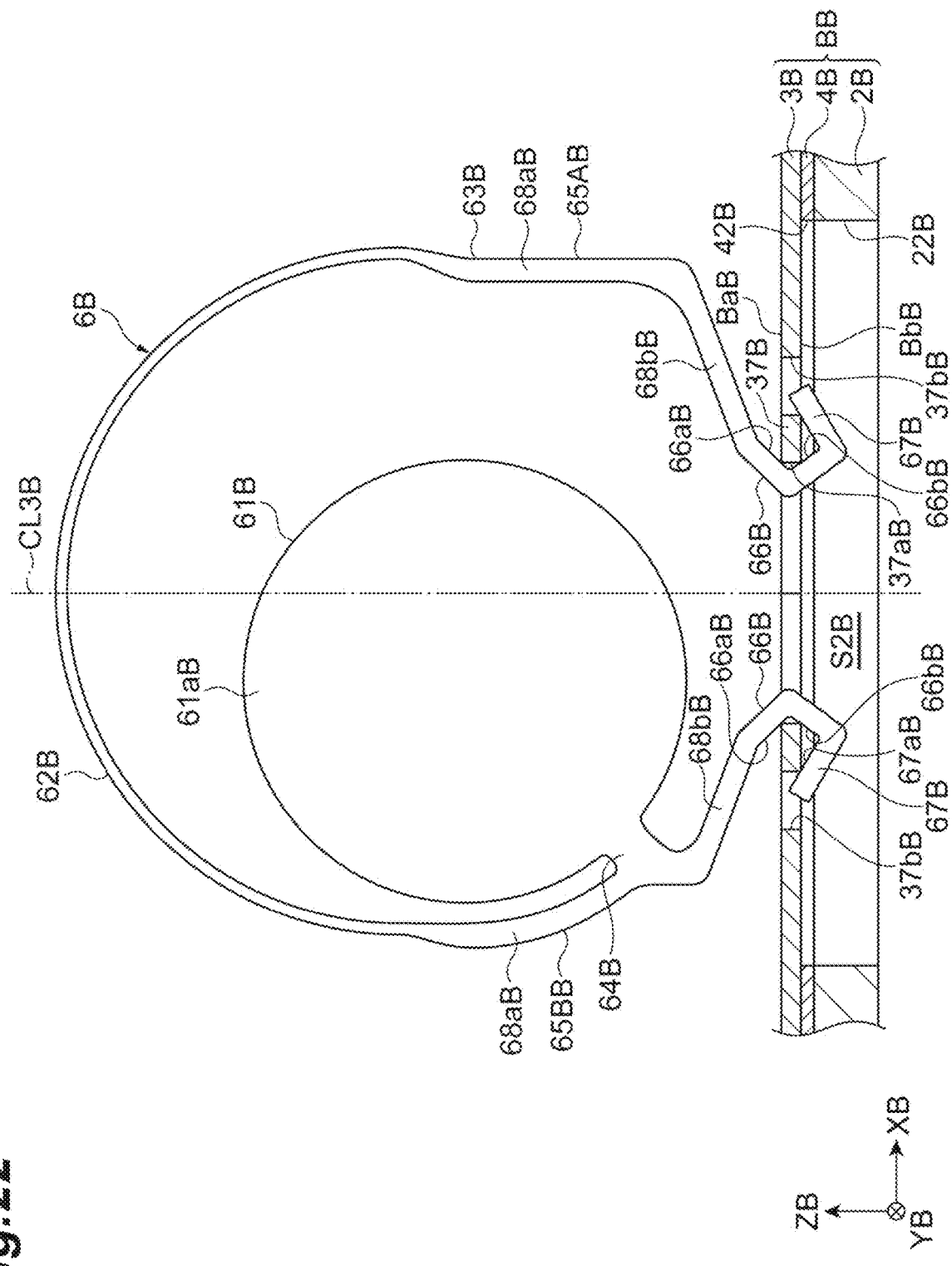
FIG. 22 is a cross-sectional view taken along line VIIB-VIIB illustrated in FIG. 16.
Figure 23:
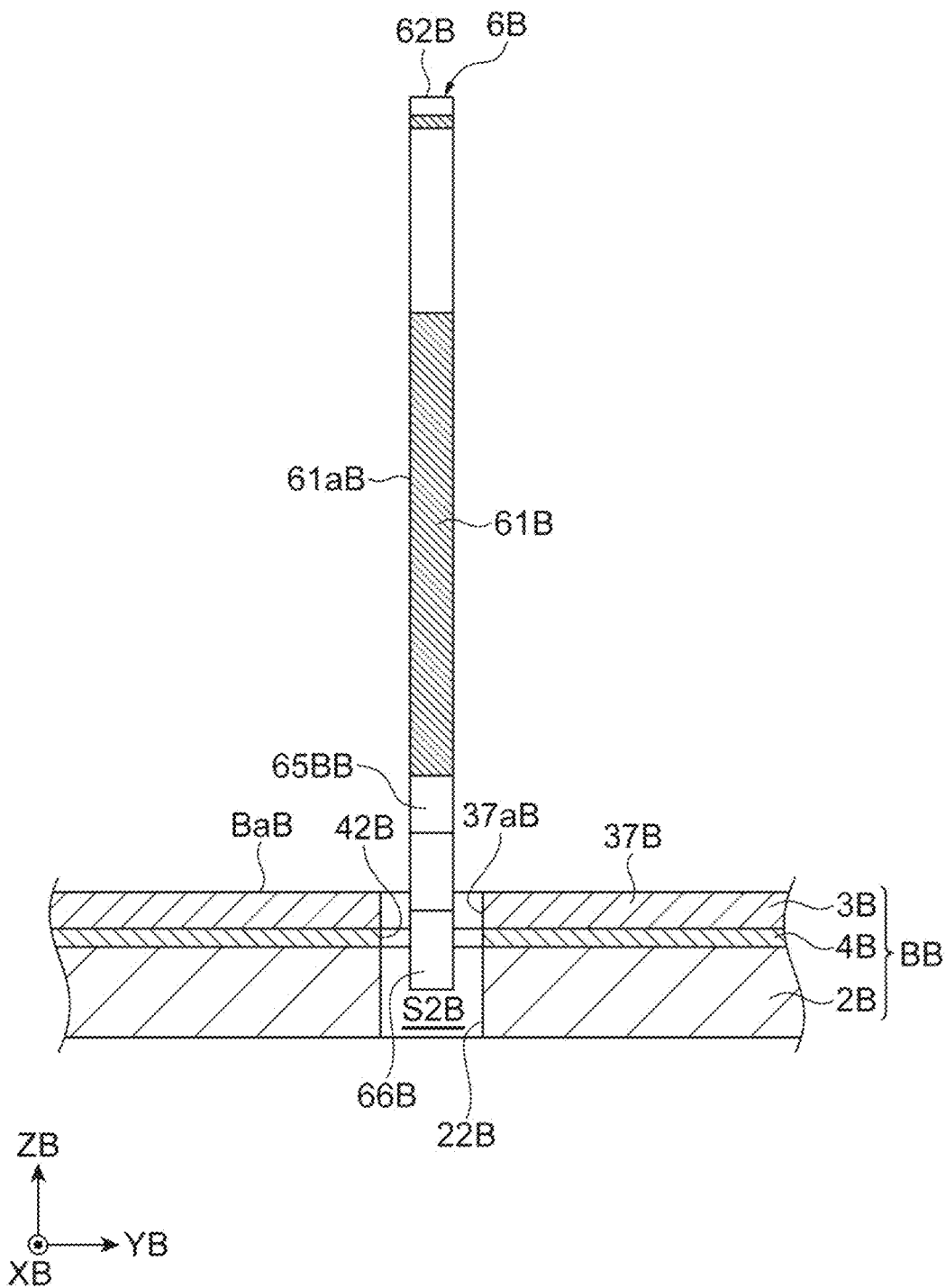
FIG. 23 is a cross-sectional view taken along line VIIIB-VIIIB illustrated in FIG. 16.

The fixed mirror 6B and the surrounding structure thereof are similar to the foregoing movable mirror 5B and the surrounding structure thereof, except that the mounting region is not movable. That is, as illustrated in FIGS. 22 and 23, the fixed mirror (optical element) 6B has the mirror portion (optical portion) 61B, an elastic portion 62B, a support portion 63B, and a connecting portion 64B. The fixed mirror 6B is mounted on the base BB in a state where the mirror surface 61aB is positioned on a plane intersecting (for example, orthogonal to) the first surface BaB and the mirror surface 61aB is positioned on the first surface BaB side of the base BB. The fixed mirror 6B is integrally formed by a MEMS technology (patterning and etching). Therefore, the thickness (size in the YB-axis direction orthogonal to the mirror surface 61aB) of the fixed mirror 6B is uniform in each portion. For example, the thickness thereof is within a range of approximately 10 μm to 20 μm. In addition, the mirror portion 61B, the elastic portion 62B, the support portion 63B, and the connecting portion 64B are provided to be positioned on the same plane when viewed in the XB-axis direction (direction along both the mirror surface 61aB and the first surface BaB).

The mirror portion 61B is formed to have a plate shape (for example, a disk shape) having the mirror surface (optical surface) 61aB as a main surface. The diameter of the mirror surface 61aB is approximately 1 mm, for example. The elastic portion 62B is formed to have an arc shape (for example, a semicircular arc shape) being separated from the mirror portion 61B and surrounding the mirror portion 61B when viewed in the YB-axis direction.

The support portion 63B has a pair of leg portions 65AB and 65BB, a pair of interlock portions (protrusion portions) 66B, and a pair of folded portions 67B. The leg portions 65AB and 65BB of the pair are provided such that the mirror portion 61B is sandwiched therebetween in the XB-axis direction and are respectively connected to both end portions of the elastic portion 62B.

Each of the leg portion 65AB and the leg portion 65BB has a first part 68aB of which one end is connected to the elastic portion 62B and a second part 68bB which is connected to the other end of the first part 68aB. The first part 68aB of the leg portion 65AB extends in the ZB-axis direction (direction orthogonal to the first surface BaB). The first part 68aB of the leg portion 65BB extends in a circular arc shape along an outer edge of the mirror portion 61B when viewed in the YB-axis direction. The second parts 68bB of the leg portion 65AB and the leg portion 65BB extend in a manner inclined toward each other while being away from the elastic portion 62B (in the negative ZB-axis direction).

The interlock portions 66B of the pair are respectively provided in end portions of the second parts 68bB on a side opposite to the elastic portion 62B. The pair of interlock portions 66B is formed to be bent inward (toward each other) in a V-shape, for example, when viewed in the YB-axis direction. Each of the interlock portions 66B includes an inclined surface 66aB and an inclined surface 66bB. The inclined surface 66aB and the inclined surface 66bB are surfaces (outer surfaces) of the pair of interlock portions 66B on sides opposite to surfaces facing each other.

The inclined surfaces 66aB are inclined toward each other in the negative ZB-axis direction between the interlock portions 66B of the pair. The inclined surfaces 66bB are inclined away from each other in the negative ZB-axis direction. When viewed in the YB-axis direction, inclination angles of the inclined surfaces 66aB and 66bB with respect to the ZB-axis direction are similar to those of the inclined surfaces 56aB and 56bB in the movable mirror 5B.

The interlock portions 66B of the pair are connected to the elastic portion 62B via the leg portions 65AB and 65BB of the pair, respectively. Accordingly, for example, when a force is applied to the leg portions 65AB and 65BB of the pair such that they are sandwiched from both sides in the XB-axis direction, the elastic portion 62B can be elastically deformed to be compressed in the XB-axis direction, and the distance between the interlock portions 66B of the pair can be shortened. That is, the distance between the interlock portions 66B of the pair in the XB-axis direction can be changed in accordance with elastic deformation of the elastic portion 62B. In addition, an elastic force of the elastic portion 62B can be applied to the pair of interlock portions 66B.

The of folded portions 67B of the pair are respectively provided in end portions of the interlock portions 66B on a side opposite to the elastic portion 62B. The folded portions 67B extend outward (away from each other) and toward a side in the positive ZB-axis direction when viewed in the YB-axis direction. Each of the folded portions 67B includes an inclined surface 67aB. The inclined surface 67aB is a surface of the folded portion 67B facing the interlock portion 66B. The inclined surfaces 67aB are inclined away from each other in the positive ZB-axis direction between the folded portions 67B of the pair. When viewed in the YB-axis direction, the inclination angle of the inclined surface 67aB with respect to the ZB-axis direction is similar to that of the inclined surface 57aB in the movable mirror 5B.

The connecting portion 64B connects the mirror portion 61B and the leg portion 65BB to each other. When viewed in the YB-axis direction, the connecting portion 64B is connected to the mirror portion 61B on a side opposite to the elastic portion 62B with respect to the center of the mirror portion 61B in a predetermined direction. This predetermined direction is a direction intersecting both the XB-axis direction and the ZB-axis direction. The connecting portion 64B is connected to the leg portion 65BB in a connection part between the first part 68aB and the second part 68bB. The center of the mirror portion 61B is positioned on one side (leg portion 65BB side) in the XB-axis direction with respect to a center line CL3B. The center line CL3B is an imaginary straight line passing through the center of a first opening 37aB (which will be described below) and extending in the ZB-axis direction.

Here, the first opening 37aB and a pair of second openings 37bB are formed in the mounting region 37B of the base BB. The first opening 37aB and each of the second openings 37bB penetrate the device layer 3B in the ZB-axis direction and are open on both the first surface BaB and the second surface BbB. The second openings 37bB of the pair are provided such that the first opening 37aB is sandwiched therebetween in the XB-axis direction.

The pair of interlock portions 66B is inserted into the first opening 37aB in a state where an elastic force of the elastic portion 62B is applied in a direction away from each other. Each of the interlock portions 66B protrudes from the second surface BbB via the first opening 37aB. Each of the interlock portions 66B comes into contact with an edge portion of the first opening 37aB on the first surface BaB side on the inclined surface 66aB. The folded portions 67B of the pair respectively extend from the interlock portions 66B toward the second surface BbB and enter the second openings 37bB from the second surface BbB side. Each of the folded portions 67B comes into contact with an edge portion of the second opening 37bB on the second surface BbB side on the inclined surface 67aB. In this manner, since the interlock portions 66B come into contact with the edge portions of the first opening 37aB on the first surface BaB side and the folded portions 67B come into contact with the edge portions of the second openings 37bB on the second surface BbB side, the fixed mirror 6B is prevented from being detached in the ZB-axis direction.

Here, an opening 42B is formed in the intermediate layer 4B. The opening 42B includes the first opening 37aB of the mounting region 37B when viewed in the ZB-axis direction and is open on both sides of the intermediate layer 4B in the ZB-axis direction. An opening 22B is formed in the support layer 2B. The opening 22B includes the first opening 37aB of the mounting region 37B when viewed in the ZB-axis direction and is open on both sides of the support layer 2B in the ZB-axis direction. In the optical module 1B, a continuous space S2B is constituted of a region inside the opening 42B of the intermediate layer 4B and a region inside the opening 22B of the support layer 2B. That is, the space S2B includes a region inside the opening 42B of the intermediate layer 4B and a region inside the opening 22B of the support layer 2B.

A portion of each of the interlock portions 66B included in the fixed mirror 6B is positioned in the space S2B. Specifically, a portion of each of the interlock portions 66B is positioned in a region inside the opening 22B of the support layer 2B through a region inside the opening 42B of the intermediate layer 4B. A portion of each of the interlock portions 66B protrudes into the space S2B from a surface of the device layer 3B on the intermediate layer 4B side by approximately 100 µm, for example.

Here, each of the inner surfaces of the first opening 37aB and the second openings 37bB has a configuration similar to those of the inner surfaces of the first opening 31bB and the second openings 31cB in the mounting region 31B. Therefore, when the pair of interlock portions 66B is disposed in the first opening 37aB, the pair of interlock portions 66B presses the inner surface of the first opening 37aB due to an elastic force of the elastic portion 62B, and a reaction force from the inner surface of the first opening 37aB is applied to the pair of interlock portions 66B. The fixed mirror 6B is supported in the base BB by the reaction force. Similar to the case of the movable mirror 5B, the fixed mirror 6B is also self-aligned in a three-dimensional manner utilizing the inner surface of the first opening 37aB and an elastic force.

[Operations and Effects]

In the optical module 1B, the first opening 31bB which is open on the first surface BaB and the second surface BbB and the second opening 31cB which is open on the second surface BbB are provided in the base BB. In addition, the support portion 53B supporting the optical portion on the base BB includes the interlock portion 56B which protrudes from the second surface BbB via the first opening 31bB and the folded portion 57B which extends from the interlock portion 56B toward the second surface BbB and enters the second opening 31cB from the second surface BbB side. Accordingly, even when the movable mirror 5B has a tendency of being deviated in a direction intersecting the first surface BaB due to an impact, for example, since the folded portion 57B comes into contact with the edge portion 31eB of the second opening 31cB on the second surface BbB side, it is possible to curb falling off of the movable mirror 5B. Thus, according to the optical module 1B, it is possible to realize reliable mounting of the movable mirror 5B.

In addition, in the optical module 1B, the second openings 31cB of the pair are provided such that the first opening 31bB is sandwiched therebetween, and the folded portions 57B are provided in the pair of interlock portions 56B and enter the pair of second openings 31cB, respectively. Accordingly, it is possible to more reliably curb falling off of the movable mirror 5B.

In addition, in the optical module 1B, the interlock portions 56B come into contact with the edge portions 31dB of the first opening 31bB on the first surface BaB side. Accordingly, it is possible to even more reliably curb falling off of the movable mirror 5B.

In addition, in the optical module 1B, the folded portions 57B come into contact with the edge portions 31eB of the second openings 31cB on the second surface BbB side. Accordingly, it is possible to even more reliably curb falling off of the movable mirror 5B. Particularly, when the interlock portions 56B come into contact with the edge portions 31dB of the first opening 31bB on the first surface BaB side and the folded portions 57B come into contact with the edge portions 31eB of the second openings 31cB on the second surface BbB side, the base BB is sandwiched between two points close to each other and is supported by the interlock portions 56B and the folded portions 57B. Therefore, it is possible to further improve the tolerance to an impact in the XB-axis direction and the ZB-axis direction.

In addition, in the optical module 1B, the interlock portions 56B of the pair, in which an elastic force is applied and a distance therebetween is able to be changed in accordance with elastic deformation of the elastic portion 52B, are inserted into the first opening 31bB in a state where an elastic force of the elastic portion 52B is applied. Then, the movable mirror 5B is supported in the base BB by a reaction force of the elastic force applied from the inner surface of the first opening 31bB to the pair of interlock portions 56B. Accordingly, the movable mirror 5B can be mounted on the base BB utilizing an elastic force of the elastic portion 52B. Moreover, the movable mirror 5B is mounted on the base BB utilizing an elastic force. Furthermore, since falling off of the movable mirror 5B is curbed by the folded portions 57B, it is possible to reduce a using amount of a bonding agent or to eliminate the need for a bonding agent. The following advantages can be achieved by reducing the using amount of a bonding agent. That is, occurrence of contamination or the like on the mirror surface 51aB or occurrence of destruction or malfunction in the driving region 32B of the optical module 1B caused by a sticking-out bonding material can be curbed. In addition, it is possible to reduce the size of the optical module 1B by reducing a region (space between constituent elements) for forming a bonding material.

In addition, in the optical module 1B, the interlock portions 56B of the pair are inserted into the first opening 31bB in a state where an elastic force of the elastic portion 52B is applied in a direction away from each other. Accordingly, it is possible to favorably mount the movable mirror 5B on the base BB utilizing an elastic force.

In addition, in the optical module 1B, when viewed in the ZB-axis direction, the inner surface of the first opening 31bB includes the inclined surfaces SAB of the pair which are inclined such that the distance therebetween increases from the one end SAaB toward the other end SAbB, and the inclined surfaces SBB of the pair which face the inclined surfaces SAB of the pair in the XB-axis direction orthogonal to the YB-axis direction in which the inclined surfaces SAB of the pair face each other. Accordingly, when the interlock portions 56B are inserted into the first opening 31bB and an elastic deformation of the elastic portion 52B is released, it is possible to positionally align the movable mirror 5B in a direction along the first surface BaB by causing the interlock portions 56B to slide on the inclined surfaces SAB and to abut the inclined surfaces SBB due to an elastic force.

In addition, in the optical module 1B, the base BB has the support layer 2B and the device layer 3B which is provided on the support layer 2B and includes the first surface BaB and the second surface BbB. Accordingly, it is possible to favorably realize a configuration for reliable mounting of the movable mirror 5B.

In addition, in the optical module 1B, the base BB has the intermediate layer 4B which is provided between the support layer 2B and the device layer 3B. Accordingly, it is possible to more favorably realize a configuration for reliable mounting of the movable mirror 5B.

In addition, in the optical module 1B, the movable mirror 5B, the fixed mirror 6B, and the beam splitter 7B are disposed such that the interference optical system 10B is constituted. Accordingly, it is possible to obtain an FTIR having improved sensitivity.

In addition, in the optical module 1B, the support layer 2B is the first silicon layer of the SOI substrate, the device layer 3B is the second silicon layer of the SOI substrate, and the intermediate layer 4B is the insulating layer of the SOI substrate. Accordingly, it is possible to favorably realize a configuration for reliable mounting of the movable mirror 5B with respect to the device layer 3B using the SOI substrate.

In addition, in the optical module 1B, the light incident unit 8B is disposed such that measurement light is incident on the interference optical system 10B from outside, and the light emission unit 9B is disposed such that the measurement light is emitted from the interference optical system 10B to the outside. Accordingly, it is possible to obtain an FTIR including the light incident unit 8B and the light emission unit 9B.

In addition, in the optical module 1B, the movable mirror 5B penetrates the mounting region 31B of the device layer 3B, and a portion of each of the interlock portions 56B of the movable mirror 5B is positioned in a space S1B formed between the support layer 2B and the device layer 3B. Accordingly, for example, since there is no limitation on the size and the like of each of the interlock portions 56B and the folded portions 57B, the movable mirror 5B can be stably and firmly fixed to the mounting region 31B of the device layer 3B. That is, since the optical module 1B employs a configuration having the space S1B, it is possible to employ a shape including the folded portions 57B, as the shape of the movable mirror 5B. Then, regarding the shape of the fragile movable mirror 5B, a shape deliberately including the folded portions 57B is employed, so that the optical module 1B in which tolerance to an external force or an environmental change is enhanced and which can tolerate installation in a portable instrument or the like is realized.

[Modification Examples]

Hereinabove, an embodiment of another aspect of the present disclosure has been described. However, another aspect of the present disclosure is not limited to the foregoing embodiment. For example, the material and the shape of each configuration are not limited to the materials and the shapes described above, and various materials and shapes can be employed.

Figure 24:
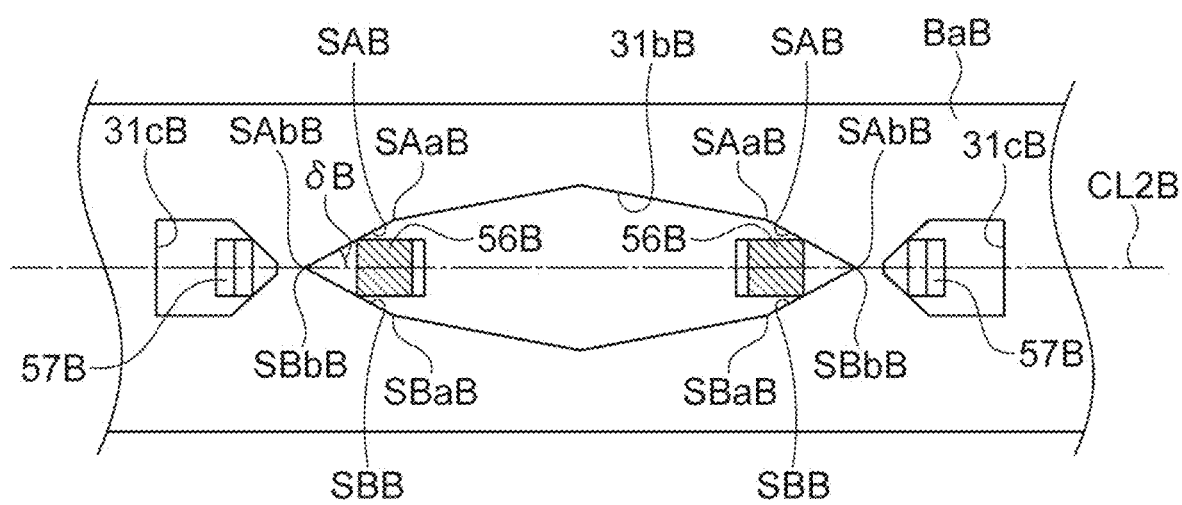
FIG. 24 is a cross-sectional view illustrating a modification example of a first opening.

In addition, the first opening 31bB may be constituted as in a first modification example illustrated in FIG. 24. In the first modification example, the other end SAbB of the inclined surface SAB and the other end SBbB of the inclined surface SBB are directly connected to each other on each of both sides in the YB-axis direction. When viewed in the ZB-axis direction, an inclination angle δB of the pair of inclined surfaces SAB with respect to a straight line (here, the center line CL2B) passing through the other end SAbB of one inclined surface SAB and the other end SAbB of the other inclined surface SAB is 45 degrees or smaller. The inclination angle δB is approximately 35 degrees, for example. Even in the first modification example, similar to the foregoing embodiment, the first opening 31bB has a line symmetrical shape with respect to the center line CL2B when viewed in the ZB-axis direction. Even in such a first modification example, similar to the foregoing embodiment, it is possible to realize reliable mounting of the movable mirror 5B. Moreover, a reaction force of an elastic force applied to the interlock portions 56B can be further dispersed in the XB-axis direction than in the YB-axis direction. Accordingly, it is possible to improve the tolerance to an impact in the XB-axis direction, which is important to improve the reliability of an FTIR.

In addition, in the foregoing embodiment, the first opening 31bB includes the pair of inclined surfaces SAB and the pair of inclined surfaces SBB. However, the first opening 31bB may include the pair of inclined surfaces SAB and a reference surface which extends along a reference line (in FIG. 19, the center line CL2B) connecting the other ends SAbB of the inclined surfaces SAB of the pair to each other. In this case, when the interlock portions 56B are inserted into the first opening 31bB and an elastic deformation of the elastic portion 52B is partially released, it is possible to positionally align the movable mirror 5B in a direction along the first surface BaB by causing the interlock portions 56B to slide on the inclined surfaces SAB and to abut the reference surface due to an elastic force.

In addition, in the foregoing embodiment, the mirror surface 51aB is positioned on the first surface BaB side of the base BB. However, the movable mirror 5B may be mounted on the base BB in a state where a portion or the entirety of the mirror surface 51aB protrudes to the second surface BbB side of the base BB. In this case, in a part of the mounting region 31B defining the first opening 31bB, a part facing the mirror surface 51aB is cut out to allow the measurement light L0B to pass therethrough. In addition, the elastic portion 52B may be formed to have an annular shape (for example, a circular shape) being separated from the mirror portion 51B and surrounding the mirror portion 51B when viewed in the XB-axis direction. In addition, in the foregoing embodiment, the interlock portions 56B come into contact with the edge portions 31dB of the first opening 31bB on the first surface BaB side on the inclined surface 56aB. However, in addition to this, the interlock portions 56B may come into contact with the edge portions of the first opening 31bB on the second surface BbB side on the inclined surface 56bB.

In addition, in the foregoing embodiment, each of the second openings 31cB does not have to be open on the first surface BaB and may be a recess portion which is open on the second surface BbB, for example. In addition, the first opening 31bB and the second openings 31cB may communicate with each other. For example, a recess portion open on the second surface BbB may be provided between the first opening 31bB and the second opening 31cB, such that the first opening 31bB and the second opening 31cB communicate with each other via the recess portion. In addition, the folded portions 57B need only enter the second openings 31cB and may be separated from the edge portions 31eB of the second openings 31cB on the second surface BbB side.

Figure 25:
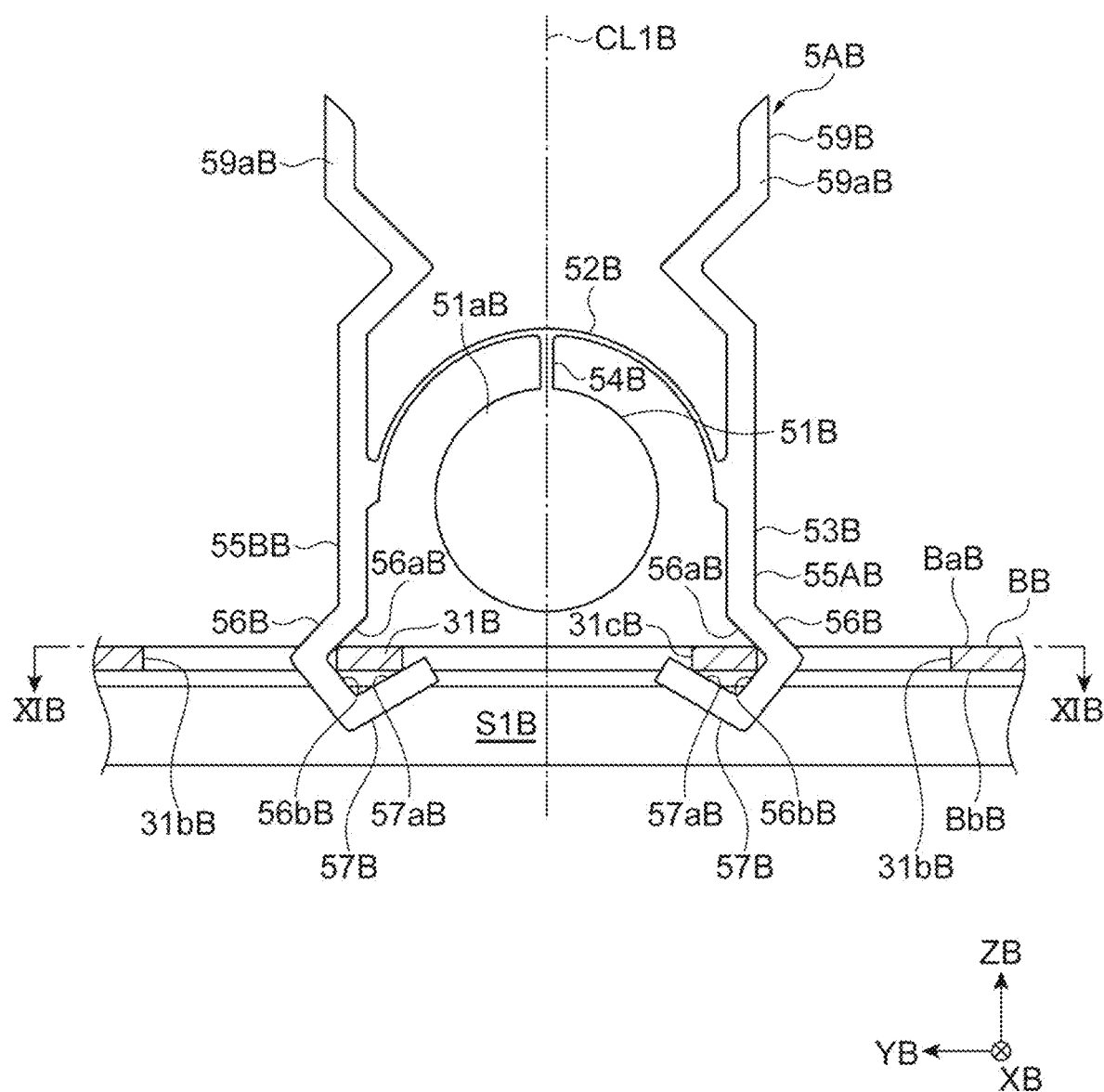
FIG. 25 is a cross-sectional view illustrating a modification example of the movable mirror.
Figure 26:
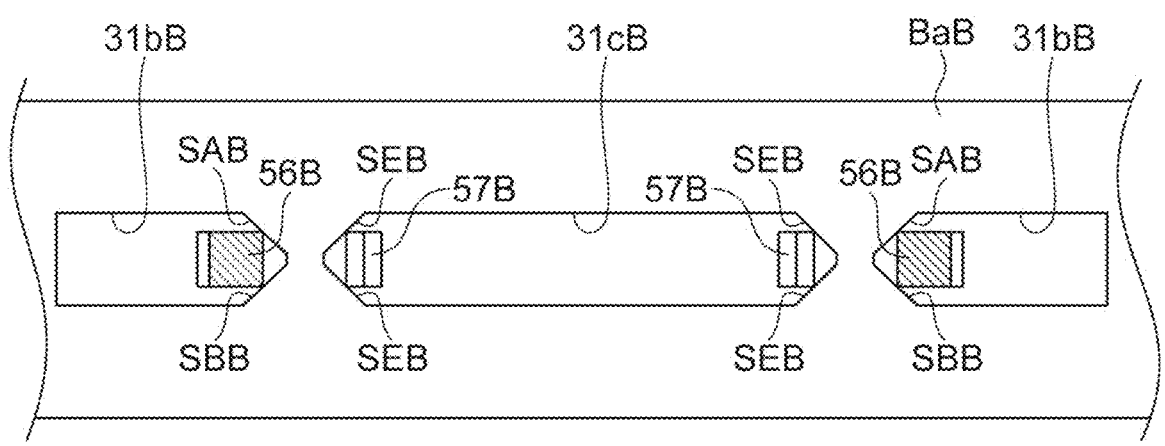
FIG. 26 is a cross-sectional view taken along line XIB-XIB illustrated in FIG. 25.

In addition, a movable mirror 5AB may be constituted as in the modification example illustrated in FIGS. 25 and 26. In the movable mirror 5AB, the leg portion 55AB and the leg portion 55BB of the support portions 53B extend in the ZB-axis direction in a manner parallel to each other. The interlock portions 56B of the pair are formed to be bent outward (away from each other) in a V-shape when viewed in the XB-axis direction. The inclined surface 56aB and the inclined surface 56bB of each of the interlock portions 56B are surfaces (inner surfaces) of the interlock portions 56B of the pair facing each other. The inclined surfaces 56aB are inclined away from each other in the negative ZB-axis direction between the interlock portions 56B of the pair. The inclined surfaces 56bB are inclined toward each other in the negative ZB-axis direction. The folded portions 57B of the pair extend inward (toward each other) and toward a side in the positive ZB-axis direction when viewed in the XB-axis direction. The inclined surfaces 57aB are inclined toward each other in the positive ZB-axis direction between the folded portions 57B of the pair. The connecting portion 54B connects the mirror portion 51B and the elastic portion 52B to each other along the center line CL1B. The center of the mirror portion 51B is positioned along the center line CL1B.

The movable mirror 5AB further has handles 59B. The handles 59B have displacement portions of a pair 59aB which are respectively connected to both the end portions of the elastic portion 52B. The displacement portions 59aB of the pair are provided to face each other in the YB-axis direction and extend in the positive ZB-axis direction from the end portions of the elastic portion 52B. An intermediate portion of each of the displacement portions 59aB is bent inward in a V-shape when viewed in the XB-axis direction. The displacement portions 59aB of the pair are positioned on sides in the positive ZB-axis direction with respect to the mirror portion 51B, the elastic portion 52B, and the support portion 53B in a state where the movable mirror 5AB is mounted in the mounting region 37B. In this modification example, one second opening 31cB is formed in the mounting region 31B, and first openings 31bB of a pair are formed such that the second opening 31cB is sandwiched therebetween in the YB-axis direction. The interlock portions 56B of the pair are respectively inserted into the pair of first openings 31bB in a state where an elastic force of the elastic portion 52B is applied in a direction toward each other.

When the movable mirror 5AB is mounted on the base BB, the interlock portions 56B of the pair are respectively inserted into the pair of first openings 31bB in a state where the distance between the interlock portions 56B of the pair is increased by applying a force to the pair of displacement portions 59aB. For example, after one interlock portion 56B is inserted into the first opening 31bB in advance and is brought into contact with the edge portion of the first opening 31bB, a force is applied to the pair of displacement portions 59aB, and then the other interlock portion 56B is inserted into the first opening 31bB in a state where the other interlock portion 56B is displaced to be away from the one interlock portion 56B. Subsequently, the pair of interlock portions 56B is brought into contact with the inner surfaces of the first openings 31bB and the movable mirror 5AB is fixed to the base BB by releasing a force being applied to the pair of displacement portions 59aB. This modification example is similar to the foregoing embodiment in respect that self-alignment is performed in a three-dimensional manner utilizing an elastic force of the elastic portion 52B, and each of the pair of folded portions 57B enters the second opening 31cB from the second surface BbB side and comes into contact with the edge portion of the second opening 31cB on the second surface BbB side. Even in such a modification example, similar to the foregoing embodiment, it is possible to realize reliable mounting of the movable mirror 5AB. In the foregoing modification example, one second opening 31cB is formed. However, second openings 31cB of a pair may be formed to be sandwiched between the first openings 31bB of the pair.

In addition, in the foregoing embodiment, the fixed mirror 6B is mounted in the device layer 3B. However, the fixed mirror 6B may be mounted in the support layer 2B or the intermediate layer 4B. In addition, in the foregoing embodiment, the beam splitter 7B is mounted in the support layer 2B. However, the beam splitter 7B may be mounted in the device layer 3B or the intermediate layer 4B. In addition, the beam splitter 7B is not limited to a cube-type beam splitter and may be a plate-type beam splitter.

In addition, the optical module 1B may include a light emitting element for generating measurement light to be incident on the light incident unit 8B, in addition to the light incident unit 8B. Alternatively, the optical module 1B may include a light emitting element for generating measurement light to be incident on the interference optical system 10B, in place of the light incident unit 8B. In addition, the optical module 1B may include a light receiving element for detecting measurement light (interference light) emitted from the light emission unit 9B, in addition to the light emission unit 9B. Alternatively, the optical module 1B may include a light receiving element for detecting measurement light (interference light) emitted from the interference optical system 10B, in place of the light emission unit 9B.

In addition, a first penetration electrode which is electrically connected to each of the actuator regions 33B and a second penetration electrode which is electrically connected to each of both the end portions 34aB of each of the elastic support regions 34B may be provided in the support layer 2B and the intermediate layer 4B (in only the support layer 2B when the intermediate layer 4B is not present), and a voltage may be applied to a part between the first penetration electrode and the second penetration electrode. In addition, the actuator for moving the mounting region 31B is not limited to an electrostatic actuator, and a piezoelectric actuator, an electromagnetic actuator, or the like may be adopted, for example. In addition, the optical module 1B is not limited to a module for constituting an FTIR and may be a module for constituting other optical systems.

Moreover, in the foregoing embodiment, a movable mirror and a fixed mirror have been described as examples of optical elements to be mounted on the base BB. In this example, the optical surface is a mirror surface. However, the optical element which becomes a mounting target is not limited to a mirror. For example, an arbitrary element such as a grating, an optical filter, or the like can be adopted. The following are appendixes of the foregoing second embodiment.

[Appendix 1]

An optical module including:

a base; and an optical element which is mounted on the base, in which the base has a first surface and a second surface which face each other, and a first opening which is open on the first surface and the second surface and a second opening which is open on the second surface are provided in the base, the optical element has an optical portion which has an optical surface and a support portion which supports the optical portion on the base, and the support portion includes a protrusion portion which protrudes from the second surface via the first opening and a folded portion which extends from the protrusion portion toward the second surface and enters the second opening from the second surface side.

[Appendix 2]

The optical module according to appendix 1, in which a pair of second openings is provided such that the first opening is sandwiched therebetween, a pair of protrusion portions is provided, and the folded portion is provided in each of the pair of protrusion portions and enters each of the pair of second openings.

[Appendix 3]

The optical module according to appendix 1 or 2, in which the protrusion portion comes into contact with at least an edge portion of the first opening on the first surface side.

[Appendix 4]

The optical module according to any one of appendixes 1 to 3, in which the folded portion comes into contact with an edge portion of the second opening on the second surface side.

[Appendix 5]

The optical module according to any one of appendixes 1 to 4, in which the optical element further has an elastic portion, a pair of protrusion portions is provided, the pair of protrusion portions, in which an elastic force is applied and a distance therebetween is able to be changed in accordance with elastic deformation of the elastic portion, are inserted into the first opening in a state where an elastic force of the elastic portion is applied, and the optical element is supported in the base by a reaction force of the elastic force applied from an inner surface of the first opening to the pair of protrusion portions.

[Appendix 6]

The optical module according to appendix 5, in which the pair of protrusion portions is inserted into the first opening in a state where an elastic force of the elastic portion is applied in a direction away from each other.

[Appendix 7]

The optical module according to appendix 5 or 6, in which the inner surface of the first opening includes a pair of inclined surfaces which is inclined such that a distance therebetween increases from one end toward the other end when viewed in a direction intersecting the first surface, and a facing surface which faces the pair of inclined surfaces in a direction intersecting a direction in which the pair of inclined surfaces faces each other.

[Appendix 8]

The optical module according to appendix 7, in which when viewed in a direction intersecting the first surface, an inclination angle of the pair of inclined surfaces with respect to a straight line passing through the other end of one inclined surface and the other end of the other inclined surface is 45 degrees or smaller.

[Appendix 9]

The optical module according to any one of appendixes 1 to 8, in which the base has a support layer, and a device layer which is provided on the support layer and includes the first surface and the second surface.

[Appendix 10]

The optical module according to appendix 9, in which the base has an intermediate layer which is provided between the support layer and the device layer.

[Appendix 11]

The optical module according to appendix 10, further including:

a fixed mirror which is mounted in the support layer, the device layer, or the intermediate layer; and a beam splitter which is mounted in the support layer, the device layer, or the intermediate layer, in which the optical element is a movable mirror which includes the optical surface serving as a mirror surface, the device layer has a mounting region in which the optical element is mounted and a driving region which is connected to the mounting region, and the movable mirror, the fixed mirror, and the beam splitter are disposed such that an interference optical system is constituted.

[Appendix 12]

The optical module according to appendix 11, in which
the support layer is a first silicon layer of an SOI substrate,
the device layer is a second silicon layer of the SOI substrate, and
the intermediate layer is an insulating layer of the SOI substrate.

[Appendix 13]

The optical module according to appendix 11 or 12, further including:
a light incident unit which is disposed such that measurement light is incident on the interference optical system from outside; and
a light emission unit which is disposed such that the measurement light is emitted from the interference optical system to the outside.

Third Embodiment

Optical modules in which an interference optical system is formed on a silicon-on-insulator (SOI) substrate by a micro electro mechanical systems (MEMS) technology are known (for example, refer to Japanese Unexamined Patent Publication No. 2012-524295). Such optical modules have attracted attention because they can provide users with a Fourier transform infrared spectroscopic analyzer (FTIR) in which highly accurate optical disposition is realized.

Specification of United States Patent Application, Publication No. 2002/0186477 discloses a process of manufacturing an optical system. In this process, first, a template substrate and an optical bench are prepared. An alignment slot is formed in the template substrate through etching. A bond pad is disposed on a main surface of the optical bench. Subsequently, the template substrate is attached to the main surface of the optical bench such that the alignment slot is disposed on the bond pad. Subsequently, an optical element is inserted into the alignment slot while being positionally aligned along a side wall of the alignment slot and is positioned on the bond pad. Then, the optical element is bonded to the optical bench due to a reflow of the bond pad.

The foregoing optical modules have the following problem in respect that the size of a movable mirror depends on a degree of completion of deep cutting with respect to an SOI substrate, for example. That is, since the degree of completion of deep cutting with respect to an SOI substrate is approximately 500 μm at the maximum, there is a limitation in increasing the size of a movable mirror for the sake of improvement of sensitivity of an FTIR. Here, a technology of mounting a separately formed movable mirror in a device layer (for example, a layer of an SOI substrate in which a driving region is formed) may be taken into consideration.

In contrast, in a case where the process disclosed in the specification of United States Patent Application, Publication No. 2002/0186477 is used when the MEMS device disclosed in Japanese Unexamined Patent Publication No. 2012-524295 is prepared, mounting is performed by providing an alignment slot in a movable mounting region which is connected to an actuator and inserting an optical element such as a movable mirror into the alignment slot. However, in such a mounting method, it is difficult to improve the accuracy of mounting an optical element.

An object of still another aspect of the present disclosure is to provide an optical module in which accuracy of mounting an optical element can be improved and mounting strength can be ensured.

According to still another aspect of the present disclosure, there is provided an optical module including an optical element, and a base on which the optical element is mounted. The optical element has an optical portion which has an optical surface, an elastic portion which is provided around the optical portion, and a pair of support portions to which an elastic force is applied and in which a distance therebetween is able to be changed in accordance with elastic deformation of the elastic portion. The base has a main surface, and a mounting region in which an opening communicating with the main surface is provided. The support portion includes an interlock portion which is inserted into the opening in a state where an elastic force of the elastic portion is applied, and a contact portion which comes into contact with the mounting region in a state where the interlock portion is inserted into the opening. The optical element is supported in the mounting region by a reaction force of the elastic force applied from an inner surface of the opening to the interlock portion in a state where the optical surface intersects the main surface and is bonded to the mounting region in the contact portion.

In this optical module, the optical element has the elastic portion, and the pair of support portions in which the distance therebetween is able to be changed in accordance with elastic deformation of the elastic portion. Meanwhile, the opening communicating with the main surface is formed in the mounting region of the base on which the optical element is mounted. Therefore, as an example, when the support portions are inserted into the opening in a state where the elastic portion is elastically deformed such that the distance between the support portions is decreased, and when an elastic deformation of the elastic portion is partially released, the distance between the support portions increases inside the opening, so that the support portions can be brought into contact with the inner surface of the opening. Accordingly, due to a reaction force of an elastic force applied from the inner surface of the opening to the support portions, a position of the optical element with respect to the mounting region is accurately defined on the inner surface of the opening. Moreover, the optical element is bonded to the mounting region in bonding portions of the support portions in a state of being supported due to a reaction force of an elastic force. As a result, according to this optical module, it is possible to improve the accuracy of mounting the optical element and to ensure the mounting strength.

In the optical module according to still another aspect of the present disclosure, the support portion may include a protrusion portion which is bifurcated from the interlock portion and protrudes to the base side. The contact portion may include a distal end portion of the protrusion portion. In this case, the optical element can be bonded in a state where a distal end of the protrusion portion serving as the contact portion abuts the main surface of the base. Particularly, since the main surface can be used for bonding the optical element, it is possible to facilitate processing such as disposing (patterning) of a bonding agent, welding, or the like.

In the optical module according to still another aspect of the present disclosure, the contact portion may include a side surface of the interlock portion facing the inner surface of the opening. In this case, the optical element can be bonded in a state where the side surface of the interlock portion serving as the contact portion is brought into contact with the inner surface of the opening. Particularly, in this case, since bonding is performed between surfaces, it is possible to increase a bonding area and to reliably improve the mounting strength.

In the optical module according to still another aspect of the present disclosure, the base may have a support layer and a device layer which is provided on the support layer and includes the main surface and the mounting region. The opening may penetrate the device layer in a direction intersecting the main surface. The support portion may include the interlock portion which is bent to come into contact with a pair of edge portions of the opening in a direction intersecting the main surface. In this case, the interlock portion is interlocked with the mounting region at a position where the interlock portion comes into contact with the pair of edge portions of the opening. Therefore, it is possible to more reliably mount the optical element on the base and to positionally align the optical element in a direction intersecting the main surface of the base.

In the optical module according to still another aspect of the present disclosure, the inner surface of the opening may include a pair of inclined surfaces which is inclined such that a distance therebetween increases from one end toward the other end when viewed in a direction intersecting the main surface, and a reference surface which extends along a reference line connecting the other end of one inclined surface and the other end of the other inclined surface to each other. In this case, when the support portions are inserted into the opening and an elastic deformation of the elastic portion is partially released, the support portions can slide on the inclined surfaces and can abut the reference surface due to an elastic force. Therefore, it is possible to positionally align the optical element in a direction along the main surface in an automatic manner.

The optical module according to still another aspect of the present disclosure may further include a fixed mirror which is mounted in at least one of the support layer, the device layer, and an intermediate layer which is provided between the support layer and the device layer; and a beam splitter which is mounted in at least one of the support layer, the device layer, and the intermediate layer. The optical element may be a movable mirror which includes the optical surface serving as a mirror surface. The device layer may have a driving region which is connected to the mounting region. The movable mirror, the fixed mirror, and the beam splitter may be disposed such that an interference optical system is constituted. In this case, it is possible to obtain an FTIR having improved sensitivity.

In the optical module according to still another aspect of the present disclosure, the base may have the intermediate layer which is provided between the support layer and the device layer. The support layer may be a first silicon layer of an SOI substrate. The device layer may be a second silicon layer of the SOI substrate. The intermediate layer may be an insulating layer of the SOI substrate. In this case, it is possible to favorably realize a configuration for reliable mounting of the movable mirror with respect to the device layer using the SOI substrate.

The optical module according to still another aspect of the present disclosure may further include a light incident unit which is disposed such that measurement light is incident on the interference optical system from outside, and a light emission unit which is disposed such that the measurement light is emitted from the interference optical system to the outside. In this case, it is possible to obtain an FTIR including a light incident unit and a light emission unit.

According to still another aspect of the present disclosure, it is possible to provide an optical module in which accuracy of mounting an optical element can be improved and mounting strength can be ensured.

Hereinafter, an embodiment of still another aspect of the present disclosure will be described in detail with reference to the drawings. The same reference signs are applied to parts which are the same or corresponding in each of the drawings, and duplicated parts will be omitted.

[Configuration of Optical Module]

Figure 27:
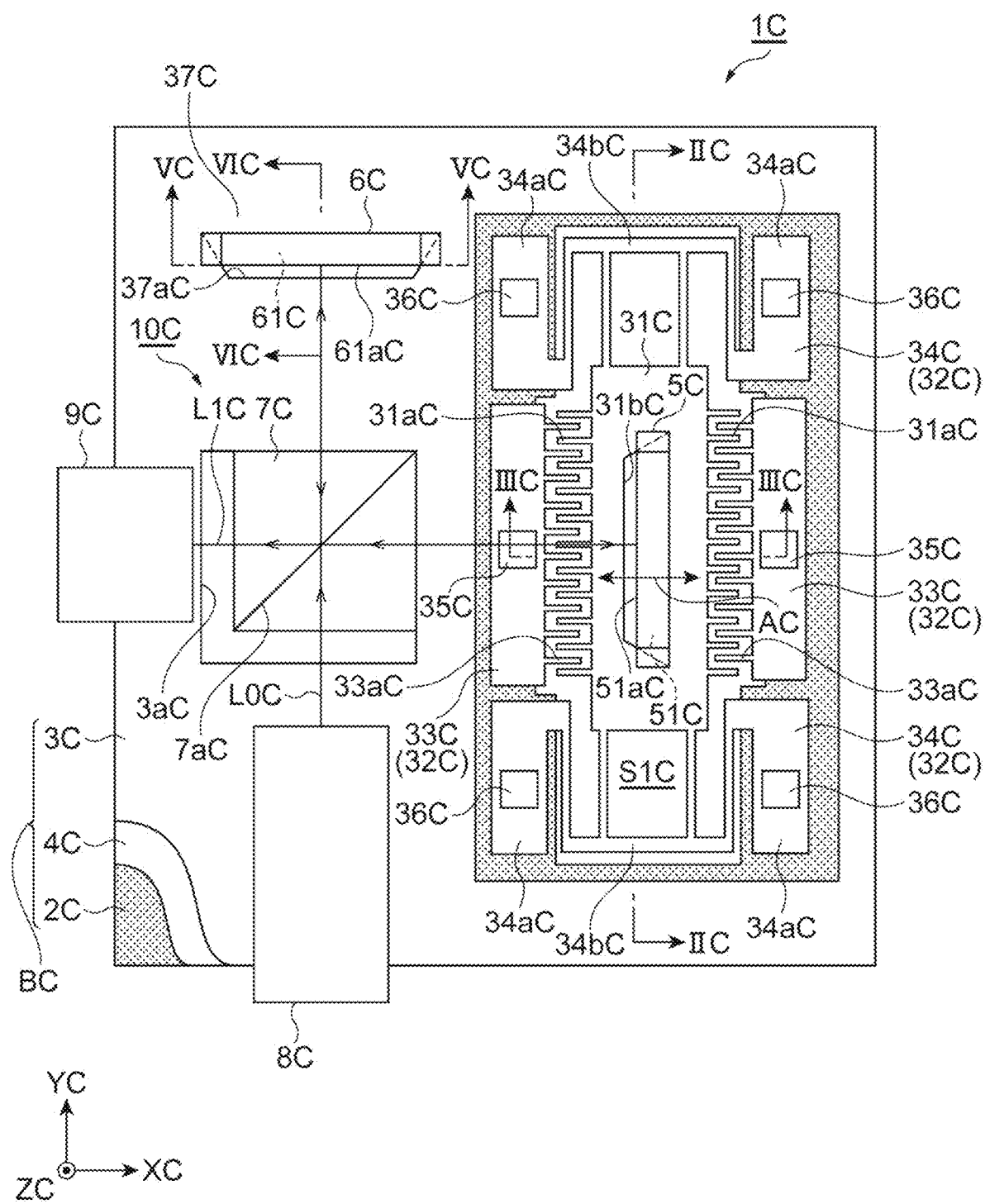
FIG. 27 is a plan view of an optical module of still another embodiment.

As illustrated in FIG. 27, an optical module 1C includes a base BC. The base BC includes a main surface BsC. The base BC includes a support layer 2C, a device layer 3C which is provided on the support layer 2C, and an intermediate layer 4C which is provided between the support layer 2C and the device layer 3C. Here, the main surface BsC is a surface of the device layer 3C on a side opposite to the support layer 2C. The support layer 2C, the device layer 3C, and the intermediate layer 4C are constituted of an SOI substrate. Specifically, the support layer 2C is a first silicon layer of the SOI substrate. The device layer 3C is a second silicon layer of the SOI substrate. The intermediate layer 4C is an insulating layer of the SOI substrate. The support layer 2C, the device layer 3C, and the intermediate layer 4C exhibit a rectangular shape of which one side is approximately 10 mm, for example, when viewed in a ZC-axis direction (direction parallel to a ZC-axis) that is a stacking direction thereof. The thickness of each of the support layer 2C and the device layer 3C is approximately several hundreds of μm, for example. The thickness of the intermediate layer 4C is approximately several μm, for example. FIG. 27 illustrates the device layer 3C and the intermediate layer 4C in a state where one corner portion of the device layer 3C and one corner portion of the intermediate layer 4C are cut out.

The device layer 3C has a mounting region 31C and a driving region 32C which is connected to the mounting region 31C. The driving region 32C includes a pair of actuator regions 33C and a pair of elastic support regions 34C. The mounting region 31C and the driving region 32C (that is, the mounting region 31C, the pair of actuator regions 33C, and the pair of elastic support regions 34C) are integrally formed in a portion of the device layer 3C by a MEMS technology (patterning and etching).

The actuator regions 33C of the pair are disposed on both sides of the mounting region 31C in an XC-axis direction (direction parallel to an XC-axis orthogonal the ZC-axis). That is, the mounting region 31C is sandwiched between the actuator regions 33C of the pair in the XC-axis direction. Each of the actuator regions 33C is fixed to the support layer 2C with the intermediate layer 4C interposed therebetween. A first comb-teeth portion 33aC is provided on a side surface of each of the actuator regions 33C on the mounting region 31C side. Each of the first comb-teeth portions 33aC is in a state of being floated with respect to the support layer 2C by removing the intermediate layer 4C immediately below thereof. A first electrode 35C is provided in each of the actuator regions 33C.

The elastic support regions 34C of the pair are disposed on both sides of the mounting region 31C in a YC-axis direction (direction parallel to a YC-axis orthogonal to the ZC-axis and the XC-axis). That is, the mounting region 31C is sandwiched between the elastic support regions 34C of the pair in the YC-axis direction. Both end portions 34aC of each of the elastic support regions 34C are fixed to the support layer 2C with the intermediate layer 4C interposed therebetween. An elastic deformation portion 34bC (part between both the end portions 34aC) of each of the elastic support regions 34C has a structure in which a plurality of leaf springs are connected. The elastic deformation portion 34bC of each of the elastic support regions 34C is in a state of being floated with respect to the support layer 2C by removing the intermediate layer 4C immediately below thereof. A second electrode 36C is provided in each of both the end portions 34aC in each of the elastic support regions 34C.

The elastic deformation portion 34bC of each of the elastic support regions 34C is connected to the mounting region 31C. The mounting region 31C is in a state of being floated with respect to the support layer 2C by removing the intermediate layer 4C immediately below thereof. That is, the mounting region 31C is supported by the pair of elastic support regions 34C. Second comb-teeth portions 31aC are provided on side surfaces of the mounting region 31C on the actuator region 33C side. Each of the second comb-teeth portions 31aC is in a state of being floated with respect to the support layer 2C after the intermediate layer 4C immediately below thereof. In the first comb-teeth portions 33aC and the second comb-teeth portions 31aC facing each other, each comb tooth of the first comb-teeth portions 33aC is positioned between comb teeth of the second comb-teeth portions 31aC.

The elastic support regions 34C of the pair sandwich the mounting region 31C from both sides when viewed in a direction AC parallel to the XC-axis. When the mounting region 31C moves in the direction AC, the pair of elastic support regions 34C causes an elastic force to act on the mounting region 31C such that the mounting region 31C returns to the initial position. Therefore, when a voltage is applied to a part between the first electrode 35C and the second electrode 36C such that an electrostatic attraction acts between the first comb-teeth portions 33aC and the second comb-teeth portions 31aC facing each other, the mounting region 31C moves in the direction AC to a position where the electrostatic attraction and the elastic force of the pair of elastic support regions 34C are balanced. In this manner, the driving region 32C functions as an electrostatic actuator.

The optical module 1C further includes a movable mirror 5C, a fixed mirror 6C, a beam splitter 7C, a light incident unit 8C, and a light emission unit 9C. The movable mirror 5C, the fixed mirror 6C, and the beam splitter 7C are disposed on the device layer 3C such that an interference optical system 10C (Michelson interference optical system) is constituted.

The movable mirror 5C is mounted in the mounting region 31C of the device layer 3C on one side of the beam splitter 7C in the XC-axis direction. A mirror surface 51aC of a mirror portion 51C included in the movable mirror 5C is positioned on a side opposite to the support layer 2C with respect to the device layer 3C. For example, the mirror surface 51aC is a surface perpendicular to the XC-axis direction (that is, a surface perpendicular to the direction AC) and is directed to the beam splitter 7C side.

The fixed mirror 6C is mounted in a mounting region 37C of the device layer 3C on one side of the beam splitter 7C in the YC-axis direction. A mirror surface 61aC of a mirror portion 61C included in the fixed mirror 6C is positioned on a side opposite to the support layer 2C with respect to the device layer 3C. For example, the mirror surface 61aC is a surface perpendicular to the YC-axis direction and is directed to the beam splitter 7C side.

The light incident unit 8C is mounted in the device layer 3C on the other side of the beam splitter 7C in the YC-axis direction. For example, the light incident unit 8C is constituted of optical fibers, a collimating lens, and the like. The light incident unit 8C is disposed such that measurement light is incident on the interference optical system 10C from outside.

The light emission unit 9C is mounted in the device layer 3C on the other side of the beam splitter 7C in the XC-axis direction. For example, the light emission unit 9C is constituted of optical fibers, a collimating lens, and the like. The light emission unit 9C is disposed such that measurement light (interference light) is emitted from the interference optical system 10C to the outside.

The beam splitter 7C is a cube-type beam splitter having an optical functional surface 7aC. The optical functional surface 7aC is positioned on a side opposite to the support layer 2C with respect to the device layer 3C. The beam splitter 7C is positionally aligned when one corner portion of the beam splitter 7C on a bottom surface side is brought into contact with one corner of a rectangular opening 3aC formed in the device layer 3C. The beam splitter 7C is mounted in the support layer 2C by being fixed to the support layer 2C through bonding or the like in a positionally aligned state.

In the optical module 1C having a configuration described above, when measurement light L0C is incident on the interference optical system 10C from outside via the light incident unit 8C, a portion of the measurement light L0C is reflected by the optical functional surface 7aC of the beam splitter 7C and travels toward the movable mirror 5C, and the remaining portion of the measurement light L0C is transmitted through the optical functional surface 7aC of the beam splitter 7C and travels toward the fixed mirror 6C. A portion of the measurement light L0C is reflected by the mirror surface 51aC of the movable mirror 5C, travels toward the beam splitter 7C along the same optical path, and is transmitted through the optical functional surface 7aC of the beam splitter 7C. The remaining portion of the measurement light L0C is reflected by the mirror surface 61aC of the fixed mirror 6C, travels toward the beam splitter 7C along the same optical path, and is reflected by the optical functional surface 7aC of the beam splitter 7C. A portion of the measurement light L0C which has been transmitted through the optical functional surface 7aC of the beam splitter 7C, and the remaining portion of the measurement light L0C which has been reflected by the optical functional surface 7aC of the beam splitter 7C become measurement light L1C (interference light). The measurement light L1C is emitted from the interference optical system 10C to the outside via the light emission unit 9C. According to the optical module 1C, since the movable mirror 5C can reciprocate in the direction AC at a high speed, it is possible to provide a small-sized FTIR having high accuracy.

[Movable Mirror and Surrounding Structure Thereof]

Figure 28:
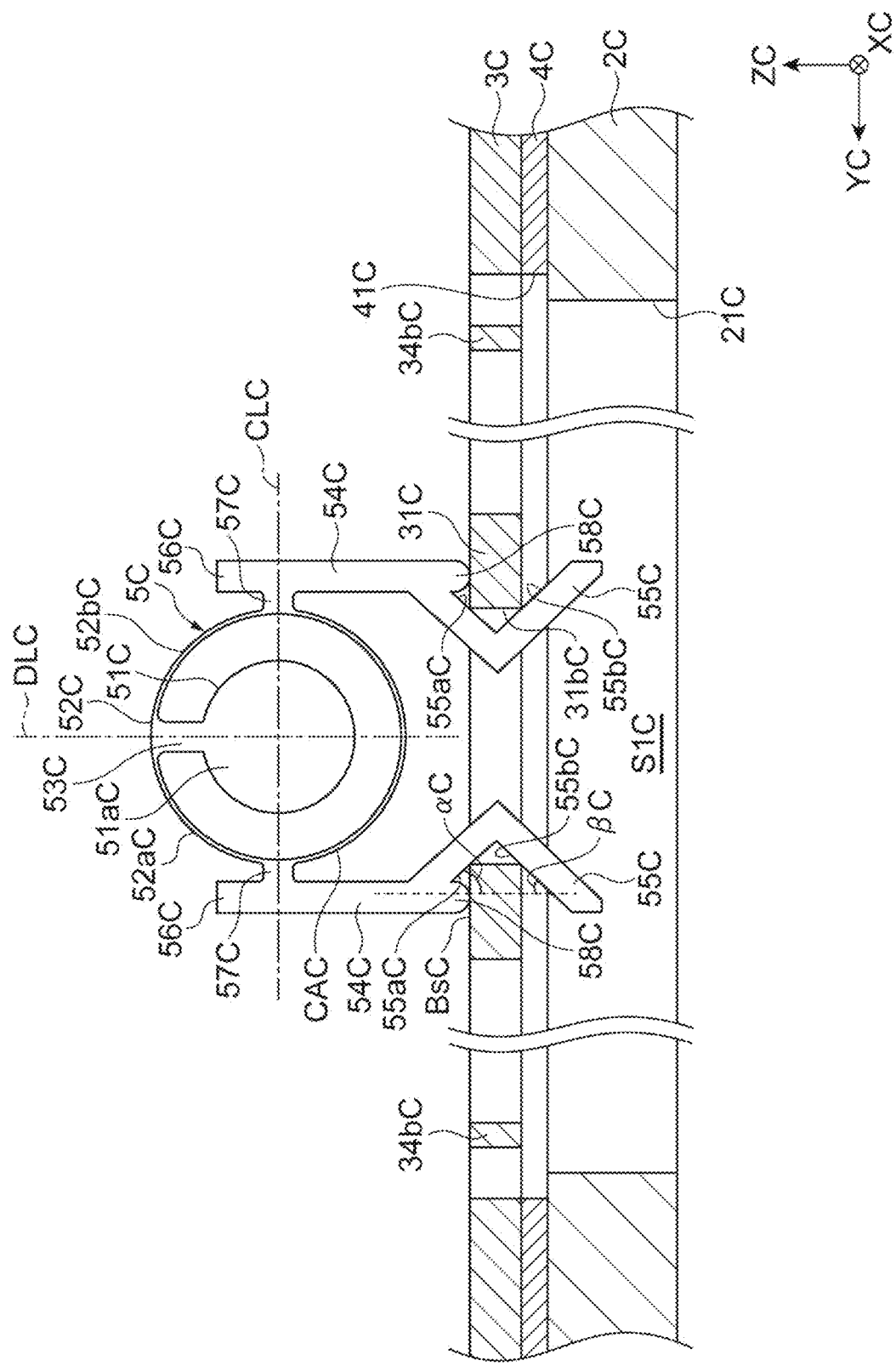
FIG. 28 is a cross-sectional view taken along line IIC-IIC illustrated in FIG. 27.
Figure 29:
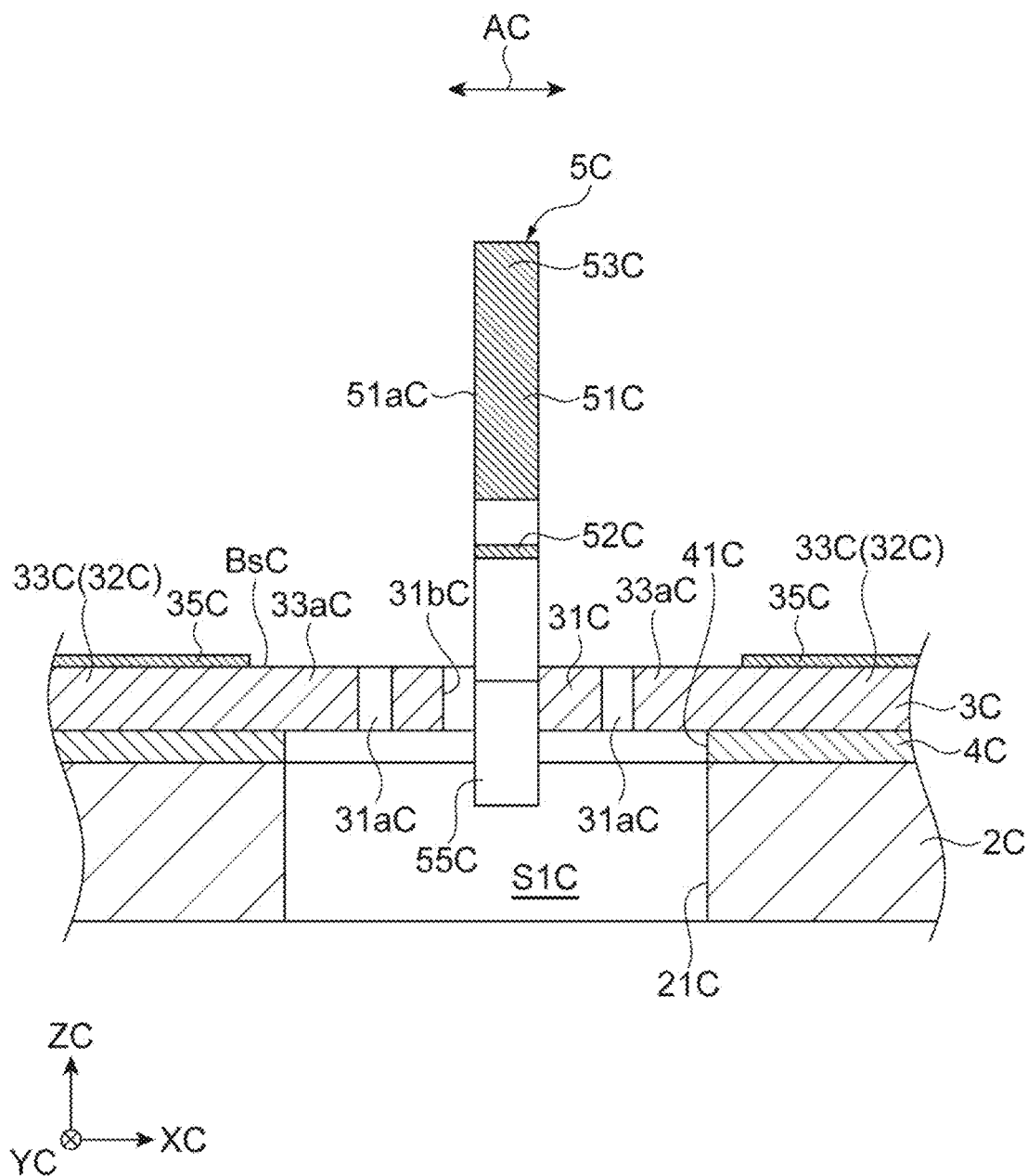
FIG. 29 is a cross-sectional view taken along line IIIC-IIIC illustrated in FIG. 27.
Figure 30:
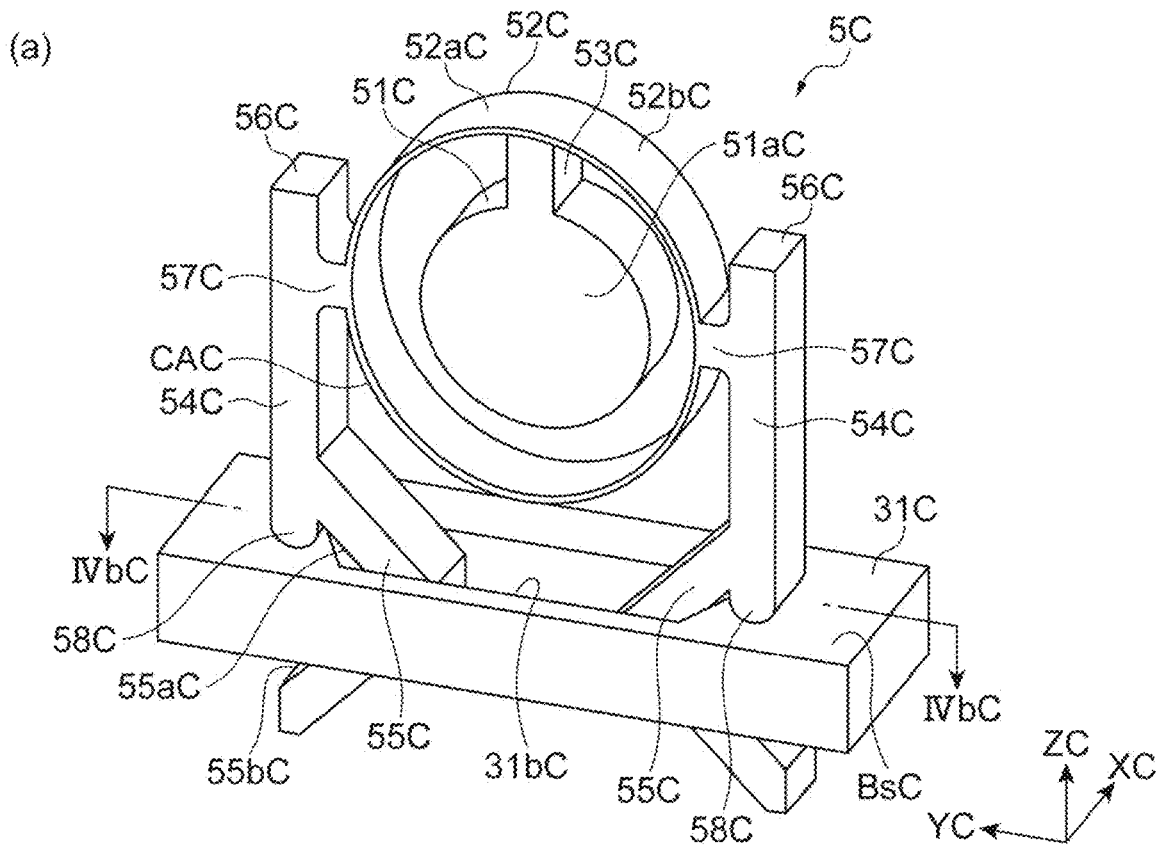
FIG. 30(a) is a perspective view of a surrounding structure of a movable mirror illustrated in FIG. 27.
FIG. 30(b) is a cross-sectional view taken along line IVbC-IVbC illustrated in FIG. 30(a).
Figure 30:
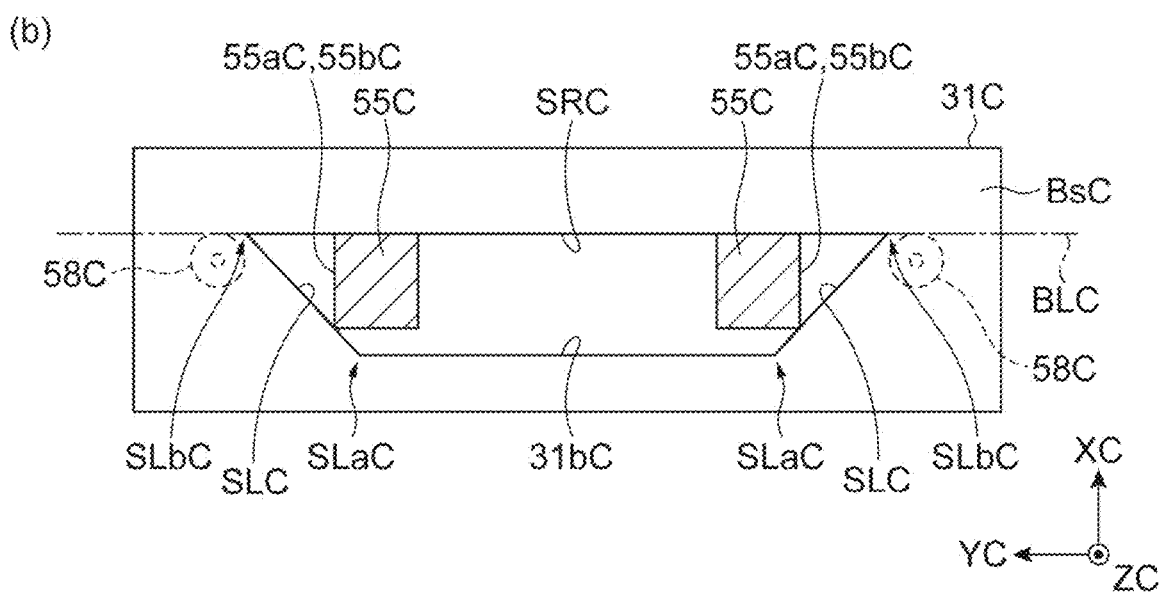

As illustrated in FIGS. 28, 29, and 30, the movable mirror (optical element) 5C has the mirror portion (optical portion) 51C which has the mirror surface (optical surface) 51aC, an annular elastic portion 52C, a connecting portion 53C which connects the mirror portion 51C and the elastic portion 52C to each other, a pair of support portions 56C, and a pair of connecting portions 57C which connects the support portions 56C and the elastic portion 52C to each other. The mirror portion 51C is formed to have a disk shape. The mirror surface 51aC is a circular plate surface of the mirror portion 51C. The movable mirror 5C is mounted on the base BC in a state where the mirror surface 51aC intersects (for example, is orthogonal to) the main surface BsC.

The elastic portion 52C is formed to have a circular shape being separated from the mirror portion 51C and surrounding the mirror portion 51C when viewed in a direction (XC-axis direction) intersecting the mirror surface 51aC. That is, the elastic portion 52C is provided around the mirror portion 51C and forms an annular region CAC having a circular shape. The connecting portion 53C connects the mirror portion 51C and the elastic portion 52C to each other at the center of the mirror portion 51C in a direction along the main surface BsC (YC-axis direction). Here, a single connecting portion 53C is provided. The connecting portion 53C is provided at a position on a side opposite to the main surface BsC of the base BC along a center line DLC passing through the center of the mirror portion 51C in the YC-axis direction and with respect to the center of the mirror portion 51C in the ZC-axis direction. The center line DLC is an imaginary straight line extending in the ZC-axis direction.

The elastic portion 52C is formed to have a circular plate shape by a semicircular leaf spring 52aC and a semicircular leaf spring 52bC which continues to the leaf spring 52aC. The leaf spring 52aC and the leaf spring 52bC are symmetrically constituted with respect to the center line DLC. The spring constant of the leaf spring 52aC and the spring constant of the leaf spring 52bC are equal to each other. Here, the elastic portion 52C in its entirety is line symmetrical and has an equal spring constant with respect to the center line DLC.

The support portions 56C have a rod shape with a rectangular cross section and are provided such that the mirror portion 51C and the elastic portion 52C are sandwiched therebetween in the YC-axis direction. The support portions 56C are connected to the elastic portion 52C through the connecting portions 57C. The connecting portions 57C are disposed along a center line CLC passing through the center of the mirror portion 51C in the ZC-axis direction. The center line CLC is an imaginary straight line intersecting (orthogonal to) the center line DLC at the center of the mirror portion 51C and extending in the YC-axis direction. Therefore, when a force is applied to the support portions 56C such that the support portions 56C are sandwiched from both sides in the YC-axis direction at positions corresponding to the connecting portions 57C, for example, the elastic portion 52C can be elastically deformed to be compressed in the YC-axis direction. That is, the distance between the support portions 56C in the YC-axis direction can be changed in accordance with elastic deformation of the elastic portion 52C. In addition, an elastic force of the elastic portion 52C can be applied to the support portions 56C.

The support portion 56C includes a leg portion 54C. The leg portion 54C linearly extends to one side (here, the main surface BsC side) of the mirror surface 51aC over the mirror surface 51aC from the connecting portion 57C in the ZC-axis direction. A distal end of the leg portion 54C serves as a contact portion 58C which comes into contact with the main surface BsC (that is, the mounting region 31C). For example, an end surface of the contact portion 58C may be flat. However, here, it has a curved surface shape (hemispherical surface shape).

The support portion 56C further includes an interlock portion 55C. The interlock portion 55C extends while being bifurcated from a middle part of the leg portion 54C on the distal end side. Therefore, the support portion 56C includes a protrusion portion (leg portion 54C) which is bifurcated from the interlock portion 55C and protrudes to the base BC side, and the contact portion 58C includes a distal end portion of the protrusion portion. The interlock portions 55C are bent in a V-shape projected toward each other between the support portions 56C of the pair. The interlock portion 55C includes an inclined surface 55aC and an inclined surface 55bC. The inclined surface 55aC and the inclined surface 55bC are surfaces (outer surfaces) of the interlock portions 55C of the pair on sides opposite to surfaces facing each other.

The inclined surfaces 55aC are inclined toward each other in a direction (negative ZC-axis direction) away from the connecting portions 57C between the interlock portions 55C of the pair. The inclined surfaces 55bC are inclined away from each other in the negative ZC-axis direction. When viewed in the XC-axis direction, the absolute value for an inclination angle αC of the inclined surface 55aC with respect to the ZC-axis is smaller than 90°. Similarly, the absolute value for an inclination angle βC of the inclined surface 55bC is smaller than 90°. Here, as an example, the absolute value for the inclination angle αC and the absolute value for the inclination angle βC are equal to each other.

Here, an opening 31bC is formed in the mounting region 31C. Here, the opening 31bC extends in the ZC-axis direction and penetrates the device layer 3C. Therefore, the opening 31bC communicates with (reaches) the main surface BsC and a surface of the device layer 3C on a side opposite to the main surface BsC. The opening 31bC exhibits a pillar shape in which a shape when viewed in the ZC-axis direction is a trapezoidal shape (refer to FIG. 30). The opening 31bC will be described below in detail.

The support portions 56C are inserted into this opening 31bC in a state where an elastic force of the elastic portion 52C is applied. In other words, the support portions 56C (that is, the movable mirror 5C) penetrate the mounting region 31C via the opening 31bC. More specifically, a portion of the interlock portion 55C of the support portion 56C is positioned inside the opening 31bC. In this state, the interlock portions 55C come into contact with a pair of edge portions (an edge portion on the main surface BsC side and an edge portion on a side opposite to the main surface BsC) of the opening 31bC in the ZC-axis direction.

Here, the inclined surfaces 55aC come into contact with the edge portions of the opening 31bC on the main surface BsC side, and the inclined surfaces 55bC come into contact with the edge portions of the opening 31bC on a side opposite to the main surface BsC. Accordingly, the interlock portions 55C are interlocked with the mounting region 31C such that the mounting region 31C is sandwiched therebetween in the ZC-axis direction. As a result, detachment of the movable mirror 5C from the base BC in the ZC-axis direction is curbed.

At this time, the contact portions 58C come into contact with the main surface BsC (that is, the mounting region 31C). That is, the contact portions 58C come into contact with the mounting region 31C (here, the main surface BsC) in a state where the interlock portions 55C are interlocked such that the mounting region 31C is sandwiched therebetween. Then, the contact portions 58C are bonded to the mounting region 31C. Here, as an example, the contact portions 58C come into contact with the main surface BsC with a resin bonding layer interposed therebetween, for example, and are bonded thereto. However, for example, the contact portions 58C may be bonded through melting of a metal layer, bonding using a glass bonding agent or irradiation of laser light, or the like.

Here, an opening 41C is formed in the intermediate layer 4C. The opening 41C is open on both sides of the intermediate layer 4C in the ZC-axis direction. An opening 21C is formed in the support layer 2C. The opening 21C is open on both sides of the support layer 2C in the ZC-axis direction. In the optical module 1C, a continuous space S1C is constituted of a region inside the opening 41C of the intermediate layer 4C and a region inside the opening 21C of the support layer 2C. That is, the space S1C includes a region inside the opening 41C of the intermediate layer 4C and a region inside the opening 21C of the support layer 2C.

The space S1C is formed between the support layer 2C and the device layer 3C and corresponds to at least the mounting region 31C and the driving region 32C. Specifically, a region inside the opening 41C of the intermediate layer 4C and a region inside the opening 21C of the support layer 2C include a range in which the mounting region 31C moves when viewed in the ZC-axis direction. A region inside the opening 41C of the intermediate layer 4C forms a clearance for causing a part (that is, a part to be in a detached state with respect to the support layer 2C, for example, the mounting region 31C in its entirety, the elastic deformation portion 34bC of each of the elastic support regions 34C, the first comb-teeth portions 33aC, and the second comb-teeth portions 31aC) of the mounting region 31C and the driving region 32C, which needs to be separated from the support layer 2C, to be separated from the support layer 2C.

A portion of each of the interlock portions 55C included in the movable mirror 5C is positioned in the space S1C. Specifically, a portion of each of the interlock portions 55C is positioned in a region inside the opening 21C of the support layer 2C through a region inside the opening 41C of the intermediate layer 4C. A portion of each of the interlock portions 55C protrudes into the space S1C from a surface of the device layer 3C on the intermediate layer 4C side by approximately 100 μm, for example. As described above, since a region inside the opening 41C of the intermediate layer 4C and a region inside the opening 21C of the support layer 2C include the range in which the mounting region 31C moves when viewed in the ZC-axis direction, a portion of each of the interlock portions 55C of the movable mirror 5C positioned in the space S1C does not come into contact with the intermediate layer 4C and the support layer 2C when the mounting region 31C reciprocates in the direction AC.

Here, as illustrated in FIG. 30, an inner surface of the opening 31bC includes a pair of inclined surfaces SLC and a reference surface SRC. The inclined surface SLC includes one end SLaC and the other end SLbC. The one end SLaC and the other end SLbC are both end portions of the inclined surface SLC when viewed in the ZC-axis direction. The inclined surfaces SLC of the pair are inclined such that the distance therebetween increases from the one end SLaC toward the other end SLbC (for example, with respect to the XC-axis). When viewed in the ZC-axis direction, the reference surface SRC extends along a reference line BLC connecting the other end SLbC of one inclined surface SLC and the other end SLbC of the other inclined surface SLC to each other. Here, the reference surface SRC simply connects the other ends SLbC to each other. As described above, the shape of the opening 31bC when viewed in the ZC-axis direction is a trapezoidal shape. Therefore, here, the inclined surfaces SLC correspond to legs of the trapezoidal shape, and the reference surface SRC corresponds to a bottom base of the trapezoidal shape.

Here, the opening 31bC is a single space. The minimum value for the size (that is, the gap between the one ends SLaC of the inclined surfaces SLC) of the opening 31bC in the YC-axis direction is a value allowing the pair of interlock portions 55C to be collectively disposed inside the opening 31bC when the elastic portion 52C is elastically deformed to be compressed in the YC-axis direction. Meanwhile, the maximum value for the size (that is, the gap between the other ends SLbC of the inclined surfaces SLC) of the opening 31bC in the YC-axis direction is a value allowing only a portion of elastic deformation of the elastic portion 52C to be released (that is, the elastic portion 52C does not reach the natural length) when the pair of interlock portions 55C is disposed in the opening 31bC.

Therefore, when the pair of interlock portions 55C is disposed inside the opening 31bC, the interlock portions 55C press the inner surface of the opening 31bC due to an elastic force of the elastic portion 52C, and a reaction force from the inner surface of the opening 31bC is applied to the interlock portions 55C (support portions 56C). Accordingly, in a state where the mirror surface 51aC intersects (for example, is orthogonal to) the main surface BsC, the movable mirror 5C is supported in the mounting region 31C by a reaction force of an elastic force applied from the inner surface of the opening 31bC to the support portions 56C. In this state, as described above, the contact portions 58C come into contact with the main surface BsC (mounting region 31C) and are bonded thereto. Therefore, in a state where the mirror surface 51aC intersects the main surface BsC, the movable mirror 5C is supported in the mounting region 31C by a reaction force of an elastic force applied from the inner surface of the opening 31bC to the interlock portions 55C and is bonded to the mounting region 31C at the contact portions 58C.

Particularly, the interlock portions 55C are brought into contact with the inclined surfaces SLC of the opening 31bC. Therefore, the interlock portions 55C slide on the inclined surfaces SLC toward the reference surface SRC due to a component of a reaction force from the inclined surfaces SLC in the XC-axis direction and abut the reference surface SRC while being in contact with the inclined surfaces SLC. Accordingly, the interlock portions 55C come into internal contact with the corner portions defined by the inclined surfaces SLC and the reference surface SRC and are positionally aligned (self-aligned due to an elastic force) in both the XC-axis direction and the YC-axis direction. Here, since the interlock portions 55C have a quadrangular cross-sectional shape, the inclined surfaces SLC come into point contact with the interlock portions 55C and the reference surface SRC comes into line contact with the interlock portions 55C when viewed in the ZC-axis direction. That is, here, the inner surface of the opening 31bC comes into contact with the pair of interlock portions 55C at two points and along two lines when viewed in the ZC-axis direction.

Meanwhile, as illustrated in FIG. 28, when viewed in the XC-axis direction, a reaction force of an elastic force is also applied to the interlock portions 55C from the inner surface of the opening 31bC at the edge portions of the opening 31bC. When the movable mirror 5C is mounted, there are cases where a reaction force is applied to either the inclined surfaces 55aC or the inclined surfaces 55bC of the interlock portions 55C. In these cases, either the inclined surfaces 55aC or the inclined surfaces 55bC slide on the edge portions due to a component of a reaction force along the inclined surfaces 55aC or the inclined surfaces 55bC and move in the ZC-axis direction to reach positions (that is, positions where the mounting region 31C is sandwiched therebetween in the ZC-axis direction) where both the inclined surfaces 55aC and the inclined surfaces 55bC come into contact with the edge portions. Accordingly, the interlock portions 55C are interlocked at the positions, and the movable mirror 5C is positionally aligned (self-aligned due to an elastic force) in the ZC-axis direction. That is, the movable mirror 5C is self-aligned in a three-dimensional manner utilizing an elastic force of the elastic portion 52C. Here, the inclined surfaces 55bC and the contact portions 58C face each other in the ZC-axis direction. Therefore, the inclined surfaces 55aC may be configured to be self-aligned without coming into contact with the edge portions of the opening 31bC, such that the edge portions of the opening 31bC are sandwiched therebetween by the contact portions 58C and the inclined surfaces 55bC.

The movable mirror 5C described above is integrally formed by a MEMS technology (patterning and etching), for example. Therefore, the thickness (size in a direction intersecting the mirror surface 51aC) of the movable mirror 5C is uniform in each portion. For example, the thickness thereof is approximately 320 μm. In addition, the diameter of the mirror surface 51aC is approximately 1 mm, for example. Moreover, the gap between a surface (inner surface) of the elastic portion 52C on the mirror portion 51C side and a surface (outer surface) of the mirror portion 51C on the elastic portion 52C side is approximately 200 μm, for example. The thickness of the elastic portion 52C (thickness of the leaf spring) is within a range of approximately 10 μm to 20 μm, for example.

[Fixed Mirror and Surrounding Structure Thereof]

Figure 31:
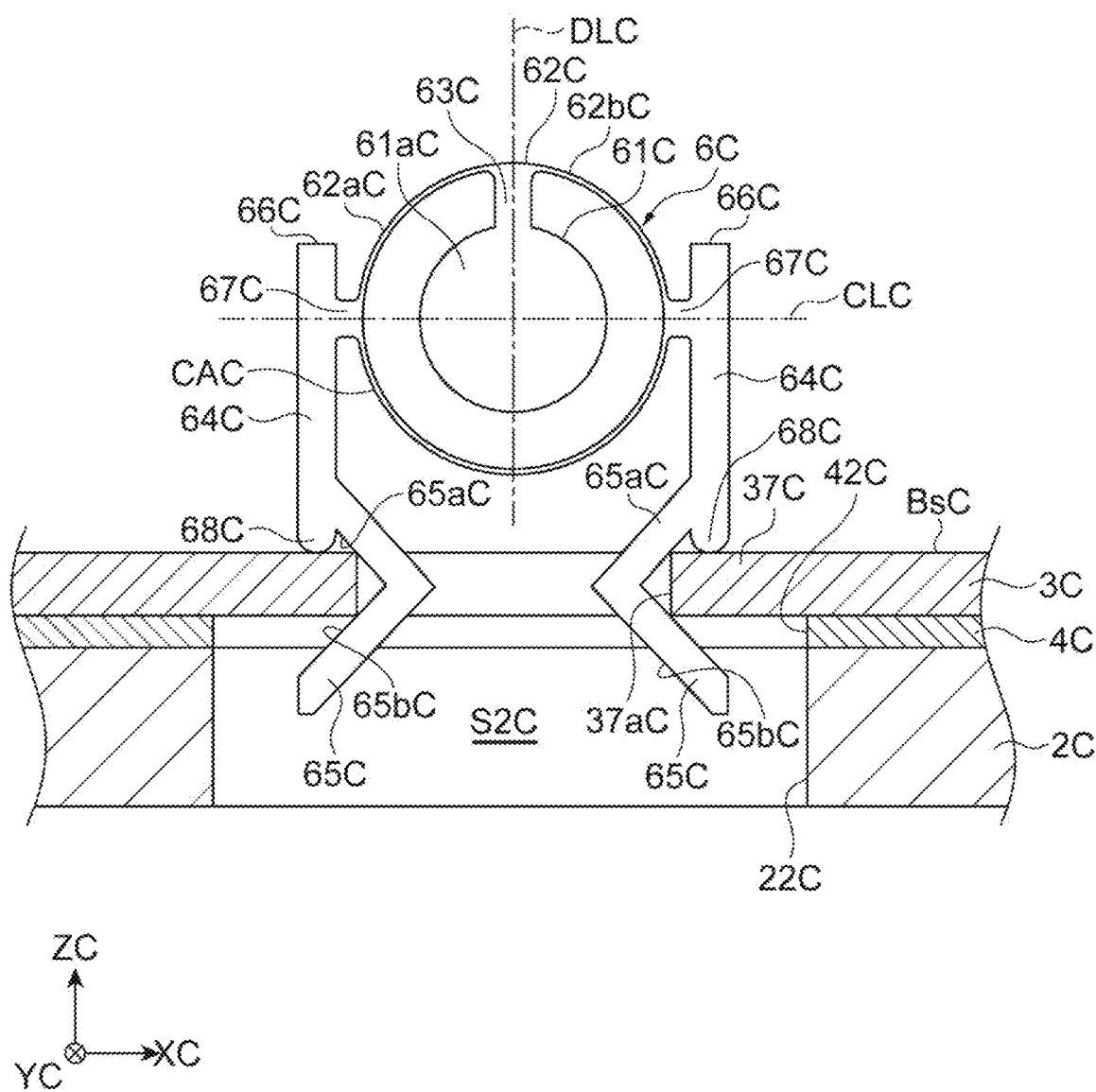
FIG. 31 is a cross-sectional view taken along line VC-VC illustrated in FIG. 27.
Figure 32:
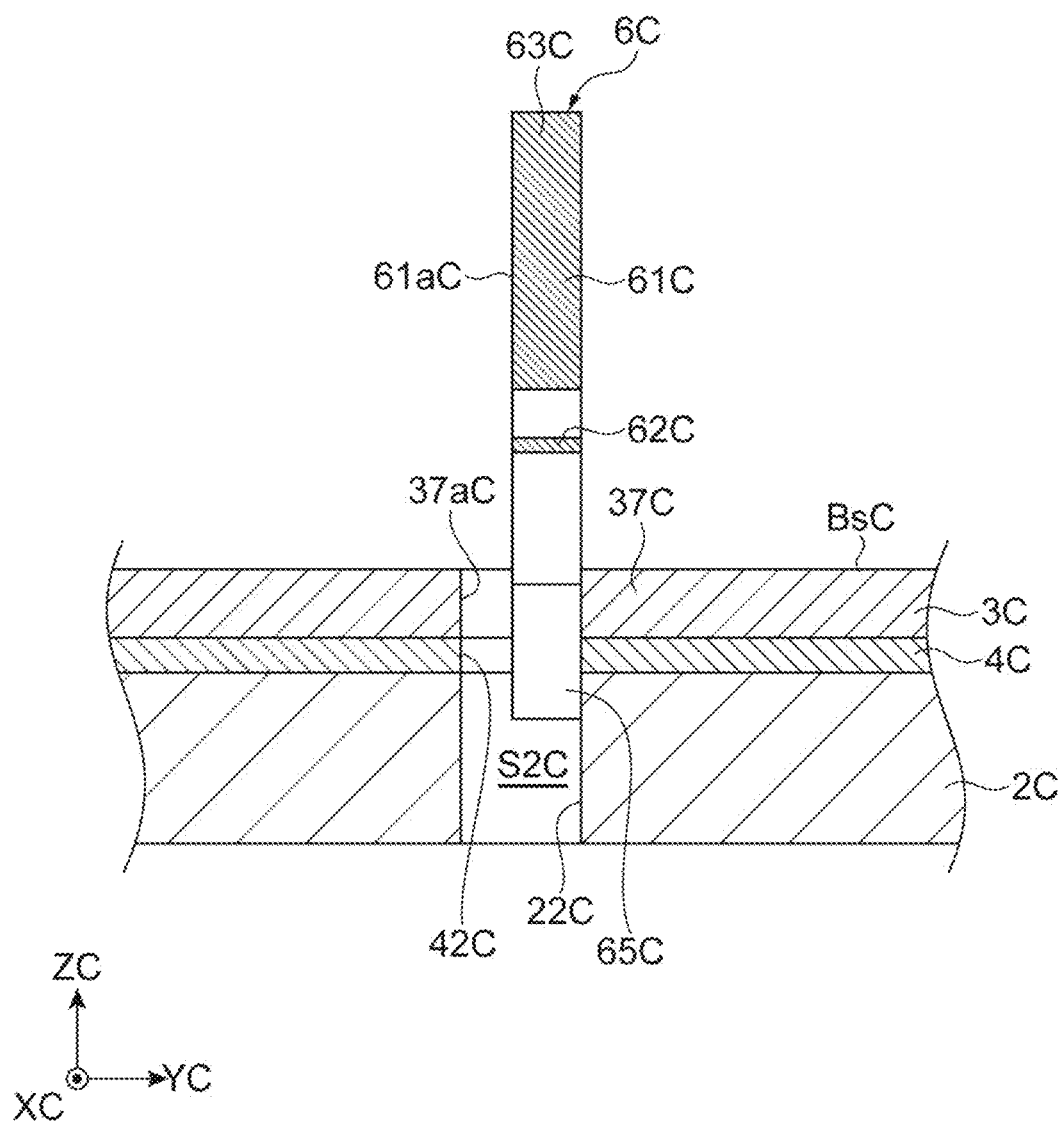
FIG. 32 is a cross-sectional view taken along line VIC-VIC illustrated in FIG. 27.

The fixed mirror 6C and the surrounding structure thereof are similar to the foregoing movable mirror 5C and the surrounding structure thereof, except that the mounting region is not movable. That is, as illustrated in FIGS. 31 and 32, the fixed mirror (optical element) 6C has the mirror portion (optical portion) 61C which has the mirror surface (optical surface) 61aC, an annular elastic portion 62C, a connecting portion 63C which connects the mirror portion 61C and the elastic portion 62C to each other, a pair of support portions 66C, and a pair of connecting portions 67C which connects the support portions 66C and the elastic portion 62C to each other. The mirror portion 61C is formed to have a disk shape. The mirror surface 61aC is a circular plate surface of the mirror portion 61C. The fixed mirror 6C is mounted on the base BC in a state where the mirror surface 61aC intersects (for example, is orthogonal to) the main surface BsC of the base BC.

The elastic portion 62C is formed to have a circular shape being separated from the mirror portion 61C and surrounding the mirror portion 61C when viewed in a direction (YC-axis direction) intersecting the mirror surface 61aC. Therefore, the elastic portion 62C is provided around the mirror portion 61C and forms the annular region CAC having a circular shape. The connecting portion 63C connects the mirror portion 61C and the elastic portion 62C to each other at the center of the mirror portion 61C in a direction along the main surface BsC (XC-axis direction). Here, a single connecting portion 63C is provided. The connecting portion 63C is provided at a position on a side opposite to the main surface BsC of the base BC along the center line DLC passing through the center of the mirror portion 61C in the XC-axis direction and with respect to the center of the mirror portion 61C in the ZC-axis direction. The center line DLC is an imaginary straight line extending in the ZC-axis direction.

The elastic portion 62C is formed to have a circular plate shape by a semicircular leaf spring 62aC and a semicircular leaf spring 62bC which continues to the leaf spring 62aC. The leaf spring 62aC and the leaf spring 62bC are symmetrically constituted with respect to the center line DLC. The spring constant of the leaf spring 62aC and the spring constant of the leaf spring 62bC are equal to each other.

Here, the elastic portion 62C in its entirety is line symmetrical and has an equal spring constant with respect to the center line DLC.

The support portions 66C have a rod shape with a rectangular cross section and are provided such that the mirror portion 61C and the elastic portion 62C are sandwiched therebetween in the XC-axis direction. The support portions 66C are connected to the elastic portion 62C through the connecting portions 67C. The connecting portions 67C are disposed along the center line CLC passing through the center of the mirror portion 61C in the ZC-axis direction. The center line CLC is an imaginary straight line intersecting (orthogonal to) the center line DLC at the center of the mirror portion 61C and extending in the XC-axis direction. Therefore, when a force is applied to the support portions 66C such that the support portions 66C are sandwiched from both sides in the XC-axis direction at positions corresponding to the connecting portions 67C, for example, the elastic portion 62C can be elastically deformed to be compressed in the XC-axis direction. That is, the distance between the support portions 66C in the XC-axis direction can be changed in accordance with elastic deformation of the elastic portion 62C. In addition, an elastic force of the elastic portion 62C can be applied to the support portions 66C.

The support portion 66C includes a leg portion 64C. The leg portion 64C linearly extends to one side (here, the main surface BsC side) of the mirror surface 61aC over the mirror surface 61aC from the connecting portion 67C in the ZC-axis direction. A distal end of the leg portion 64C serves as a contact portion 68C which comes into contact with the main surface BsC (that is, the mounting region 37C). For example, an end surface of the contact portion 68C may be flat. However, here, it has a curved surface shape (hemispherical surface shape).

The support portion 66C further includes an interlock portion 65C. The interlock portion 65C extends while being bifurcated from a middle part of the leg portion 64C on the distal end side. Therefore, the support portion 66C includes a protrusion portion (leg portion 64C) which is bifurcated from the interlock portion 65C and protrudes to the base BC side, and the contact portion 68C includes a distal end portion of the protrusion portion. The interlock portions 65C are bent in a V-shape projected toward each other between the support portions 66C of the pair. The interlock portion 65C includes an inclined surface 65aC and an inclined surface 65bC. The inclined surface 65aC and the inclined surface 65bC are included. The inclined surface 65aC and the inclined surface 65bC are surfaces (outer surfaces) of the interlock portions 65C of a pair on sides opposite to surfaces facing each other.

The inclined surfaces 65aC are inclined toward each other in a direction (negative ZC-axis direction) away from the connecting portions 67C between the interlock portions 65C of the pair. The inclined surfaces 65bC are inclined away from each other in the negative ZC-axis direction. When viewed in the YC-axis direction, the inclination angles of the inclined surfaces 65aC and 65bC with respect to the ZC-axis are similar to those of the inclined surfaces 55aC and 55bC in the movable mirror 5C.

Here, an opening 37aC is formed in the mounting region 37C. Here, the opening 37aC penetrates the device layer 3C in the ZC-axis direction. Therefore, the opening 37aC communicates with (reaches) the main surface BsC and a surface of the device layer 3C on a side opposite to the main surface BsC. Similar to the opening 31bC in the mounting region 31C, the opening 37aC exhibits a pillar shape in which a shape when viewed in the ZC-axis direction is a trapezoidal shape.

The support portions 66C are inserted into this opening 37aC in a state where an elastic force of the elastic portion 62C is applied. In other words, the support portions 66C (that is, the fixed mirror 6C) penetrate the mounting region 37C via the opening 37aC. More specifically, a portion of the interlock portion 65C of the support portion 66C is positioned inside the opening 37aC. In this state, the interlock portions 65C come into contact with a pair of edge portions (an edge portion on the main surface BsC side and an edge portion on a side opposite to the main surface BsC) of the opening 37aC in the ZC-axis direction. Here, the inclined surfaces 65aC come into contact with the edge portions of the opening 37aC on the main surface BsC side, and the inclined surfaces 65bC come into contact with the edge portions of the opening 37aC on a side opposite to the main surface BsC. Accordingly, the interlock portions 65C are interlocked with the mounting region 37C such that the mounting region 37C is sandwiched therebetween in the ZC-axis direction. As a result, detachment of the fixed mirror 6C from the base BC in the ZC-axis direction is curbed.

At this time, the contact portions 68C come into contact with the main surface BsC (that is, the mounting region 37C). That is, the contact portions 68C come into contact with the mounting region 37C (here, the main surface BsC) in a state where the interlock portions 65C are interlocked such that the mounting region 37C is sandwiched therebetween. Then, the contact portions 68C are bonded to the mounting region 37C. Here, as an example, the contact portions 68C come into contact with the main surface BsC with a resin bonding layer interposed therebetween, for example, and are bonded thereto. However, for example, the contact portions 68C may be bonded through melting of a metal layer, bonding using a glass bonding agent or irradiation of laser light, or the like.

Here, an opening 42C is formed in the intermediate layer 4C. The opening 42C includes the opening 37aC of the mounting region 37C when viewed in the ZC-axis direction and is open on both sides of the intermediate layer 4C in the ZC-axis direction. An opening 22C is formed in the support layer 2C. The opening 22C includes the opening 37aC of the mounting region 37C when viewed in the ZC-axis direction and is open on both sides of the support layer 2C in the ZC-axis direction. In the optical module 1C, a continuous space S2C is constituted of a region inside the opening 42C of the intermediate layer 4C and a region inside the opening 22C of the support layer 2C. That is, the space S2C includes a region inside the opening 42C of the intermediate layer 4C and a region inside the opening 22C of the support layer 2C.

A portion of each of the interlock portions 65C included in the fixed mirror 6C is positioned in the space S2C. Specifically, a portion of each of the interlock portions 65C is positioned in a region inside the opening 22C of the support layer 2C through a region inside the opening 42C of the intermediate layer 4C. A portion of each of the interlock portions 65C protrudes into the space S2C from a surface of the device layer 3C on the intermediate layer 4C side by approximately 100 µm, for example.

Here, an inner surface of the opening 37aC has a configuration similar to the inner surface of the opening 31bC in the mounting region 31C. Therefore, when the pair of interlock portions 65C is disposed inside the opening 37aC, the interlock portions 65C press the inner surface of the opening 37aC due to an elastic force of the elastic portion 62C, and a reaction force from the inner surface of the opening 37aC is applied to the interlock portions 65C (support portions 66C). Accordingly, in a state where the mirror surface 61aC intersects (for example, is orthogonal to) the main surface BsC, the fixed mirror 6C is supported in the mounting region 37C by a reaction force of an elastic force applied from the inner surface of the opening 37aC to the support portions 66C. In this state, as described above, the contact portions 68C come into contact with the main surface BsC (mounting region 37C) and are bonded thereto. Therefore, in a state where the mirror surface 61aC intersects the main surface BsC, the fixed mirror 6C is supported in the mounting region 37C by a reaction force of an elastic force applied from the inner surface of the opening 37aC to the interlock portions 65C and is bonded to the mounting region 37C at the contact portions 68C. Similar to the case of the movable mirror 5C, the fixed mirror 6C is also self-aligned in a three-dimensional manner utilizing the inner surface of the opening 37aC and an elastic force.

Similar to the movable mirror 5C, the fixed mirror 6C described above is also integrally formed by a MEMS technology (patterning and etching), for example. The size of each portion of the fixed mirror 6C is similar to the size of each portion of the movable mirror 5C described above, for example.

[Operations and Effects]

In the optical module 1C, the movable mirror 5C has the elastic portion 52C, and the support portions 56C of the pair in which the distance therebetween is able to be changed in accordance with elastic deformation of the elastic portion 52C. Meanwhile, the opening 31bC communicating with the main surface BsC is formed in the mounting region 31C of the base BC on which the movable mirror 5C is mounted. Therefore, as an example, when the support portions 56C are inserted into the opening 31bC in a state where the elastic portion 52C is elastically deformed such that the distance between the support portions 56C is decreased, and when an elastic deformation of the elastic portion 52C is partially released, the distance between the support portions 56C increases inside the opening 31bC, so that the support portions 56C can be brought into contact with the inner surface of the opening 31bC.

Accordingly, due to a reaction force of an elastic force applied from the inner surface of the opening 31bC to the support portions 56C, a position of the movable mirror 5C with respect to the mounting region 31C is accurately defined on the inner surface of the opening 31bC. Moreover, the movable mirror 5C is bonded to the mounting region 31C in the contact portions 58C of the support portions 56C in a state of being supported due to a reaction force of an elastic force. As a result, according to the optical module 1C, it is possible to improve the accuracy of mounting the movable mirror 5C and to ensure the mounting strength. Here, operations and effects are described with the movable mirror 5C as an example. However, the fixed mirror 6C also exhibits similar operations and effects (the same applies hereinafter).

In addition, in the optical module 1C, the support portion 56C includes a protrusion portion (leg portion 54C) which is bifurcated from the interlock portion 55C and protrudes to the base BC side, and the contact portion 58C includes a distal end portion of the protrusion portion. Therefore, the movable mirror 5C can be bonded in a state where the distal ends of the protrusion portions serving as the contact portions 58C abut the main surface BsC of the base BC. Particularly, since the main surface BsC can be used for bonding the movable mirror 5C, it is possible to facilitate processing such as disposing (patterning) of a bonding agent, welding, or the like.

In addition, in the movable mirror 5C, the elastic portion 52C is provided such that the annular region CAC is formed. Therefore, for example, compared to a case where the elastic portion 52C is in a cantilever state (in this case, a closed region such as an annular shape or the like is not formed by the elastic portion 52C), the strength of the elastic portion 52C is improved. Therefore, for example, damage to the elastic portion 52C can be curbed when manufacturing or handling the movable mirror 5C.

In addition, in the optical module 1C, the base BC has the support layer 2C and the device layer 3C which is provided on the support layer 2C and includes the main surface BsC and the mounting region 31C. In addition, the opening 31bC penetrates the device layer 3C in a direction (ZC-axis direction) intersecting the main surface BsC. Then, the support portions 56C include the interlock portions 55C which are bent to come into contact with the pair of edge portions of the opening 31bC in the ZC-axis direction. Therefore, the interlock portions 55C are interlocked with the mounting region 31C at positions where they come into contact with the pair of edge portions of the opening 31bC. Therefore, it is possible to reliably mount the movable mirror 5C on the base BC and to positionally align the movable mirror 5C in a direction intersecting the main surface BsC of the base BC.

In addition, in the optical module 1C, when viewed in the ZC-axis direction, the inner surface of the opening 31bC includes the inclined surfaces SLC of the pair which are inclined such that the distance therebetween increases from the one end SLaC toward the other end SLbC, and the reference surface SRC which extends along the reference line BLC connecting the other end SLbC of one inclined surface SLC and the other end SLbC of the other inclined surface SLC to each other. Therefore, when the support portions 56C are inserted into the opening 31bC and an elastic deformation of the elastic portion 52C is partially released, the support portions 56C can slide on the inclined surfaces SLC due to an elastic force and can abut the reference surface SRC. Therefore, the movable mirror 5C can be positionally aligned in a direction along the main surface BsC.

In addition, in the optical module 1C, the elastic portion 52C forms the annular region CAC, which is formed in an annular shape such that the mirror portion 51C is surrounded when viewed in the XC-axis direction. Therefore, since the elastic portion 52C has no end portion, the strength of the elastic portion 52C can be reliably improved.

Moreover, in the movable mirror 5C, the elastic portion 52C has a symmetrical shape with respect to the center line DLC of the mirror surface 51aC, and the elastic portion 52C has equal spring constants on both sides of the center line DLC. Therefore, for example, when the elastic portion 52C is elastically deformed in the YC-axis direction, the posture of the movable mirror 5C is unlikely to be unstable (for example, distortion is unlikely to occur). In addition, when an elastic deformation of the elastic portion 52C is partially released, uneven inputting of a reaction force from the inner surface of the opening 31bC to the pair of support portions 56C is curbed.

Here, in the optical module 1C, the movable mirror 5C penetrates the mounting region 31C of the device layer 3C, and a portion of each of the interlock portions 55C of the movable mirror 5C is positioned in the space S1C formed between the support layer 2C and the device layer 3C. Accordingly, for example, since there is no limitation on the size and the like of each of the interlock portions 55C, the movable mirror 5C can be stably and firmly fixed to the mounting region 31C of the device layer 3C. Thus, according to the optical module 1C, reliable mounting of the movable mirror 5C with respect to the device layer 3C is realized.

In addition, in the optical module 1C, a portion of each of the interlock portions 55C of the movable mirror 5C is positioned in a region inside the opening 21C of the support layer 2C through a region inside the opening 41C of the intermediate layer 4C. Accordingly, it is possible to favorably realize a configuration for reliable mounting of the movable mirror 5C with respect to the device layer 3C.

In addition, in the optical module 1C, the support layer 2C is the first silicon layer of the SOI substrate, the device layer 3C is the second silicon layer of the SOI substrate, and the intermediate layer 4C is the insulating layer of the SOI substrate. Accordingly, it is possible to favorably realize a configuration for reliable mounting of the movable mirror 5C with respect to the device layer 3C using the SOI substrate.

In addition, in the optical module 1C, the mirror surface 51aC of the movable mirror 5C is positioned on a side opposite to the support layer 2C with respect to the device layer 3C. Accordingly, it is possible to simplify the configuration of the optical module 1C.

In addition, in the optical module 1C, the movable mirror 5C, the fixed mirror 6C, and the beam splitter 7C are disposed such that the interference optical system 10C is constituted. Accordingly, it is possible to obtain an FTIR having improved sensitivity.

In addition, in the optical module 1C, the light incident unit 8C is disposed such that measurement light is incident on the interference optical system 10C from outside, and the light emission unit 9C is disposed such that the measurement light is emitted from the interference optical system 10C to the outside. Accordingly, it is possible to obtain an FTIR including the light incident unit 8C and the light emission unit 9C.

[Modification Examples]

Hereinabove, an embodiment of still another aspect of the present disclosure has been described. However, still another aspect of the present disclosure is not limited to the foregoing embodiment. For example, the material and the shape of each configuration are not limited to the materials and the shapes described above, and various materials and shapes can be employed.

Figure 33:
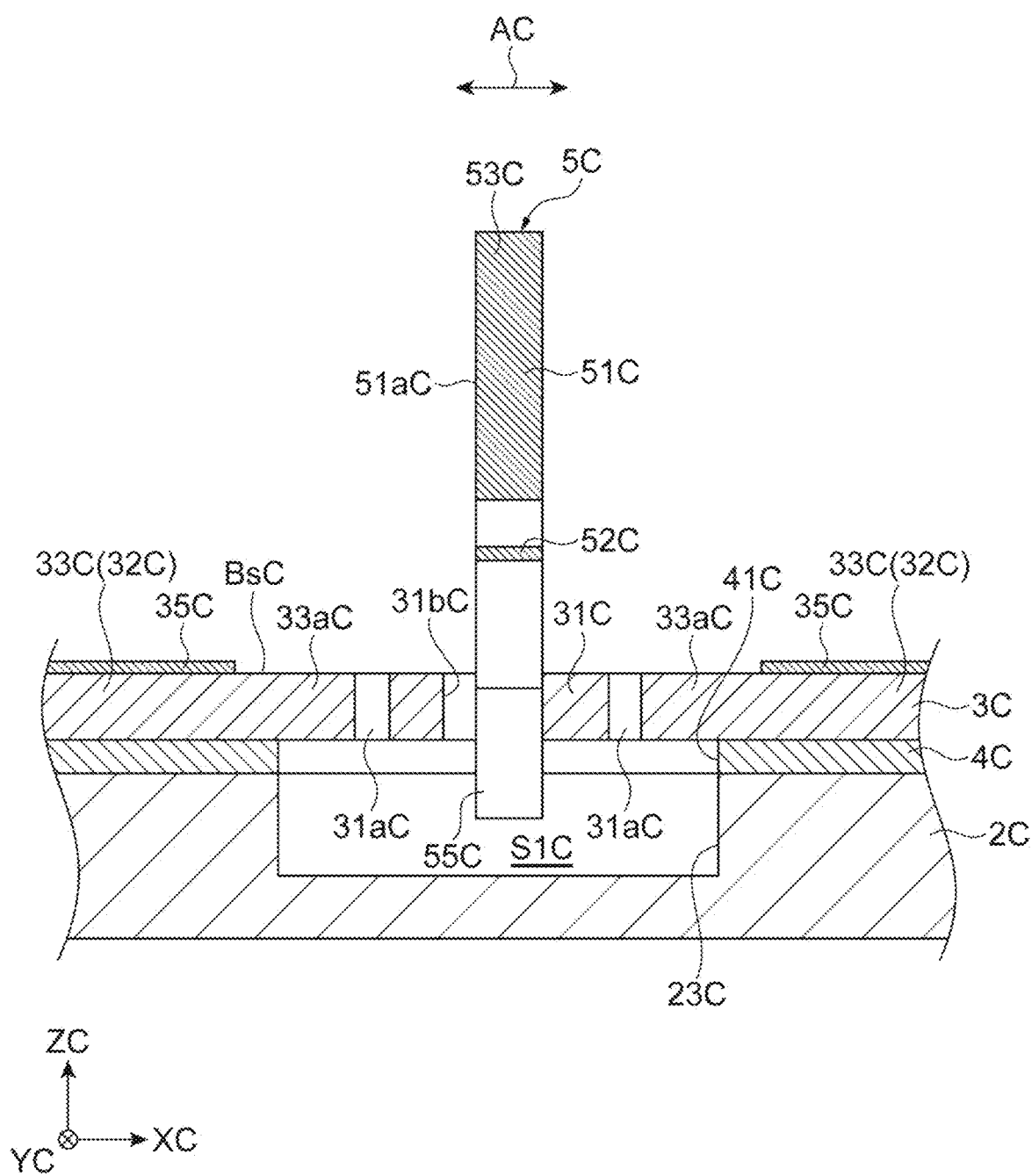
FIG. 33 is a cross-sectional view of a modification example of the surrounding structure of the movable mirror.
Figure 34:
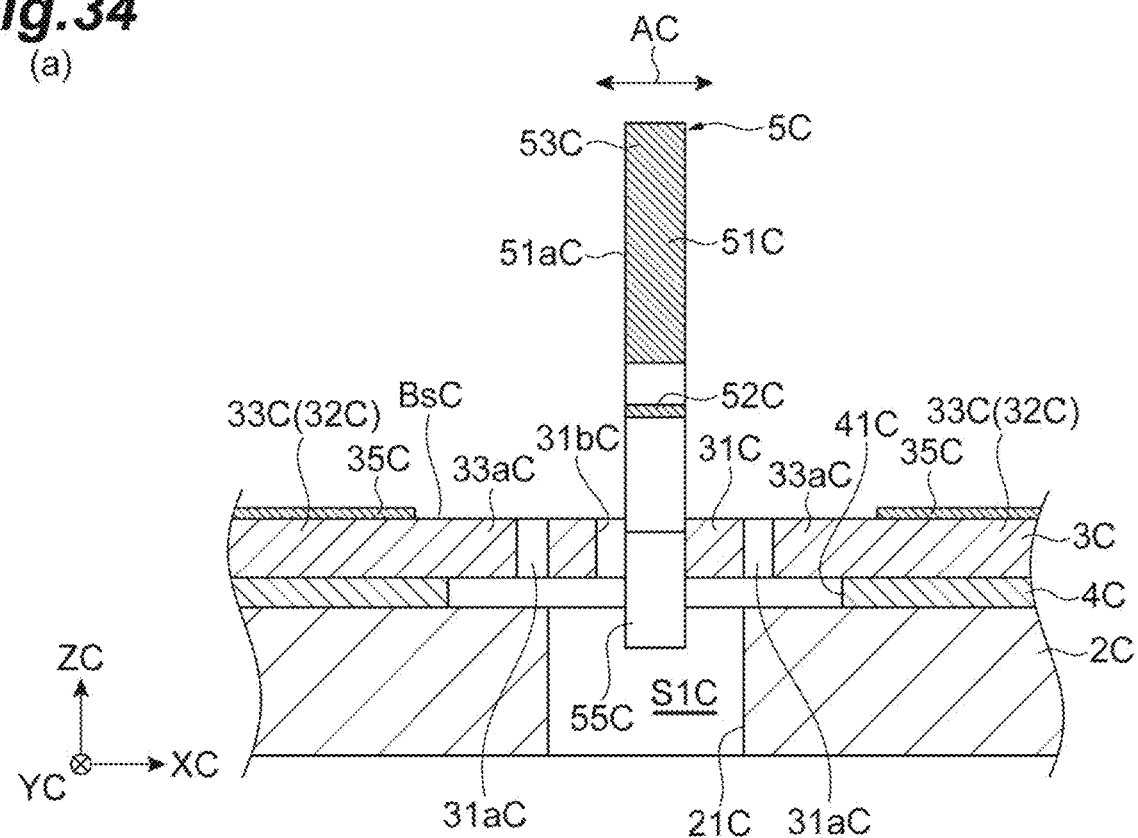
FIG. 34 is a cross-sectional view of another modification example of the surrounding structure of the movable mirror.
Figure 34:
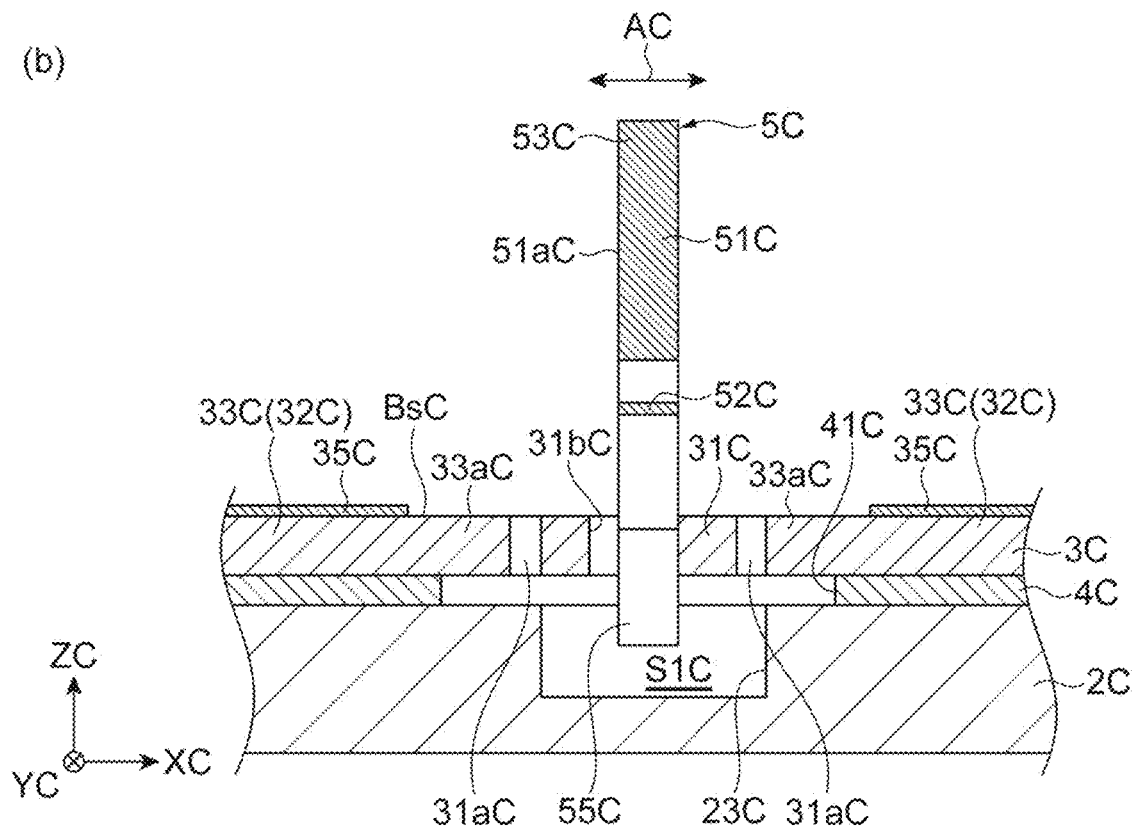
Figure 35:
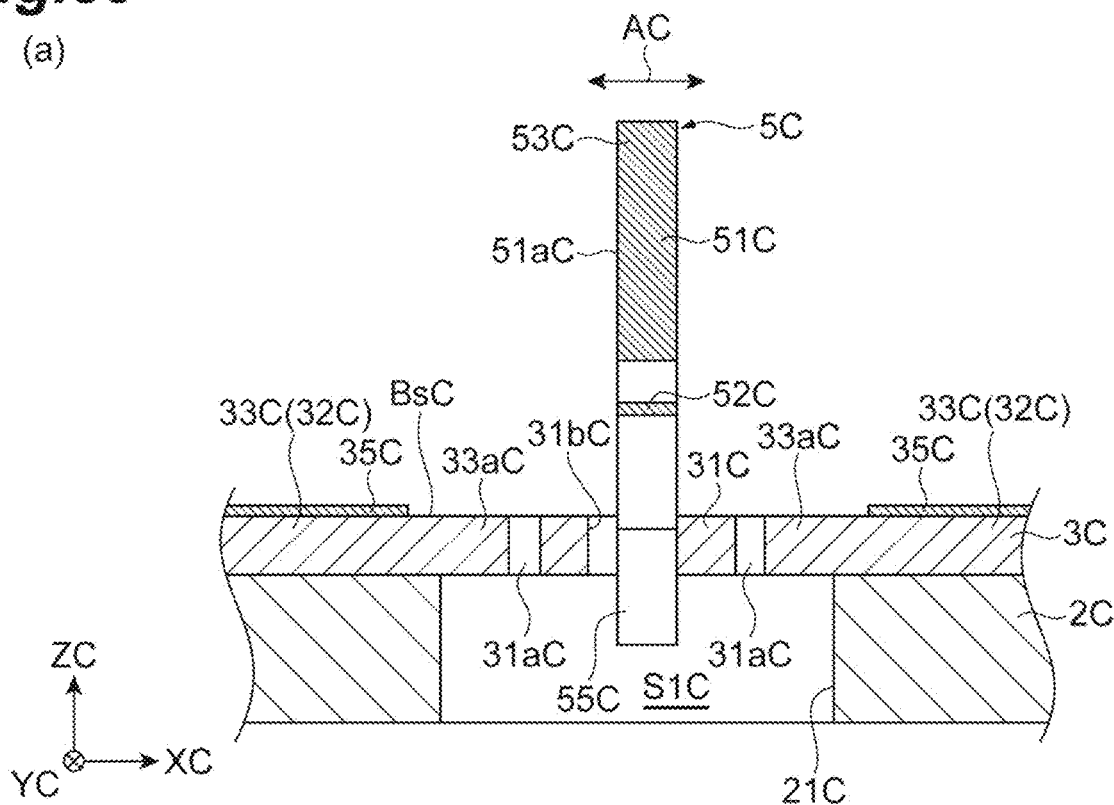
FIG. 35 is a cross-sectional view of another modification example of the surrounding structure of the movable mirror.
Figure 35:
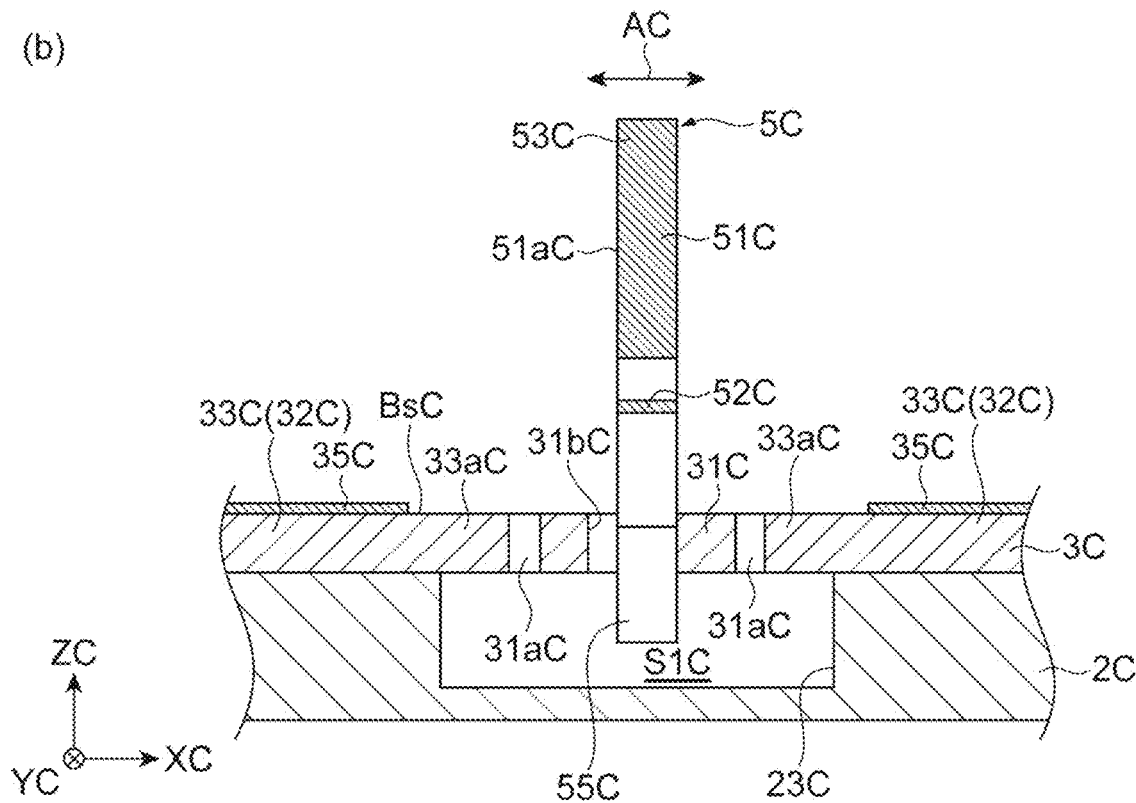
Figure 36:
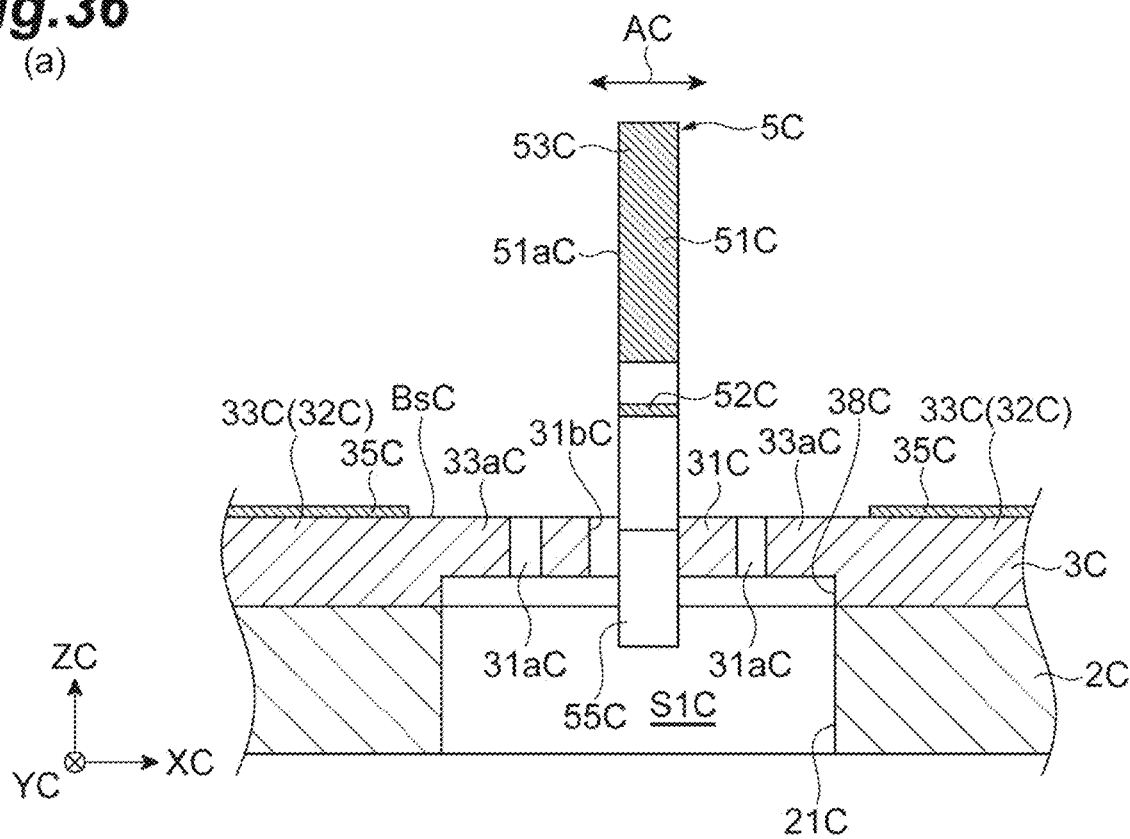
FIG. 36 is a cross-sectional view of another modification example of the surrounding structure of the movable mirror.
Figure 36:
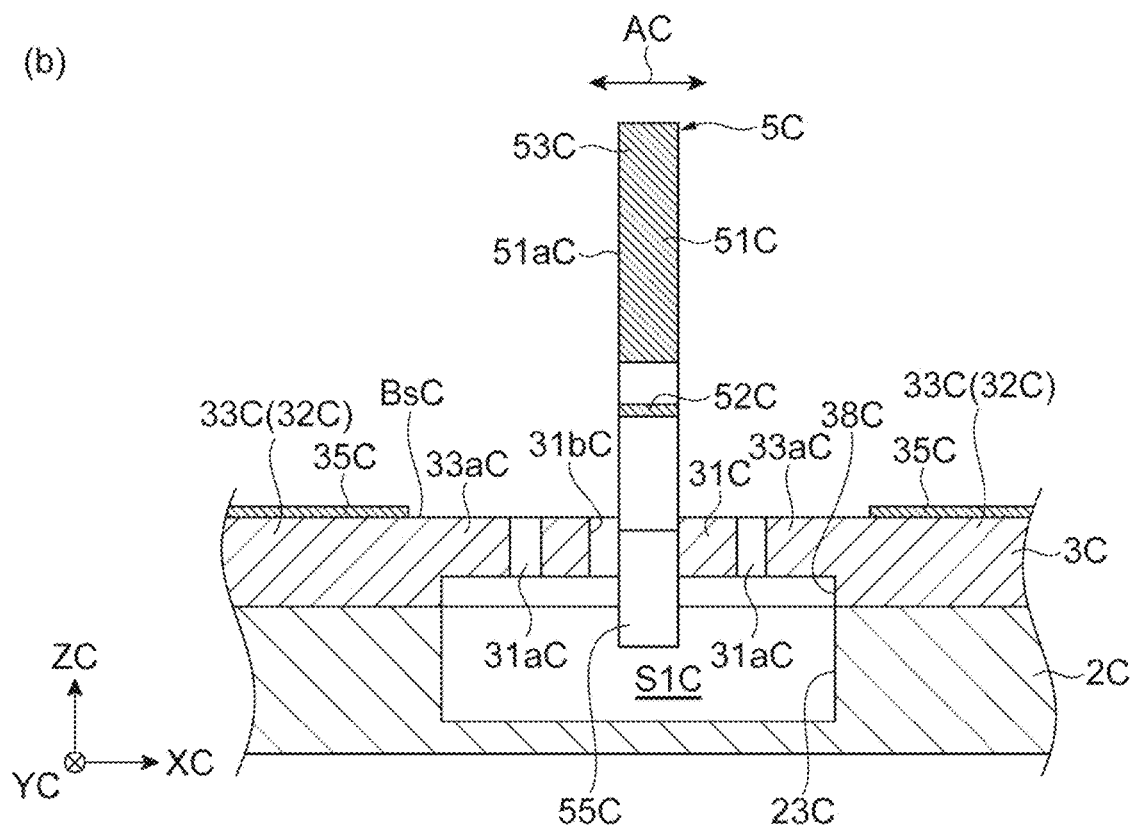
Figure 37:
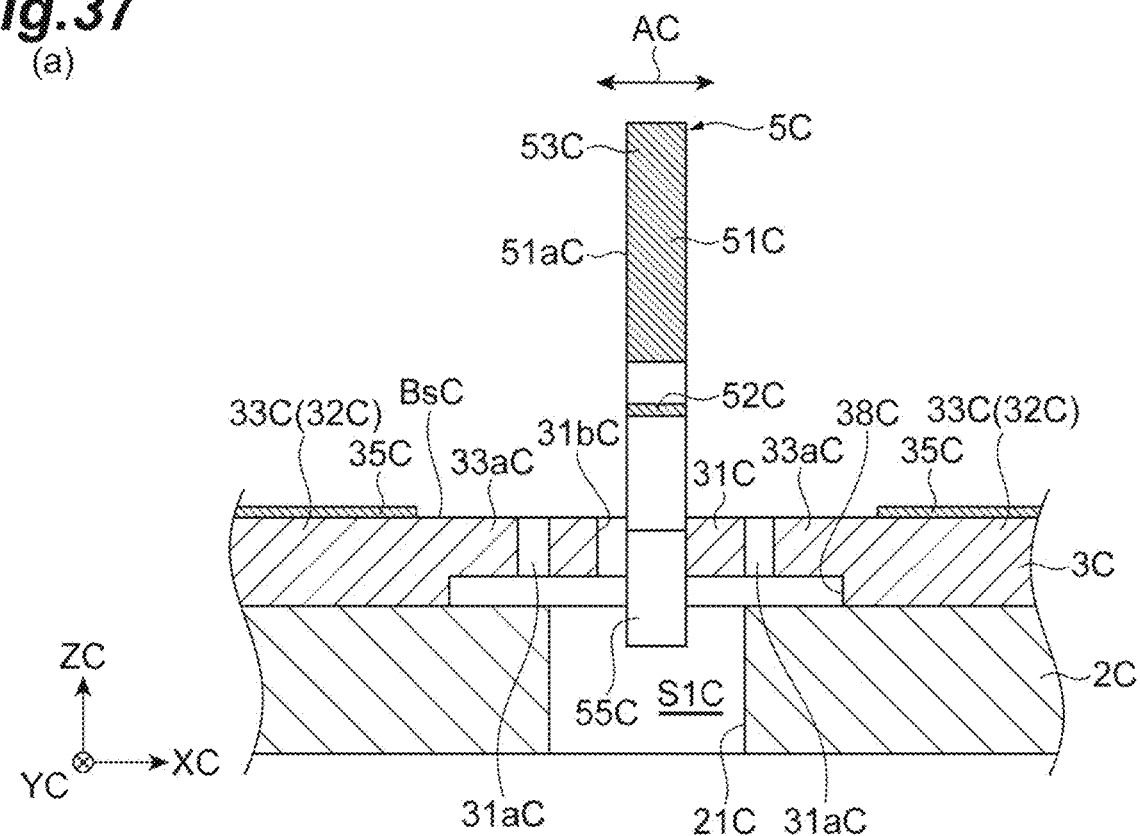
FIG. 37 is a cross-sectional view of another modification example of the surrounding structure of the movable mirror.
Figure 37:
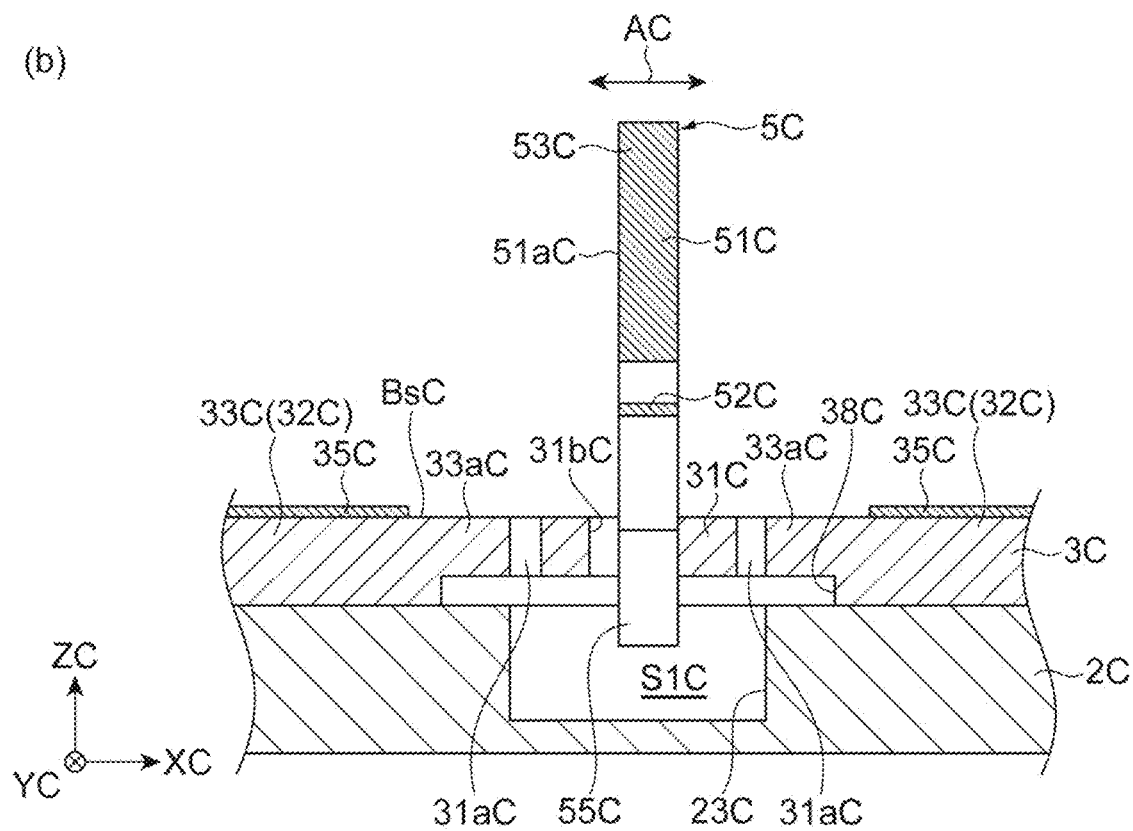

In addition, as long as the space S1C is formed between the support layer 2C and the device layer 3C and corresponds to at least the mounting region 31C and the driving region 32C, various forms can be employed as illustrated in FIGS. 33 and 34.

In the configuration illustrated in FIG. 33, in place of the opening 21C, a recess portion 23C open on the device layer 3C side is formed in the support layer 2C, and the space S1C is constituted of a region inside the opening 41C of the intermediate layer 4C and a region inside the recess portion 23C of the support layer 2C. In this case, a region inside the recess portion 23C of the support layer 2C includes the range in which the mounting region 31C moves when viewed in the ZC-axis direction. A portion of each of the interlock portions 55C of the movable mirror 5C is positioned in a region inside the recess portion 23C through a region inside the opening 41C of the intermediate layer 4C. With this configuration as well, it is possible to favorably realize a configuration for reliable mounting of the movable mirror 5C with respect to the device layer 3C.

In the configuration illustrated in FIG. 34(a), a region inside the opening 21C of the support layer 2C includes a range in which each of the interlock portions 55C of the movable mirror 5C moves when viewed in the ZC-axis direction. In the configuration illustrated in FIG. 34(b), a region inside the recess portion 23C of the support layer 2C includes the range in which each of the interlock portions 55C of the movable mirror 5C moves when viewed in the ZC-axis direction. In these cases, a region inside the opening 41C of the intermediate layer 4C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. In any configuration, a portion of each of the interlock portions 55C of the movable mirror 5C positioned in the space S1C does not come into contact with the intermediate layer 4C and the support layer 2C when the mounting region 31C reciprocates in the direction AC.

In addition, the support layer 2C and the device layer 3C may be joined to each other without having the intermediate layer 4C interposed therebetween. In this case, the support layer 2C is formed of silicon, borosilicate glass, quartz glass, or ceramic, for example, and the device layer 3C is formed of silicon, for example. The support layer 2C and the device layer 3C are joined to each other through room-temperature joining utilizing surface activation, low-temperature plasma joining, direct joining in which high-temperature processing is performed, insulating resin bonding, metal joining, joining using glass frit, or the like, for example. In this case as well, as long as the space S1C is formed between the support layer 2C and the device layer 3C and corresponds to at least the mounting region 31C and the driving region 32C, various forms can be employed as illustrated in FIGS. 35, 36, 37, and 38. In any configuration, it is possible to favorably realize a configuration for reliable mounting of the movable mirror 5C with respect to the device layer 3C.

In the configuration illustrated in FIG. 35(a), the space S1C is constituted of a region inside the opening 21C of the support layer 2C. In this case, a region inside the opening 21C of the support layer 2C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A portion of each of the interlock portions 55C of the movable mirror 5C is positioned in a region inside the opening 21C of the support layer 2C.

In the configuration illustrated in FIG. 35(b), the space S1C is constituted of a region inside the recess portion 23C of the support layer 2C. In this case, a region inside the recess portion 23C of the support layer 2C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A portion of each of the interlock portions 55C of the movable mirror 5C is positioned in a region inside the recess portion 23C of the support layer 2C.

In the configuration illustrated in FIG. 36(a), a recess portion (first recess portion) 38C open on the support layer 2C side is formed in the device layer 3C, and the space S1C is constituted of a region inside the recess portion 38C of the device layer 3C and a region inside the opening 21C of the support layer 2C. In this case, a region inside the recess portion 38C of the device layer 3C and a region inside the opening 21C of the support layer 2C include the range in which the mounting region 31C moves when viewed in the ZC-axis direction. A region inside the recess portion 38C of the device layer 3C forms a clearance for causing a part of the mounting region 31C and the driving region 32C, which needs to be separated from the support layer 2C, to be separated from the support layer 2C. A portion of each of the interlock portions 55C of the movable mirror 5C is positioned in a region inside the opening 21C of the support layer 2C through a region inside the recess portion 38C of the device layer 3C.

In the configuration illustrated in FIG. 36(b), the recess portion 38C is formed in the device layer 3C, and the space S1C is constituted of a region inside the recess portion 38C of the device layer 3C and a region inside the recess portion (second recess portion) 23C of the support layer 2C. In this case, a region inside the recess portion 38C of the device layer 3C and a region inside the recess portion 23C of the support layer 2C include the range in which the mounting region 31C moves when viewed in the ZC-axis direction. A region inside the recess portion 38C of the device layer 3C forms a clearance for causing a part of the mounting region 31C and the driving region 32C, which needs to be separated from the support layer 2C, to be separated from the support layer 2C. A portion of each of the interlock portions 55C of the movable mirror 5C is positioned in a region inside the recess portion 23C of the support layer 2C through a region inside the recess portion 38C of the device layer 3C.

In the configuration illustrated in FIG. 37(a), the recess portion 38C is formed in the device layer 3C, and the space S1C is constituted of a region inside the recess portion 38C of the device layer 3C and a region inside the opening 21C of the support layer 2C. In this case, a region inside the recess portion 38C of the device layer 3C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A region inside the opening 21C of the support layer 2C includes the range in which each of the interlock portions 55C of the movable mirror 5C moves when viewed in the ZC-axis direction. A portion of each of the interlock portions 55C of the movable mirror 5C is positioned in a region inside the opening 21C of the support layer 2C through a region inside the recess portion 38C of the device layer 3C.

In the configuration illustrated in FIG. 37(b), the recess portion 38C is formed in the device layer 3C, and the space S1C is constituted of a region inside the recess portion 38C of the device layer 3C and a region inside the recess portion (second recess portion) 23C of the support layer 2C. In this case, a region inside the recess portion 38C of the device layer 3C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A region inside the recess portion 23C of the support layer 2C includes the range in which each of the interlock portions 55C of the movable mirror 5C moves when viewed in the ZC-axis direction. A portion of each of the interlock portions 55C of the movable mirror 5C is positioned in a region inside the recess portion 23C of the support layer 2C through a region inside the recess portion 38C of the device layer 3C.

Figure 38:
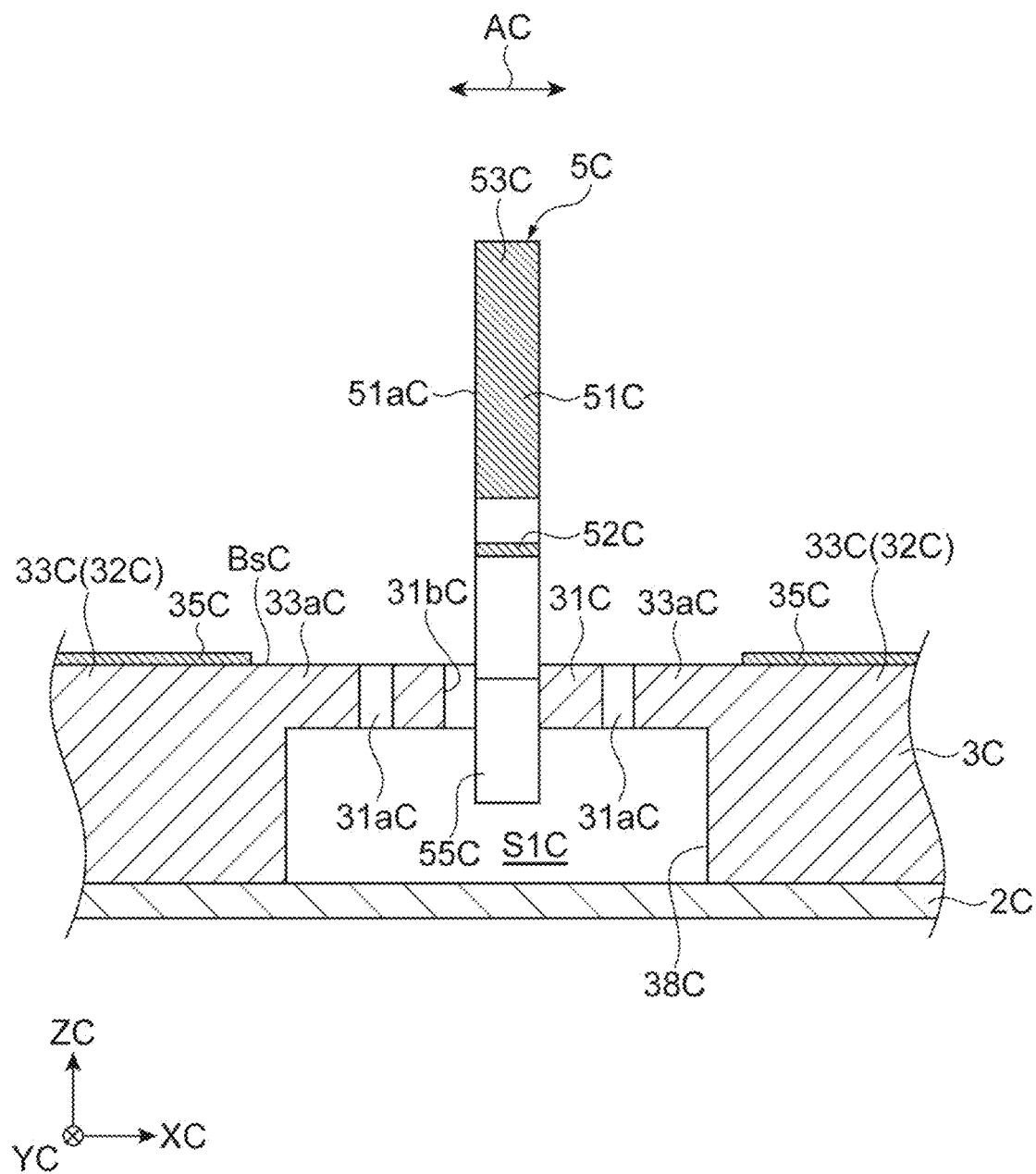
FIG. 38 is a cross-sectional view of another modification example of the surrounding structure of the movable mirror.

In the configuration illustrated in FIG. 38, the recess portion 38C is formed in the device layer 3C, and the space S1C is constituted of a region inside the recess portion 38C of the device layer 3C. In this case, a region inside the recess portion 38C of the device layer 3C includes the range in which the mounting region 31C moves when viewed in the ZC-axis direction, and forms a clearance for causing a part of the mounting region 31C and the driving region 32C, which needs to be separated from the support layer 2C, to be separated from the support layer 2C. A portion of each of the interlock portions 55C of the movable mirror 5C is positioned in a region inside the recess portion 38C of the device layer 3C.

Here, in the foregoing embodiment, the movable mirror 5C has been described in respect to a case where the mirror surface 51aC in its entirety protrudes to the main surface BsC or a surface of the base BC on a side opposite to the main surface BsC. However, the form of the movable mirror 5C is not limited to this case. For example, a portion of the mirror surface 51aC of the movable mirror 5C may be disposed inside the base BC. Hereinafter, this example will be described.

Figure 39:
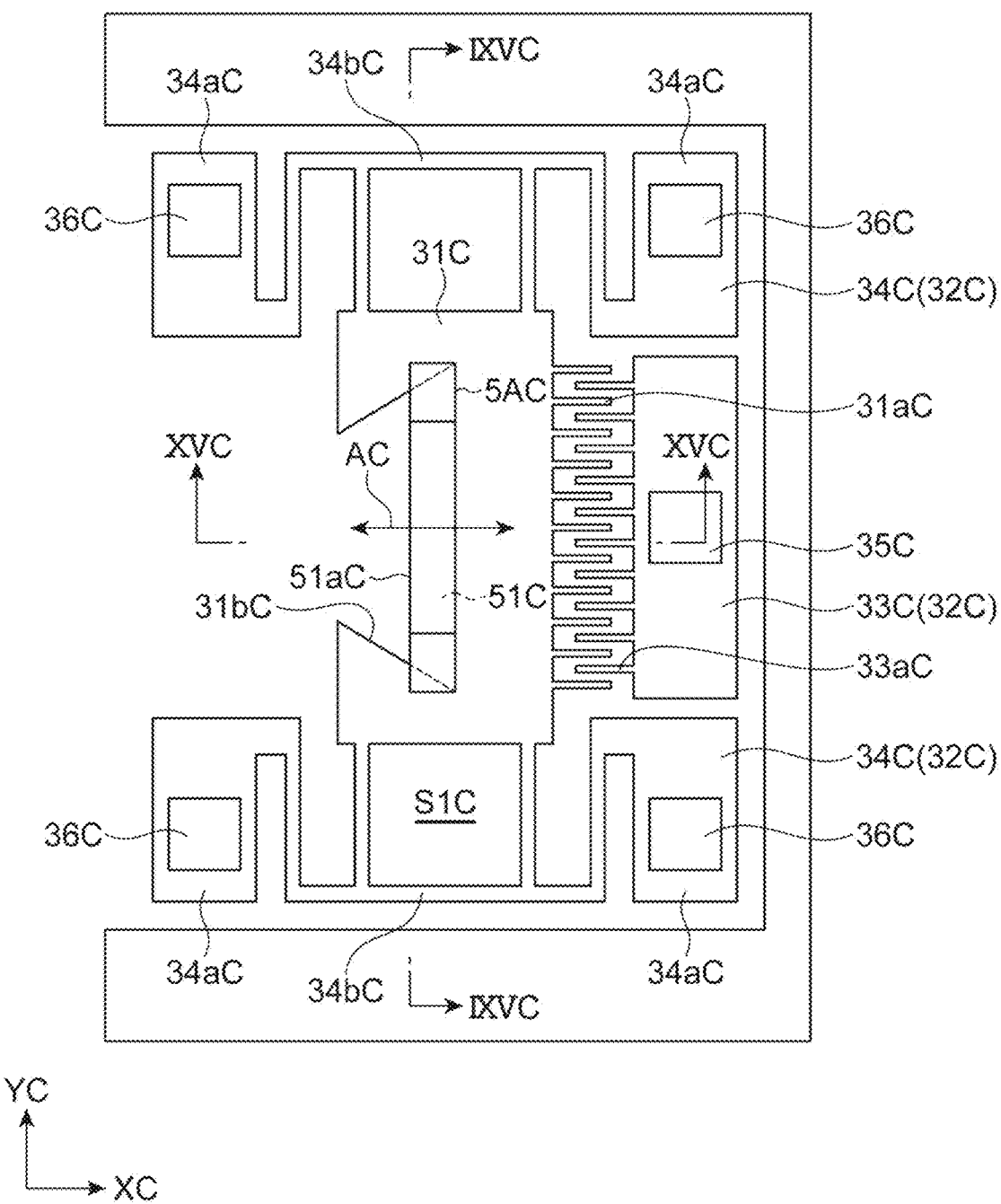
FIG. 39 is a partially schematic plan view of an optical module according to a modification example.
Figure 40:
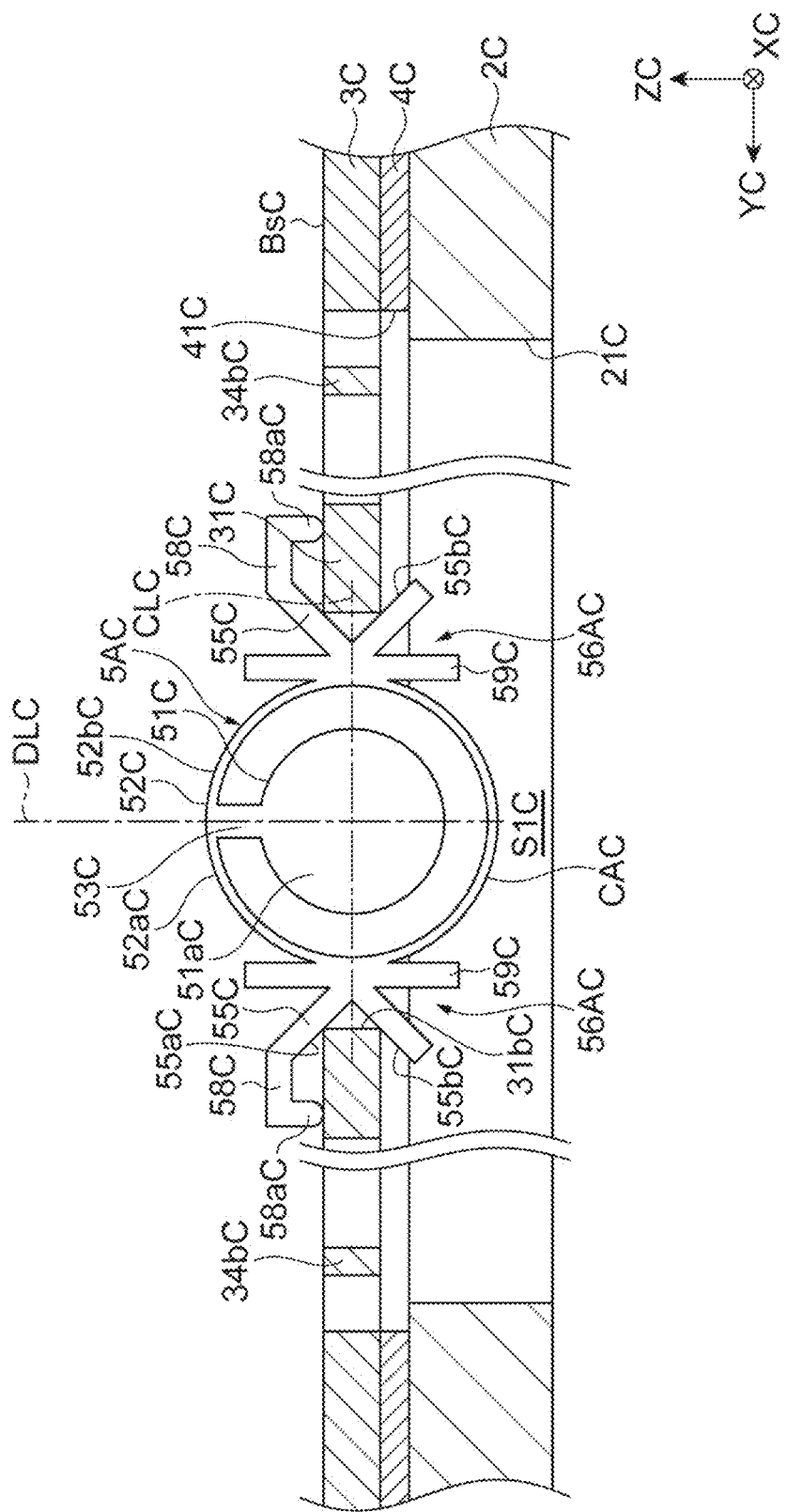
FIG. 40 is a cross-sectional view taken along line IXVC-IXVC illustrated in FIG. 39.
Figure 41:
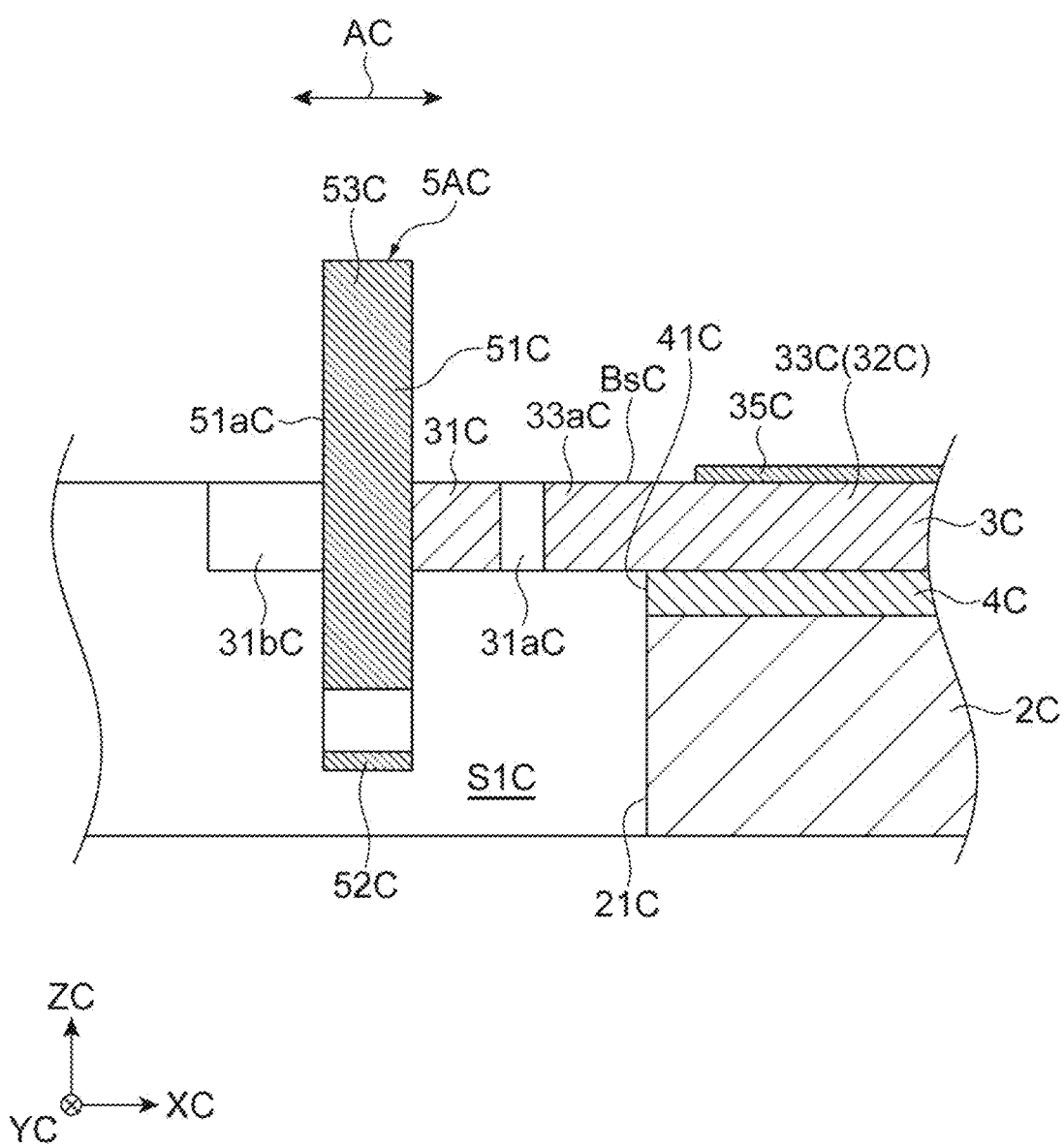
FIG. 41 is a cross-sectional view taken along line XVC-XVC illustrated in FIG. 39.

As illustrated in FIGS. 39, 40, and 41, here, compared to the movable mirror 5C illustrated in FIG. 28, a movable mirror 5AC differs from the movable mirror 5C in having support portions 56AC, in place of the support portions 56C. The support portion 56AC has an intermediate portion 59C disposed between the elastic portion 52C and the interlock portion 55C. The intermediate portions 59C linearly extend in the ZC-axis direction in a manner parallel to each other such that the mirror portion 51C is sandwiched therebetween in the YC-axis direction. The connecting portion 57C is included in a central portion of the intermediate portion 59C. The interlock portion 55C is provided in a central portion of the intermediate portion 59C. Therefore, the interlock portions 55C are disposed such that the mirror portion 51C is sandwiched therebetween in the YC-axis direction. The relationship between the shapes of the interlock portions 55C and the mounting region 31C is similar to that of the movable mirror 5C.

Accordingly, in a state where the movable mirror 5AC in its entirety penetrates the mounting region 31C via the opening 31bC, the support portions 56AC support the movable mirror 5AC. The mirror surface 51aC intersects the mounting region 31C. The movable mirror 5AC is interlocked with the device layer 3C in the interlock portions 55C and is supported in the mounting region 31C. Therefore, compared to a case where the movable mirror 5C is supported by the support portions 56C (leg portions 54C) extending to one side of the center line CLC in a relatively long manner, discrepancy between support points and the centroid is small, and stable mounting can be realized.

Specifically, as an example, the support portions 56AC support the movable mirror 5AC such that the center line CLC of the mirror surface 51aC in the ZC-axis direction is aligned with the center of the device layer 3C in the thickness direction. Therefore, the support points and the centroid are substantially aligned with each other in the ZC-axis direction, and more stable mounting is realized. In this case, a portion (here, half or more) of the mirror surface 51aC is positioned on the support layer 2C side of the main surface BsC. In contrast, here, the opening 31bC extends to reach the end portion of the mounting region 31C on a side facing the mirror surface 51aC and is open therein. Therefore, even in this case as well, interference of the measurement light L0C with the mounting region 31C is avoided by controlling the optical path of the measurement light L0C toward the mirror surface 51aC, and the mirror surface 51aC in its entirety can be effectively utilized.

Here, the support portion 56AC has the contact portion 58C extending in a direction (YC-axis direction) away from the mirror portion 51C, from the distal end of a part of the interlock portion 55C including the inclined surface 55aC. The contact portion 58C exhibits an L-shape in which a distal end portion 58aC is bent to the base side. Then, the contact portions 58C come into contact with the main surface BsC (mounting region 31C) in the distal end portions 58aC and are bonded thereto. In this manner, in a state where the interlock portions 55C are inserted into the opening 31bC, the support portions 56AC include the contact portions 58C which come into contact with the mounting region 31C. Accordingly, similar to the movable mirror 5C, in a state where the mirror surface 51aC intersects the main surface BsC, the movable mirror 5AC is supported in the mounting region 31C by a reaction force of an elastic force applied from the inner surface of the opening 31bC to the interlock portions 55C and is bonded to the mounting region 31C in the contact portions 58C.

In the foregoing embodiment, the fixed mirror 6C is mounted in the device layer 3C. However, the fixed mirror 6C may be mounted in the support layer 2C or the intermediate layer 4C. In addition, in the foregoing embodiment, the beam splitter 7C is mounted in the support layer 2C. However, the beam splitter 7C may be mounted in the device layer 3C or the intermediate layer 4C. That is, the fixed mirror 6C and the beam splitter 7C need only be mounted in any one of the support layer 2C, the device layer 3C, and the intermediate layer 4C. In addition, the beam splitter 7C is not limited to a cube-type beam splitter and may be a plate-type beam splitter.

In addition, the optical module 1C may include a light emitting element for generating measurement light to be incident on the light incident unit 8C, in addition to the light incident unit 8C. Alternatively, the optical module 1C may include a light emitting element for generating measurement light to be incident on the interference optical system 10C, in place of the light incident unit 8C. In addition, the optical module 1C may include a light receiving element for detecting measurement light (interference light) emitted from the light emission unit 9C, in addition to the light emission unit 9C. Alternatively, the optical module 1C may include a light receiving element for detecting measurement light (interference light) emitted from the interference optical system 10C, in place of the light emission unit 9C.

In addition, a first penetration electrode which is electrically connected to each of the actuator regions 33C, and a second penetration electrode which is electrically connected to each of both the end portions 34aC of each of the elastic support regions 34C are provided in the support layer 2C and the intermediate layer 4C (in only the support layer 2C when the intermediate layer 4C is not present), and a voltage may be applied to a part between the first penetration electrode and the second penetration electrode. In addition, the actuator for moving the mounting region 31C is not limited to an electrostatic actuator, and a piezoelectric actuator, an electromagnetic actuator, or the like may be adopted, for example. In addition, the optical module 1C is not limited to a module for constituting an FTIR and may be a module for constituting other optical systems.

Figure 42:
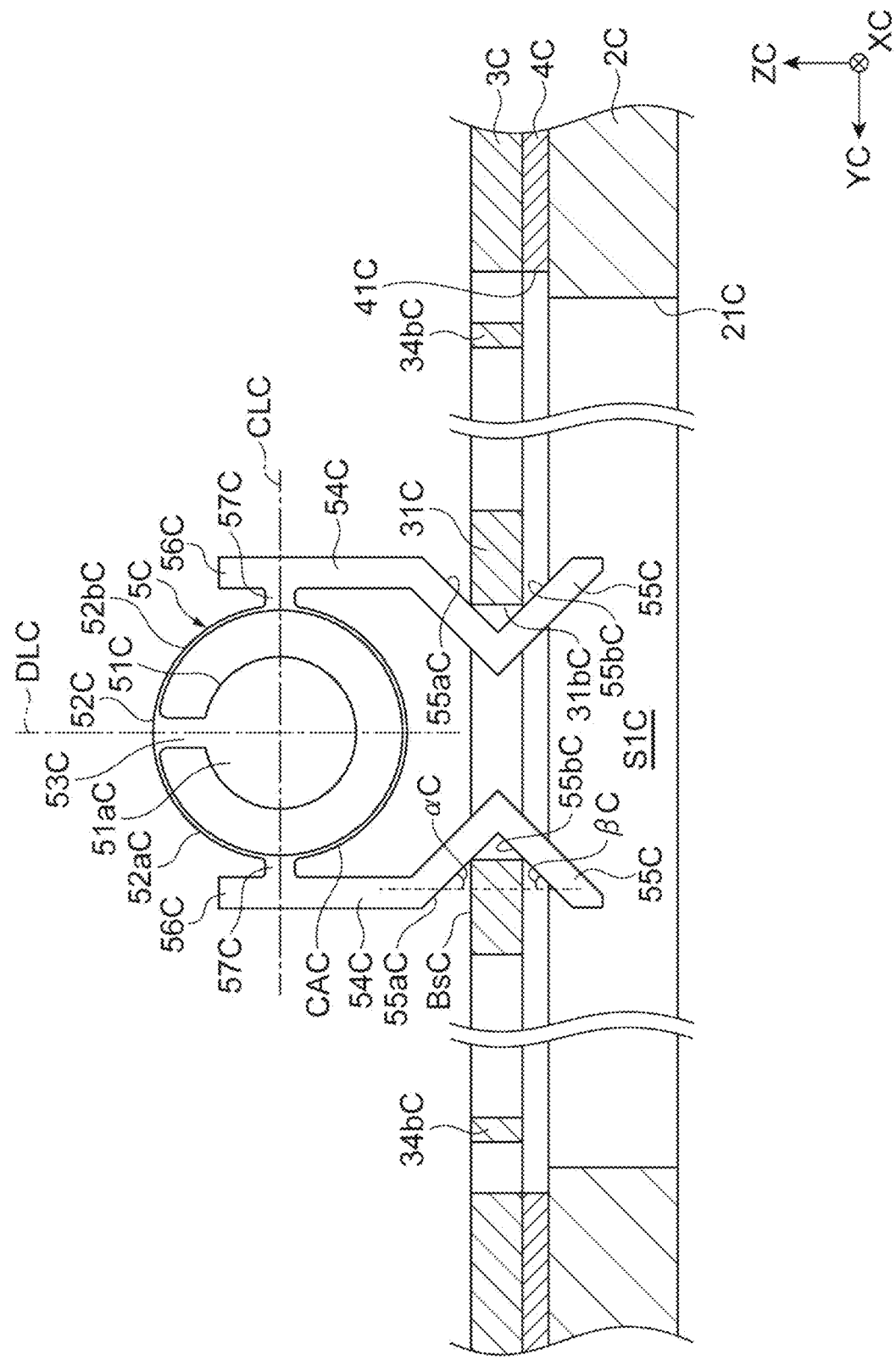
FIG. 42 is a front view illustrating a modification example of the movable mirror.
Figure 43:
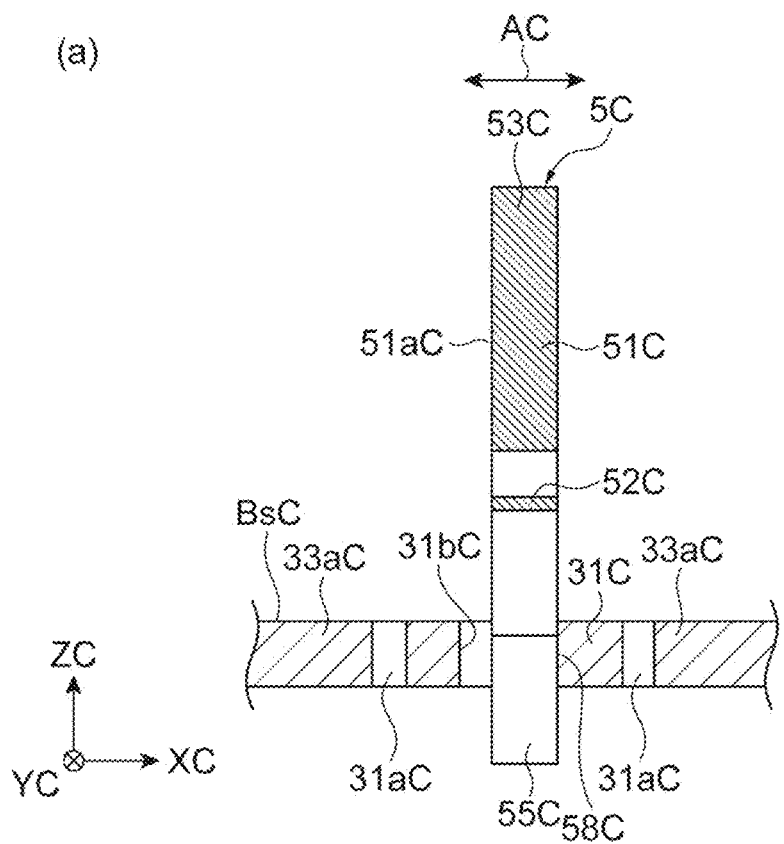
FIG. 43 is a cross-sectional view of the modification example illustrated in FIG. 42.
Figure 43:
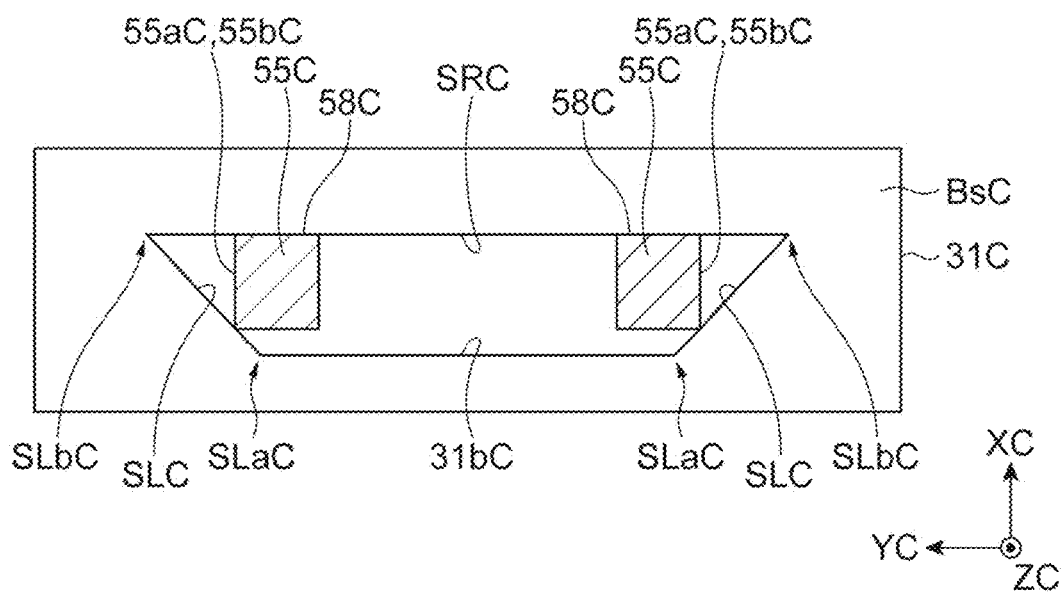

Subsequently, description of modification examples will be continued. Hereinafter, modification examples will be described using the movable mirror 5C and the opening 31bC. However, the fixed mirror 6C and the opening 37aC can also be modified in a similar manner. As illustrated in FIGS. 42 and 43, here, the interlock portion 55C is connected to a distal end of the leg portion 54C on a side opposite to the connecting portion 57C. Therefore, no protrusion portion is provided at the distal end of the leg portion 54C, which does not serve as a contact portion. Here, the interlock portion 55C includes the contact portion 58C. This will be described more specifically.

As described above, when the interlock portions 55C are inserted into the opening 31bC, the interlock portions 55C slide on the inclined surfaces SLC toward the reference surface SRC due to a component of a reaction force from the inclined surfaces SLC in the XC-axis direction and abut the reference surface SRC while being in contact with the inclined surfaces SLC. That is, the interlock portion 55C includes a side surface facing the inner surface (reference surface SRC) of the opening 31bC. Then, the side surface is bonded to the reference surface SRC. This bonding can also be performed in a manner similar to bonding on the main surface BsC described above. In this manner, here, the contact portions 58C which come into contact with the mounting region 31C in a state where the interlock portions 55C are inserted into the opening 31bC include side surfaces (are side surfaces) of the interlock portions 55C facing the reference surface SRC of the opening 31bC.

In this case, the movable mirror 5C can be bonded in a state where the side surfaces of the interlock portions 55C serving as the contact portions 5 8C are brought into contact with the inner surface of the opening 31bC. Particularly, in this case, since bonding is performed between surfaces, it is possible to increase a bonding area and to reliably improve the mounting strength.

Figure 44:
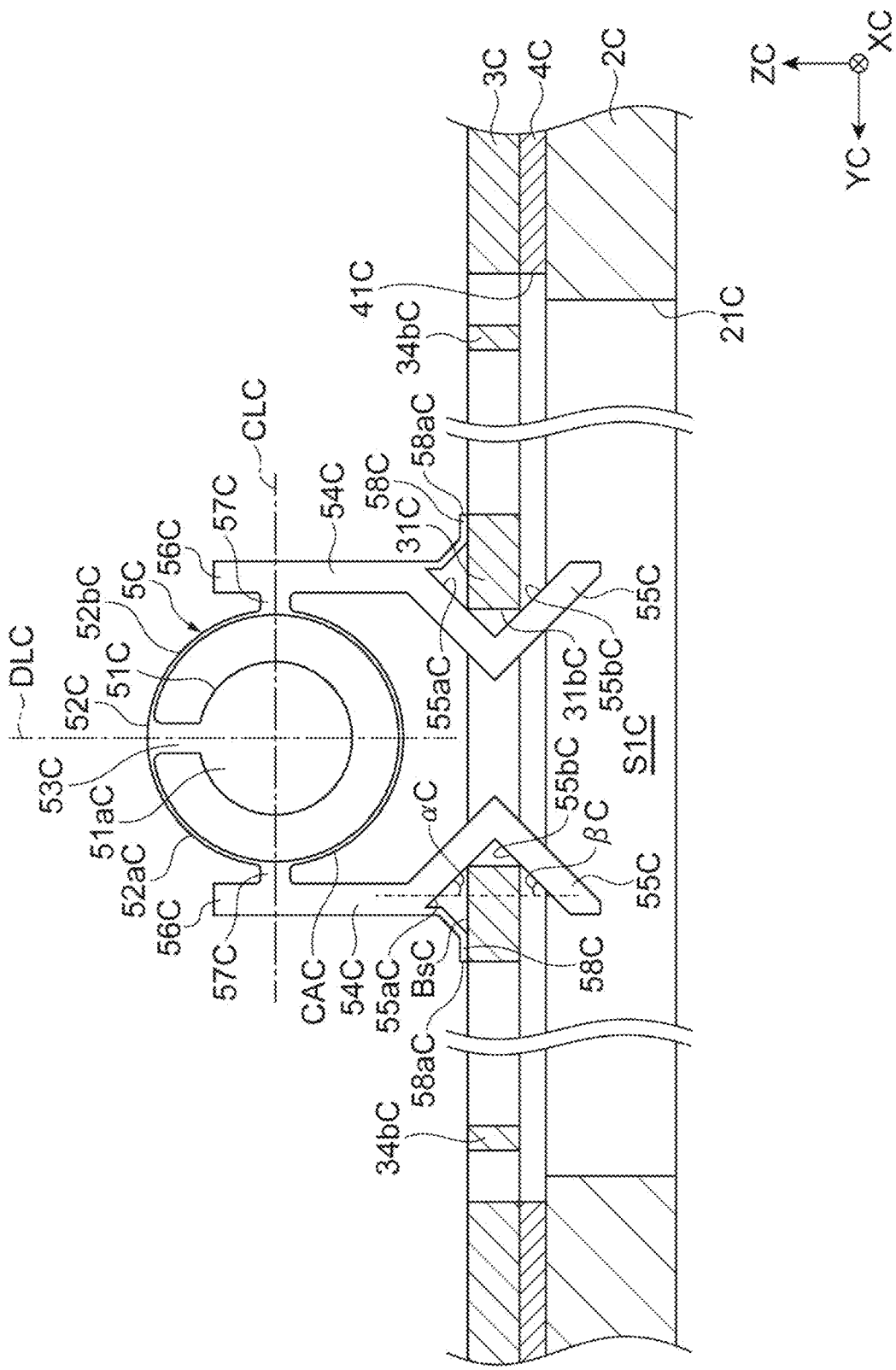
FIG. 44 is a front view illustrating another modification example of the movable mirror.

In the example illustrated in FIG. 44 as well, the interlock portion 55C is connected to the distal end of the leg portion 54C. Meanwhile, here, the support portion 56C includes a protrusion portion which is bifurcated from the interlock portion 55C at a connection part between the leg portion 54C and the interlock portion 55C and protrudes to the base BC side. The protrusion portions protrude in directions opposite to each other (outward) between the support portions 56C of the pair. Here, the contact portion 58C is this protrusion portion. That is, here, the contact portion 58C extends from the connection part between the leg portion 54C and the interlock portion 55C such that the angle with respect to the main surface BsC is decreased. Then, in a state where the interlock portions 55C are inserted into the opening 31bC, the distal end portions 58aC of the contact portions 58C become substantially parallel to (for example, are elastically deformed to be substantially parallel to) the main surface BsC and come into contact with the main surface BsC (mounting region 31C), thereby being bonded thereto.

Figure 45:
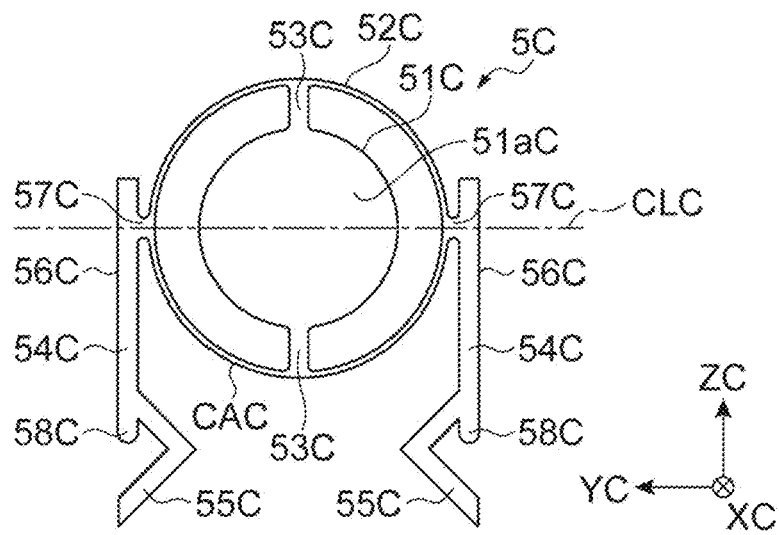
FIG. 45 is a front view illustrating another modification example of the movable mirror.
Figure 45:
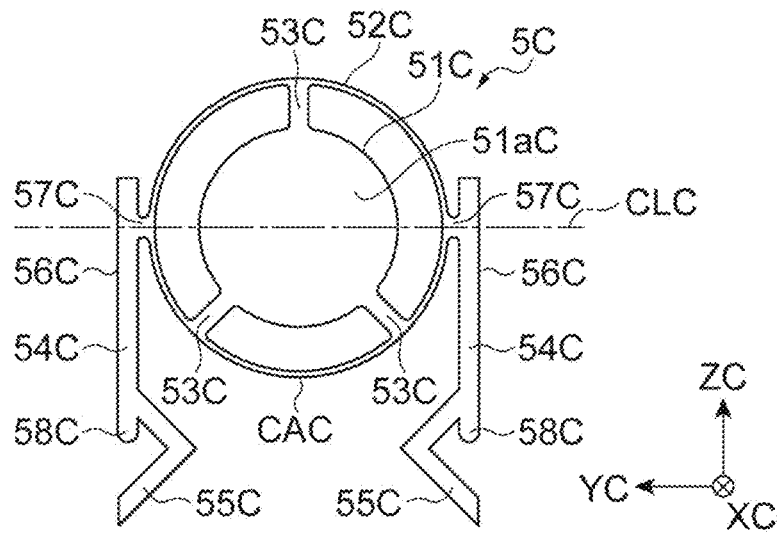
Figure 45:
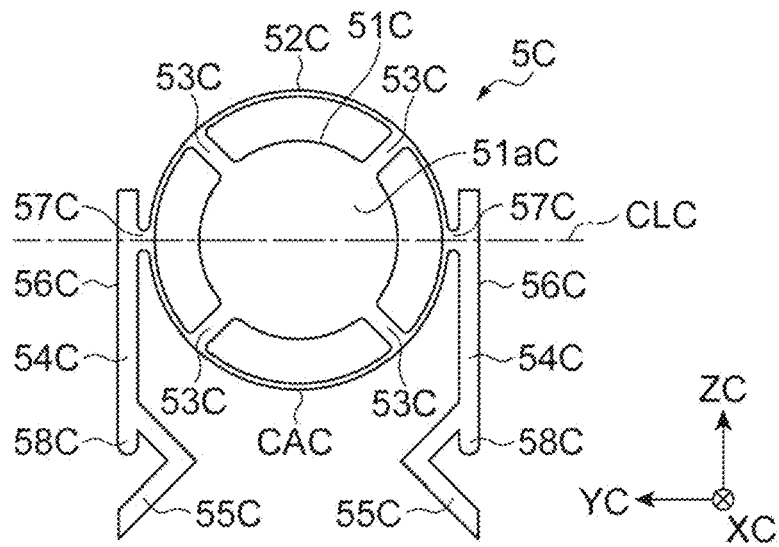

In the example illustrated in FIG. 45(a), the movable mirror 5C has a pair of connecting portions 53C. Here, the pair of connecting portions 53C is disposed at positions different from those of the pair of connecting portions 57C. The connecting portions 53C of the pair are distributed and disposed on both sides of the center line CLC. Particularly, here, the connecting portions 53C of the pair are disposed at symmetrical positions with respect to the center line CLC. Therefore, here, the elastic portion 52C and the movable mirror 5C in their entirety are symmetrically constituted with respect to a straight line connecting the connecting portions 53C of the pair to each other.

In addition, in the example illustrated in FIG. 45(b), the movable mirror 5C has three connecting portions 53C. The three connecting portions 53C are disposed at positions different from those of the connecting portions 57C of the pair. Here, one connecting portion 53C and two connecting portions 53C of the three connecting portions 53C are distributed and disposed on both sides of the center line CLC. Similarly, in the example illustrated in FIG. 45(e), the movable mirror 5C has four connecting portions 53C. The four connecting portions 53C are disposed at positions different from those of the connecting portions 57C of the pair. Here, the four connecting portions 53C are distributed such that two are disposed on each side of the center line CLC.

Figure 46:
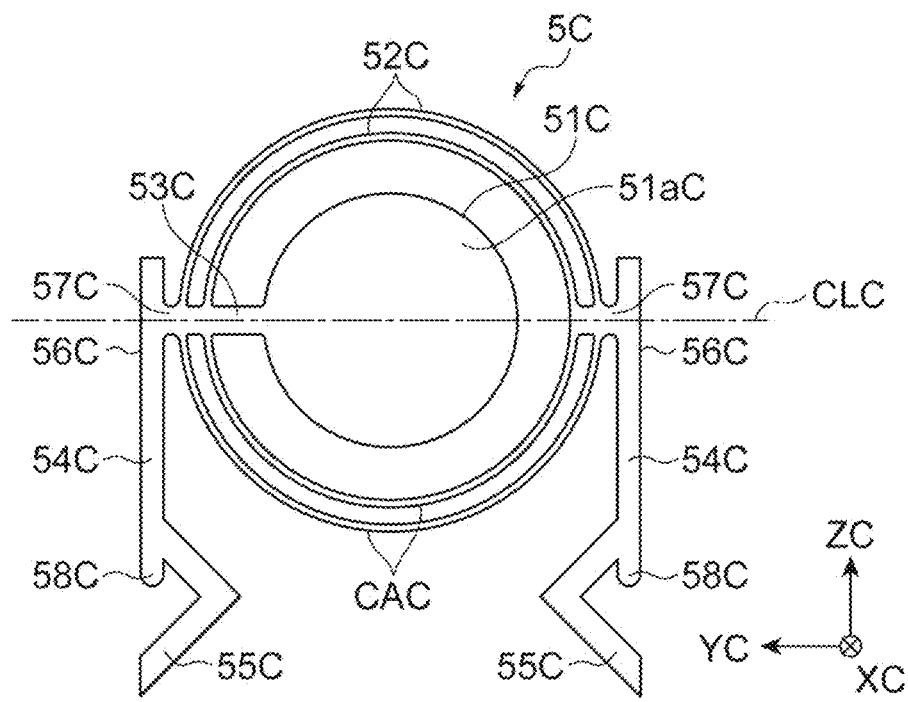
FIG. 46 is a front view illustrating another modification example of the movable mirror.
Figure 46:
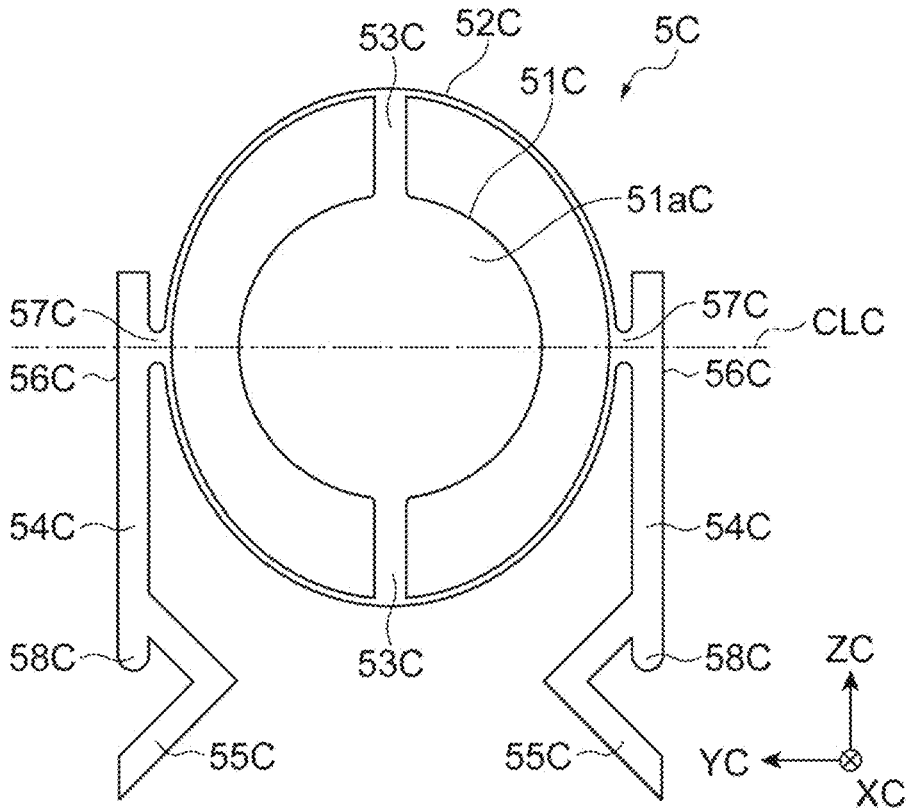

Meanwhile, as illustrated in FIG. 46(a), the movable mirror 5C can have a plurality of elastic portions 52C. Here, the movable mirror 5C has a pair of elastic portions 52C. The elastic portions 52C of the pair are individually formed to have a circular plate shape and are concentrically disposed with respect to each other. In other words, here, one elastic portion 52C is provided such that the mirror portion 51C is surrounded, and the other elastic portion 52C is provided such that the one elastic portion 52C and the mirror portion 51C are surrounded. Each of the elastic portions 52C forms the annular region CAC.

On the other hand, the elastic portion 52C is not limited to a circular plate shape and may have an elliptical plate shape as illustrated in FIG. 46(b). That is, when viewed in a direction (XC-axis direction) intersecting the mirror surface 51aC, the elastic portion 52C may have an elliptical shape. Here, a pair of connecting portions 53C is disposed at positions corresponding to the long axis of the ellipse of the elastic portion 52C. In addition, a pair of connecting portions 57C is disposed at positions corresponding to the short axis of the ellipse of the elastic portion 52C.

Description of modification examples of the elastic portion 52C will be continued. In the example illustrated in FIG. 47(a), the movable mirror 5C has a pair of elastic portions 52C which has a rectangular plate shape, and a pair of plate-like connection portions 52sC which connects the elastic portions 52C to each other. The elastic portions 52C are disposed on both sides of the mirror portion 51C such that the mirror portion 51C is sandwiched therebetween in the YC-axis direction. The elastic portions 52C extend in the ZC-axis direction in a manner substantially parallel to the support portions 56C. The connection portions 52sC are provided on both end portions of the elastic portions 52C in the longitudinal direction and connect the elastic portions 52C to each other. Accordingly, here, the annular region CAC having a rectangularly annular shape is formed by the elastic portions 52C and the connection portions 52sC. Here, a single connecting portion 53C connects the elastic portions 52C and the mirror portion 51C to each other via the connection portions 52sC.

Figure 47:
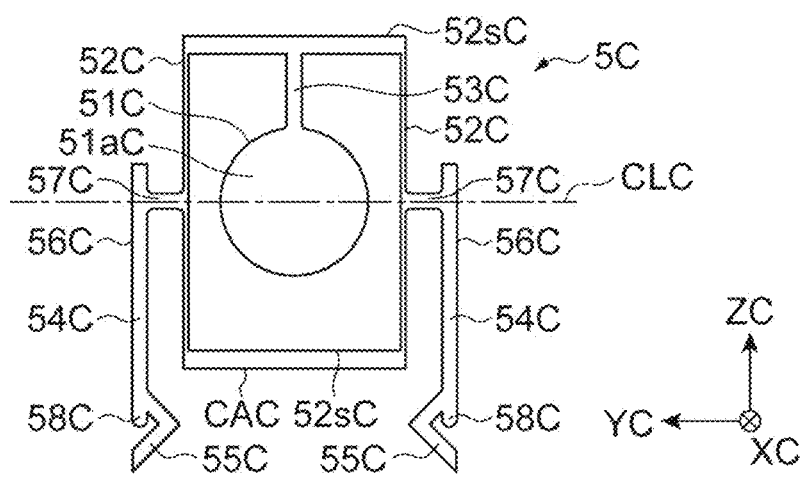
FIG. 47 is a front view illustrating another modification example of the movable mirror.
Figure 47:
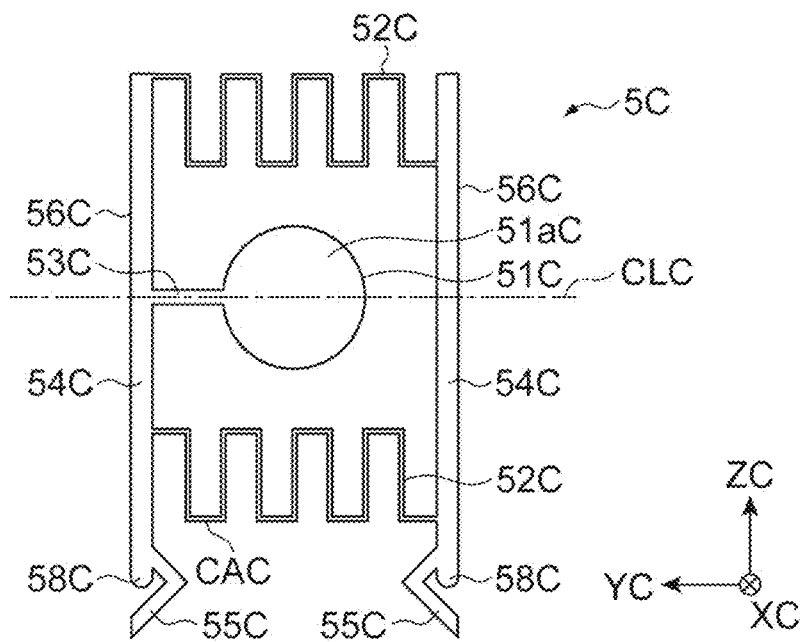
Figure 47:
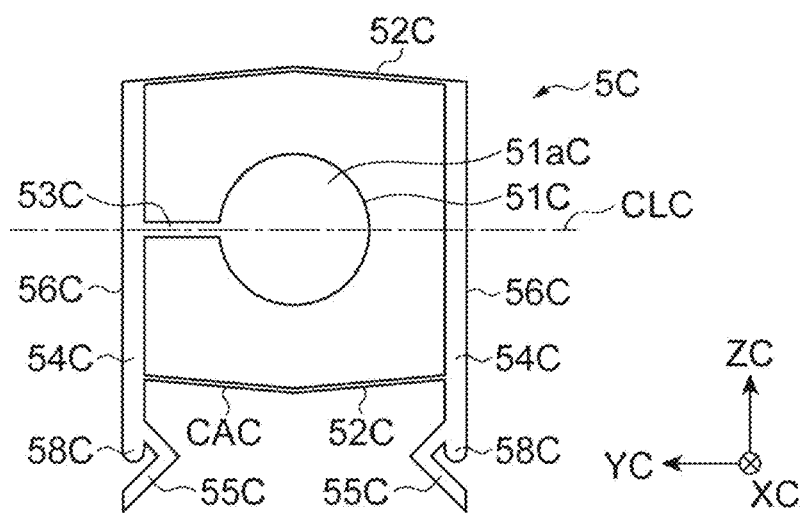

In addition, in the example illustrated in FIG. 47(b) as well, the movable mirror 5C has a pair of elastic portions 52C. Here, the elastic portions 52C are disposed on both sides of the mirror portion 51C such that the mirror portion 51C is sandwiched therebetween in the ZC-axis direction. Each of the elastic portions 52C is formed to have a waved plate shape. That is, when viewed in the XC-axis direction, the elastic portions 52C have a waved shape (here, a waved rectangular shape). The elastic portions 52C are respectively connected to the support portions 56C at both end portions thereof. Accordingly, here, the annular region CAC having a substantially rectangular shape is formed by the elastic portions 52C and the support portions 56C. In addition, here, the connecting portion 53C connects the support portions 56C and the mirror portion 51C to each other. In this manner, the mirror portion 51C may be connected to the support portions 56C.

In addition, in the example illustrated in FIG. 47(c) as well, the movable mirror 5C has a pair of elastic portions 52C. In this case as well, the elastic portions 52C are disposed on both sides of the mirror portion 51C such that the mirror portion 51C is sandwiched therebetween in the ZC-axis direction. Each of the elastic portions 52C is formed to have a V-plate shape. That is, when viewed in the XC-axis direction, the elastic portions 52C have a V-shape. The elastic portions 52C are respectively connected to the support portions 56C at both end portions thereof. Accordingly, here, the annular region CAC having a substantially rectangular shape is formed by the elastic portions 52C and the support portions 56C. In this case as well, the connecting portion 53C connects the support portions 56C and the mirror portion 51C to each other.

Figure 48:
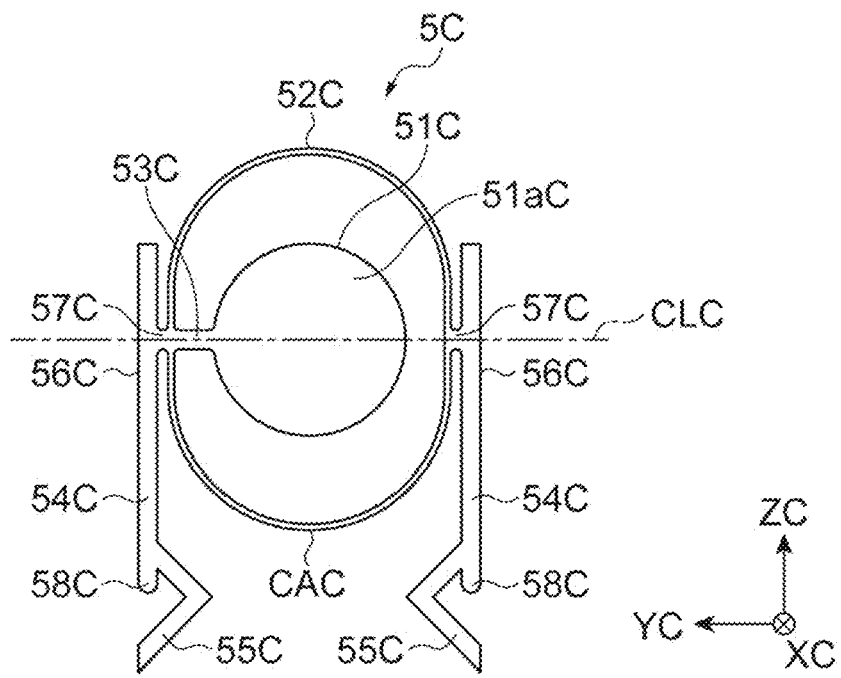
FIG. 48 is a front view illustrating another modification example of the movable mirror.
Figure 48:
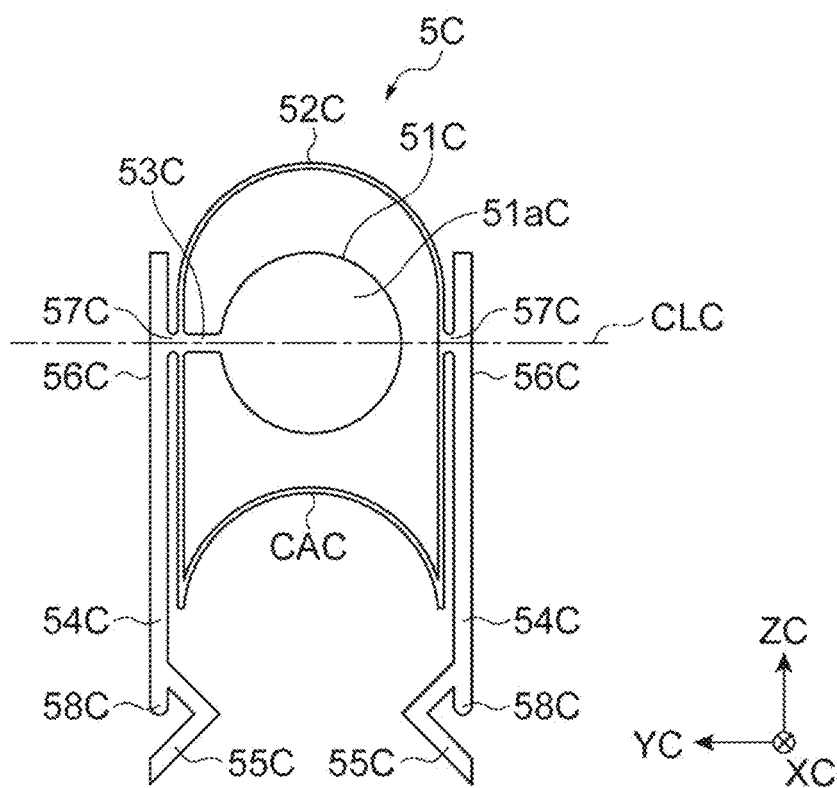

In addition, in the example illustrated in FIG. 48(a), when viewed in the XC-axis direction, the elastic portions 52C may be formed to have an annular shape by semicircular portions of a pair which are disposed in directions opposite to each other, and a pair of linear portions which connects the semicircular portions to each other. Alternatively, as illustrated in FIG. 48(b), when viewed in the XC-axis direction, the elastic portions 52C may be formed to have an annular shape by semicircular portions of a pair which are disposed in the same direction as each other, and a pair of linear portions which connects the semicircular portions to each other.

Figure 49:
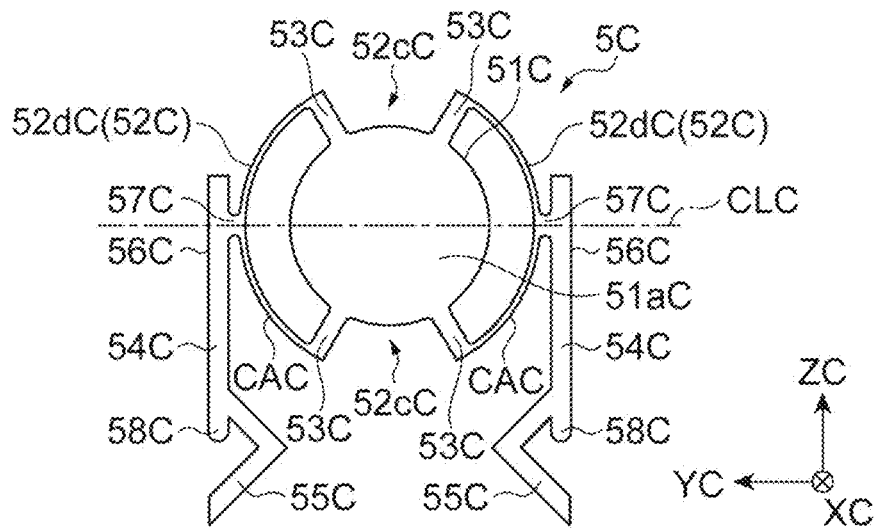
FIG. 49 is a front view illustrating another modification example of the movable mirror.
Figure 49:
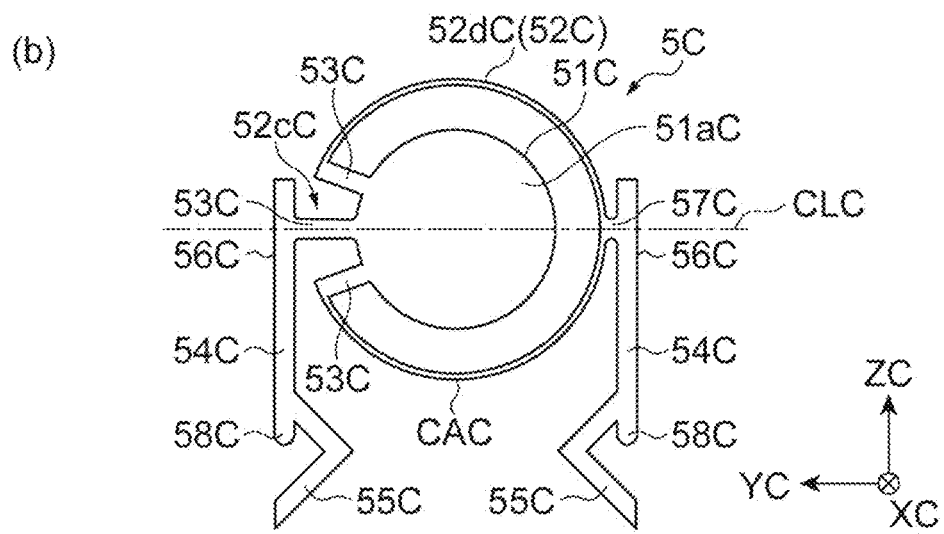
Figure 49:
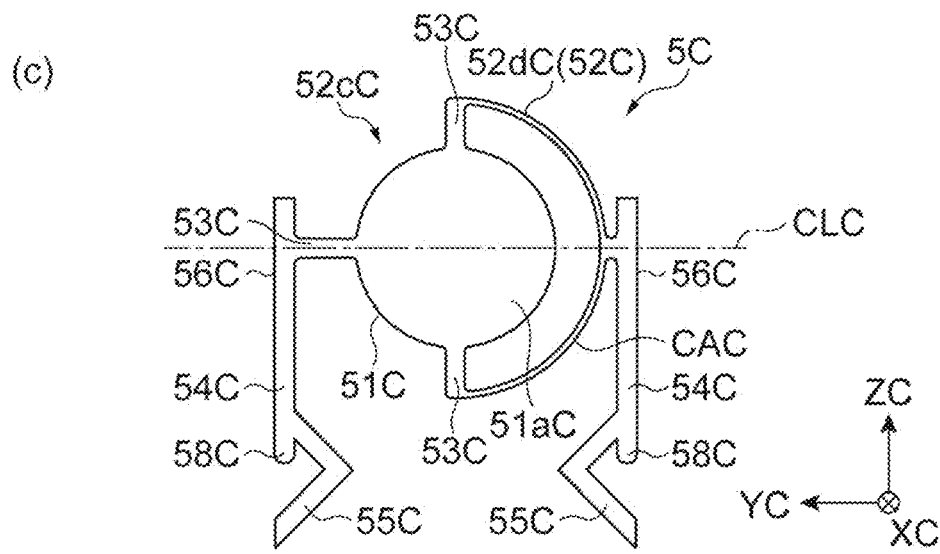

In addition, as illustrated in FIG. 49, when viewed in the XC-axis direction, the elastic portions 52C may be formed to have a shape in which a portion of the circle is cut out. In the example illustrated in FIG. 49(a), the elastic portions 52C have a shape in which a pair of cut-out portions 52cC is provided on both sides of the center line CLC with respect to the circle. That is, here, the elastic portions 52C are constituted of circular arc parts 52dC of a pair which are separated from each other across the cut-out portions 52cC. The connecting portions 53C connect the elastic portions 52C and the mirror portion 51C to each other at end portions of each of the circular arc parts 52dC. Accordingly, here, one annular region CAC is formed by one circular arc part 52dC, the pair of connecting portions 53C which is connected to the one circular arc part 52dC, and the mirror portion 51C.

In the example illustrated in FIGS. 49(b) and 49(c), the elastic portion 52C is constituted as a single circular arc part 52dC by a single cut-out portion 52cC. The connecting portions 53C connect the elastic portion 52C and the mirror portion 51C to each other at end portions of the elastic portion 52C. Accordingly, here, the annular region CAC is formed by the elastic portion 52C, the pair of connecting portions 53C, and the mirror portion 51C. Here, the connecting portions 53C connect the support portions 56C and the mirror portion 51C to each other via the cut-out portion 52cC. That is, the mirror portion 51C may be directly connected to the support portions 56C.

Figure 50:
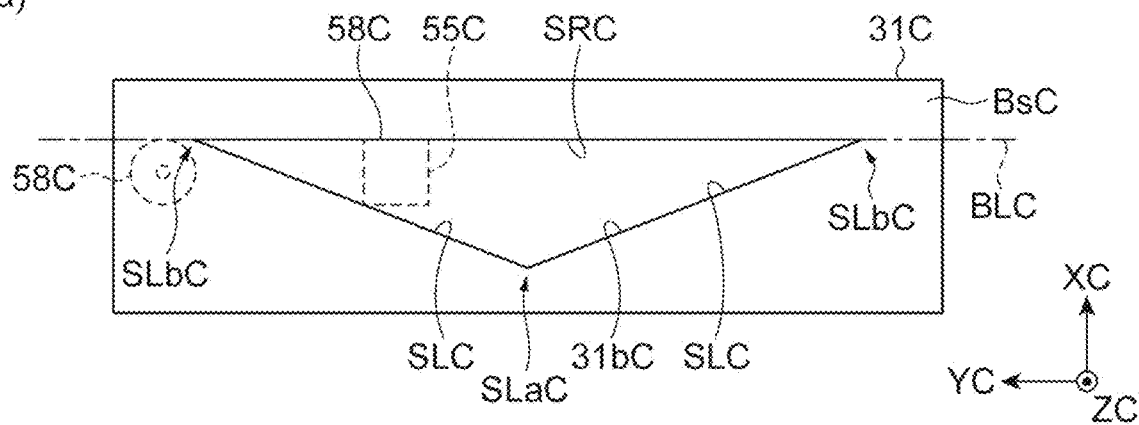
FIG. 50 is a plan view illustrating a modification example of an opening.
Figure 50:
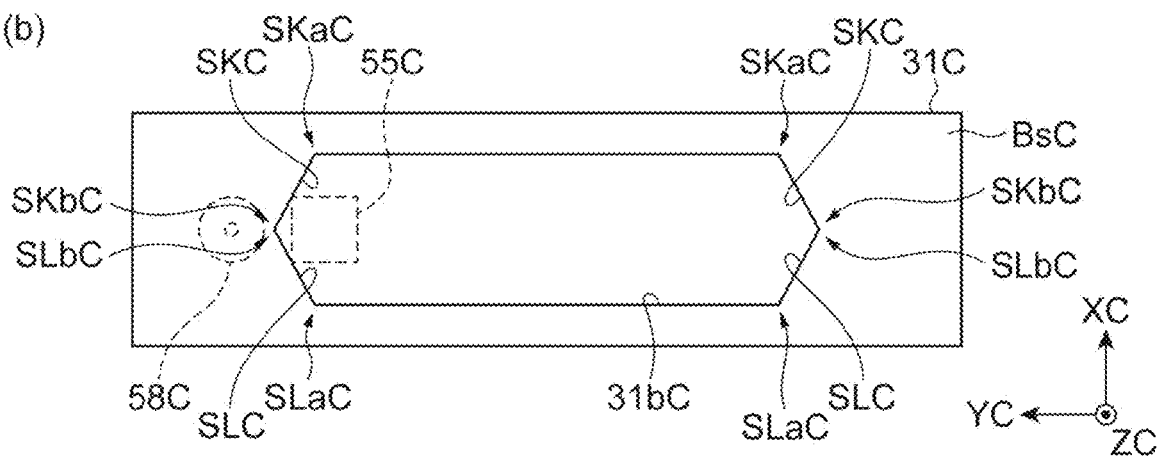
Figure 50:
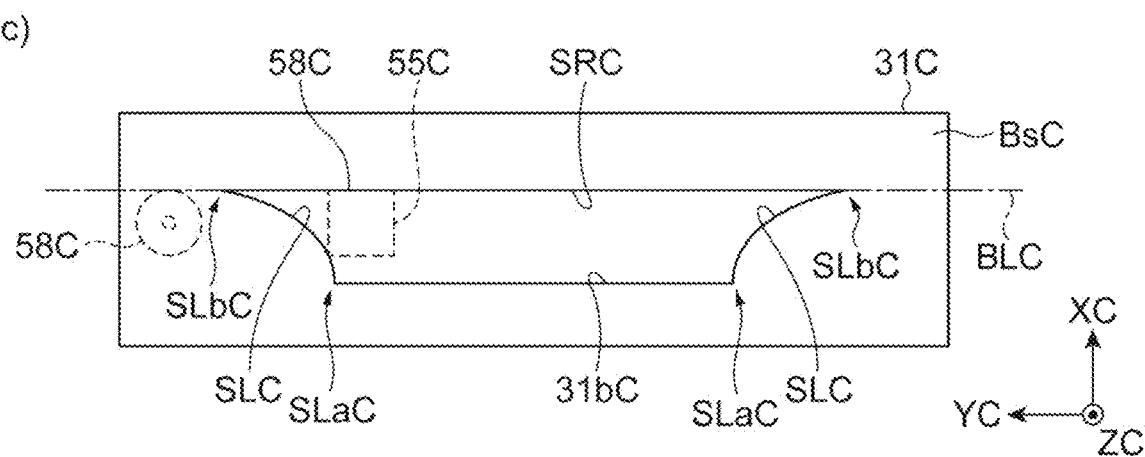

Subsequently, modification examples of the opening 31bC illustrated in FIG. 30 will be described. As illustrated in FIG. 50(a), the shape of the opening 31bC when viewed in the ZC-axis direction may be a triangular shape. In this case, the inner surface of the opening 31bC is constituted of the pair of inclined surfaces SLC and the reference surface SRC. Here, one ends SLaC of the inclined surfaces SLC are connected to each other. In this case as well, when the interlock portion 55C comes into internal contact with a corner portion defined by the inclined surface SLC and the reference surface SRC, the movable mirror 5C can be positionally aligned in both the XC-axis direction and the YC-axis direction.

In the example illustrated in FIG. 50(b), the shape of the opening 31bC when viewed in the ZC-axis direction is a hexagonal shape. In this case, the inner surface of the opening 31bC includes a pair of inclined surfaces SLC and a pair of inclined surfaces SKC which is inclined to sides opposite to the inclined surfaces SLC. The inclined surfaces SKC of the pair are inclined such that the distance therebetween increases from one end SkaC toward the other end SKbC. Here, the other end SLbC of the inclined surface SLC and the other end SKbC of the inclined surface SKC are connected to each other and form one corner portion. In this case as well, when the interlock portion 55C comes into internal contact with a corner portion defined by the inclined surface SLC and the inclined surface SKC, the movable mirror 5C can be positionally aligned in both the XC-axis direction and the YC-axis direction. Here, when viewed in the ZC-axis direction, one interlock portion 55C comes into contact with the inner surface of the opening 31bC at two points.

As illustrated in FIG. 50(c), the inclined surfaces SLC may be curved surfaces. In this case, inclined surfaces SLC of a pair are inclined and curved such that the distance therebetween increases from one end SLaC toward the other end SLbC. Here, when viewed in the ZC-axis direction, the inclined surface SLC is curved such that the inclination of a tangential line of the inclined surface SLC with respect to the XC-axis gradually increases from the one end SLaC toward the other end SLbC. The inclined surface SLC is curved to be projected inward toward the opening 31bC. Even in this case as well, when the interlock portion 55C comes into internal contact with a corner portion defined by the inclined surface SLC and the reference surface SRC, the movable mirror 5C can be positionally aligned in both the XC-axis direction and the YC-axis direction.

Figure 51:
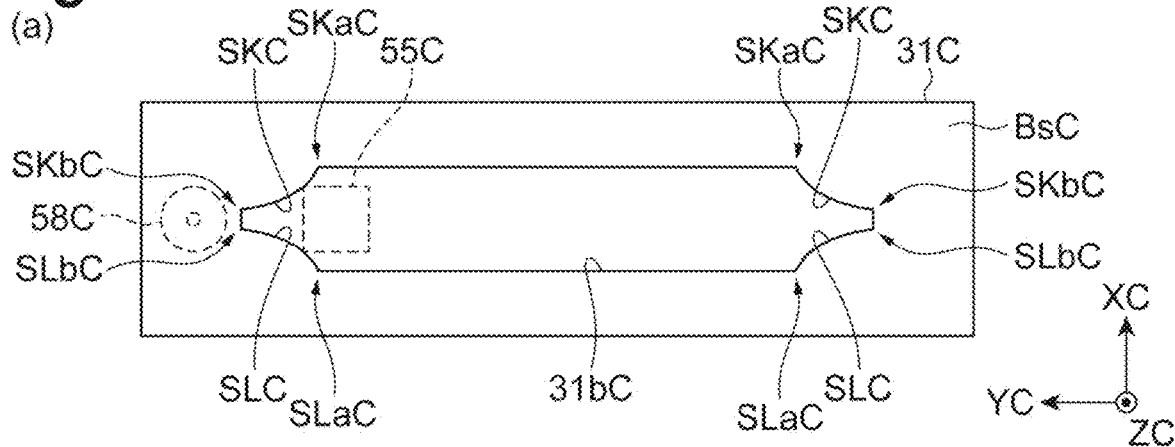
FIG. 51 is a plan view illustrating another modification example of the opening.
Figure 51:
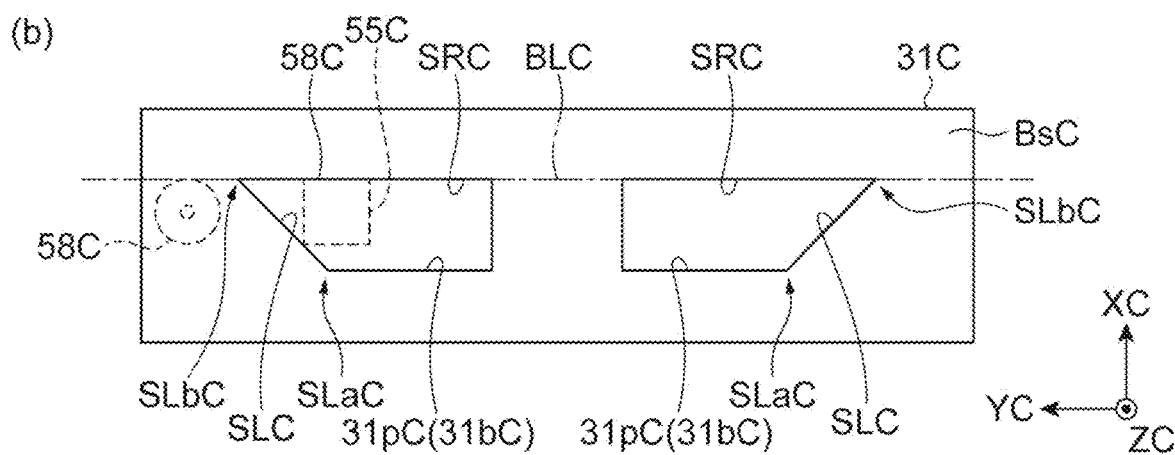
Figure 51:
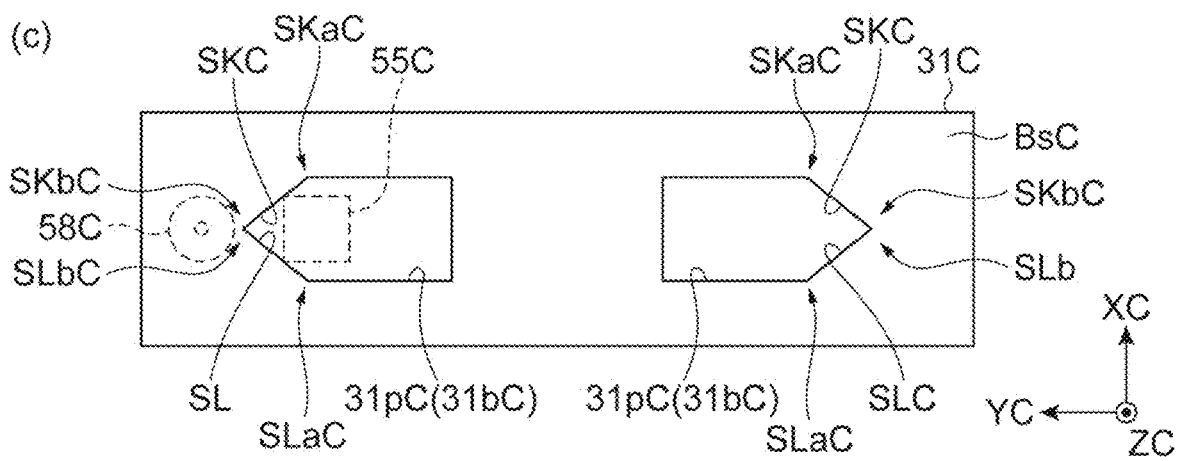

In the example illustrated in FIG. 51(a), both the inclined surface SLC and the inclined surface SKC have a curved surface to be projected inward to the opening 31bC. In addition, the other end SLbC of the inclined surface SLC and the other end SKbC of the inclined surface SKC are connected to each other via a connection surface which extends in the XC-axis direction. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

In the example illustrated in FIG. 51(b), the opening 31bC is divided into two parts 31pC when viewed in the ZC-axis direction. Each of the two parts 31pC has the inclined surface SLC and the reference surface SRC. That is, here, the reference surface SRC is also divided into two parts. However, when viewed in the ZC-axis direction, the reference surface SRC in its entirety extends along the reference line BLC connecting the other end SLbC of the inclined surface SLC of one part 31pC and the other end SLbC of the inclined surface SLC of the other part 31pC to each other. In this case, one interlock portion 55C is inserted into the one part 31pC of the opening 31bC. Then, when the interlock portion 55C comes into internal contact with a corner portion defined by the inclined surface SLC and the reference surface SRC, the movable mirror 5C can be positionally aligned in both the XC-axis direction and the YC-axis direction.

In the example illustrated in FIG. 51(c) as well, the opening 31bC is divided into two parts 31pC when viewed in the ZC-axis direction. Each of the two parts 31pC has the inclined surface SLC and the inclined surface SKC. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

Figure 52:
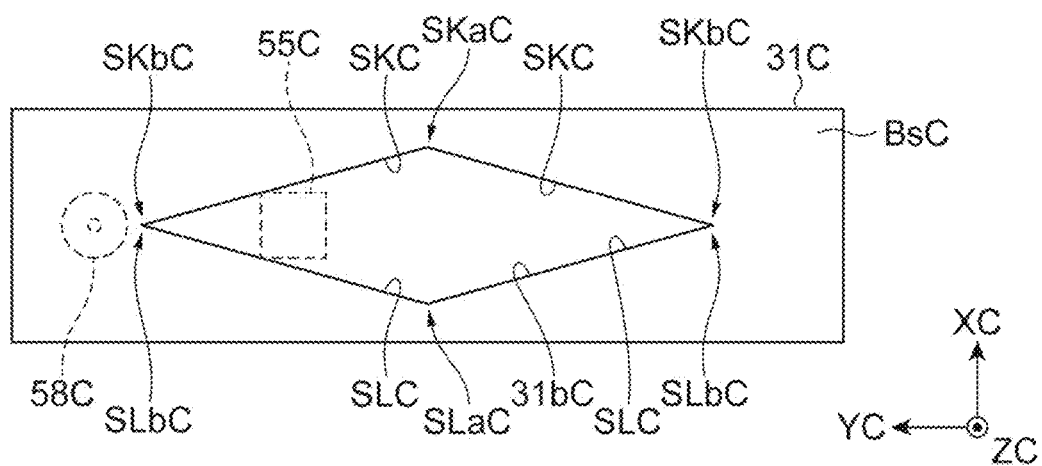
FIG. 52 is a plan view illustrating another modification example of the opening.
Figure 52:
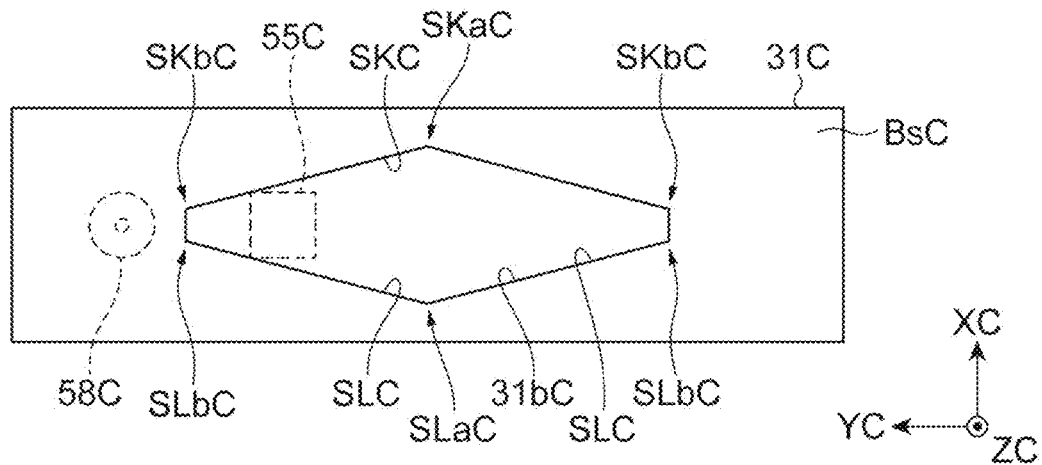

In the example illustrated in FIG. 52(a), the shape of the opening 31bC when viewed in the ZC-axis direction is a rhombic shape. Here, the inner surface of the opening 31bC is constituted of the inclined surfaces SLC and the inclined surfaces SKC. That is, here, in addition to that the inclined surfaces SLC and the inclined surfaces SKC are connected to each other, one ends SLaC of the inclined surfaces SLC are connected to each other, and one ends SkaC of the inclined surfaces SKC are connected to each other. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

Moreover, in the example illustrated in FIG. 52(b), the other end SLbC of the inclined surface SLC and the other end SKbC of the inclined surface SKC are connected to each other via a connection surface which extends in the XC-axis direction. In addition, one ends SLaC of the inclined surfaces SLC are connected to each other, and one ends SkaC of the inclined surfaces SKC are connected to each other. In this case as well, when the interlock portion 55C comes into internal contact with a corner portion defined by the inclined surface SLC and the inclined surface SKC, the movable mirror 5C can be positionally aligned in both the XC-axis direction and the YC-axis direction.

As above, when the side surface of the interlock portion 55C comes into contact with the inner surface of the opening 31bC such as a case where the side surface of the interlock portion 55C and the reference surface SRC of the opening 31bC come into contact with each other, the side surface of the interlock portion 55C can be used as the contact portion 58C in bonding.

Here, in the foregoing description, a case where the interlock portion 55C is inserted into the opening 31bC after the gap between the support portions 56C is decreased in accordance with the elastic portions 52C which are elastically deformed to be compressed in the facing direction of the support portions 56C has been described as an example. However, it is also possible to employ a modification example in which the interlock portion 55C is inserted into the opening 31bC after the gap between the support portions 56C is increased.

Figure 53:
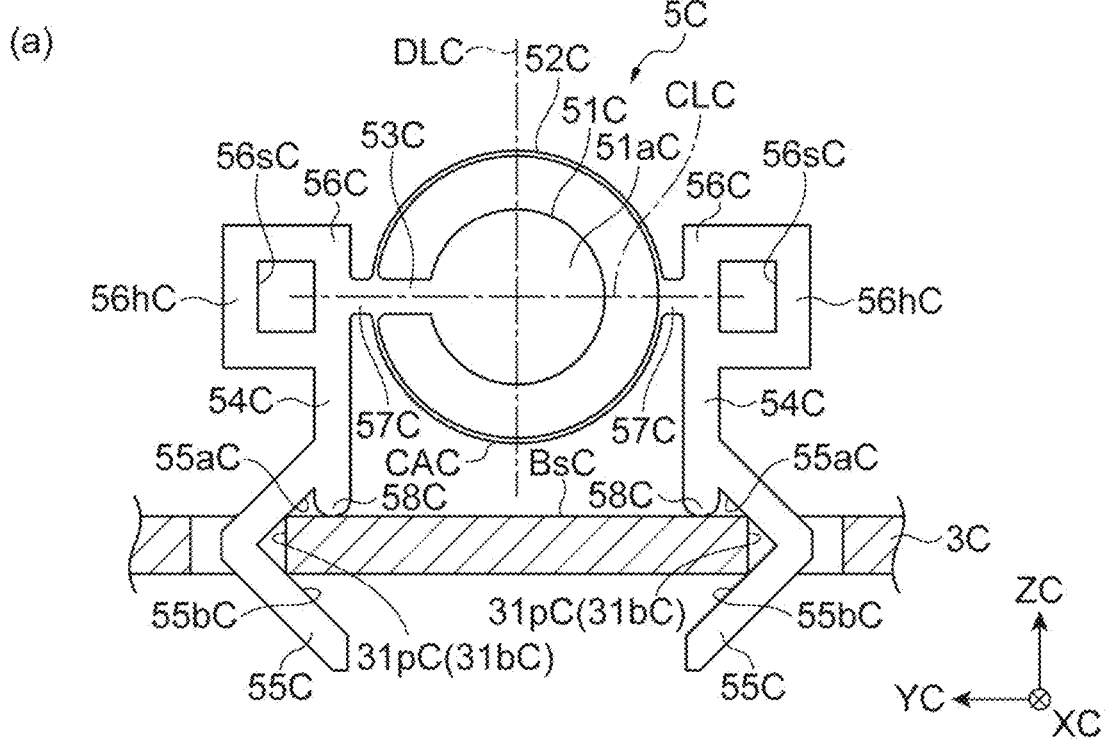
FIG. 53 is a cross-sectional view illustrating another modification example of the movable mirror.
Figure 53:
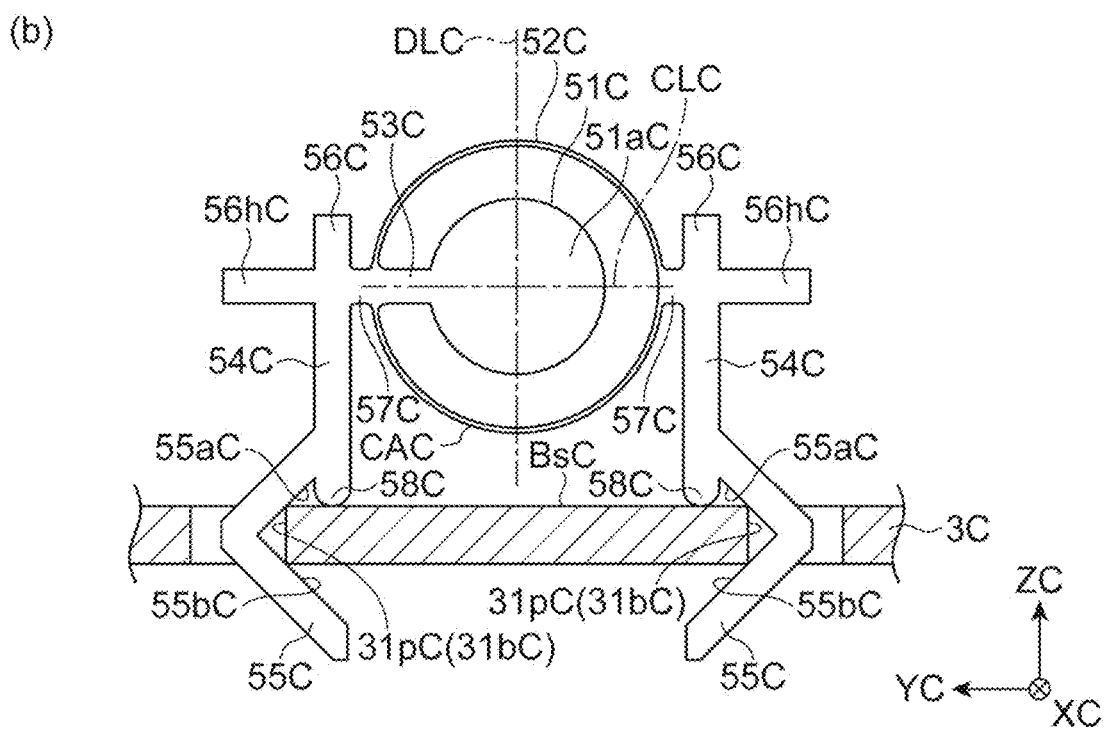
Figure 54:
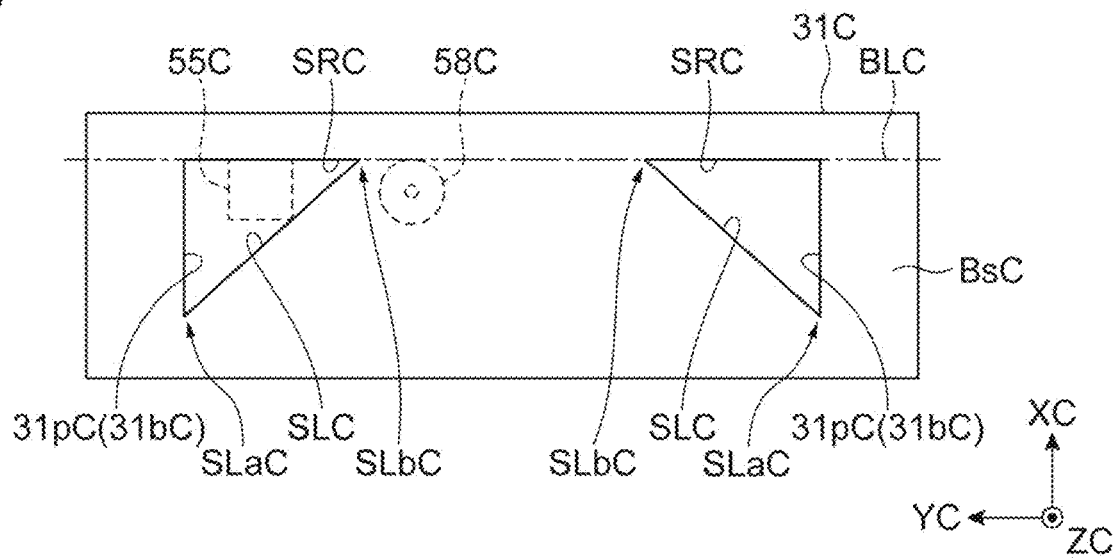
FIG. 54 is a plan view illustrating another modification example of the opening.
Figure 54:
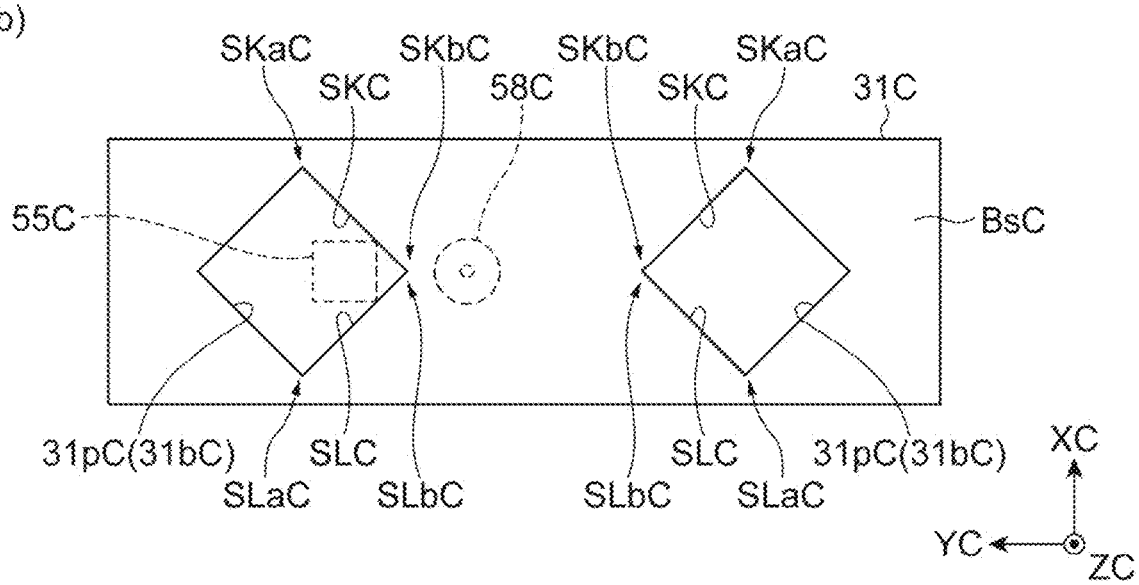

That is, the movable mirror 5C and the opening 31bC can be deformed as illustrated in FIGS. 53 and 54. In the example of FIG. 53, the support portion 56C includes the leg portion 54C, the interlock portion 55C, and the contact portion 58C. However, the bending direction of the interlock portion 55C differs from that of the example in FIG. 28. The interlock portions 55C are bent to be projected to opposite sides in the facing direction between the support portions 56C of the pair. Then, the interlock portions 55C include the inclined surfaces 55aC and the inclined surfaces 55bC as surfaces (inner surfaces) facing each other between the support portions 56C of the pair.

The inclined surfaces 55aC are inclined away from each other in a direction (negative ZC-axis direction) away from the connecting portions 57C. In addition, the inclined surfaces 55bC are inclined toward each other in the negative ZC-axis direction. The absolute value for the inclination angle thereof with respect to the ZC-axis is similar to that of the foregoing example. Here, a handle portion 56hC is provided for each of the support portions 56C. The handle portions 56hC are disposed such that the mirror portion 51C and the elastic portion 52C are sandwiched therebetween in the YC-axis direction. The handle portions 56hC and the connecting portions 57C are arranged in a row along the center line CLC.

In the example of FIG. 53(a), the handle portion 56hC is formed to have a U-shape, and a hole portion 56sC is formed between the handle portion 56hC and the support portion 56C. Therefore, for example, when arms are inserted into the hole portions 56sC, a force can be applied to the handle portions 56hC such that the gap between the support portions 56C is increased. In addition, in the example of FIG. 53(b), the handle portions 56hC are linearly faulted. Therefore, when the handle portions 56hC are grabbed, a force can be applied to the handle portions 56hC such that the gap between the support portions 56C is increased. In these cases, the elastic portion 52C is elastically deformed to be stretched in the YC-axis direction.

Correspondingly, the opening 31bC can be deformed as illustrated in FIG. 54. In the example of FIG. 54(a), the opening 31bC is divided into two triangular parts 31pC. In the movable mirror 5C illustrated in FIG. 53, when an elastic deformation of the elastic portion 52C is partially released in a state where the interlock portions 55C are inserted into the opening 31bC, the interlock portions 55C are displaced toward each other. In order to perform self-alignment utilizing this displacement, the inclined surface SLC is formed in each of the parts 31pC of the opening 31bC as a surface of the mounting region 31C on the center side in the YC-axis direction.

The inclined surface SLC includes one end SLaC and the other end SLbC. The one end SLaC and the other end SLbC are both end portions of the inclined surface SLC when viewed in the ZC-axis direction. The inclined surfaces SLC of the pair are inclined such that the distance therebetween is decreased from the one ends SLaC toward the other ends SLbC (for example, with respect to the XC-axis). When viewed in the ZC-axis direction, the reference surface SRC of each of the parts 31pC extends along the reference line BLC connecting the other end SLbC of one inclined surface SLC and the other end SLbC of the other inclined surface SLC to each other.

Therefore, when the pair of interlock portions 55C is disposed inside the opening 31bC, the interlock portions 55C slide on the inclined surfaces SLC toward the reference surface SRC due to a component of a reaction force from the inclined surfaces SLC in the XC-axis direction and abut the reference surface SRC while being in contact with the inclined surfaces SLC. Accordingly, the interlock portions 55C come into internal contact with the corner portions defined by the inclined surfaces SLC and the reference surfaces SRC and are positionally aligned (self-aligned due to an elastic force) in both the XC-axis direction and the YC-axis direction.

In the example of FIG. 54(b), the opening 31bC is divided into two rhombic parts 31pC. The inclined surface SLC and the inclined surface SKC are formed in each of the parts 31pC of the opening 31bC as a pair of surfaces of the mounting region 31C on the center side in the YC-axis direction. When focusing on one part 31pC, the inclined surface SLC and the inclined surface SKC are inclined to sides opposite to each other. The inclined surfaces SKC are inclined such that the distance therebetween is decreased from one ends SkaC toward the other ends SKbC. Here, the other end SLbC of the inclined surface SLC and the other end SKbC of the inclined surface SKC are connected to each other and form one corner portion. In this case as well, when the interlock portion 55C comes into internal contact with a corner portion defined by the inclined surface SLC and the inclined surface SKC, it is positionally aligned (self-aligned due to an elastic force) in both the XC-axis direction and the YC-axis direction.

Hereinabove, various modification examples of the movable mirror 5C and the opening 31bC have been described. However, the modification examples of the movable mirrors 5C and 5AC and the opening 31bC are not limited to those described above. For example, the contact portion 58C may include both the protrusion portion which is bifurcated from the interlock portion 55C and the side surface of the interlock portion 55C which faces the inner surface of the opening 31bC. In this case, the movable mirror 5C can be bonded to the mounting region 31C in both the protrusion portions and the side surfaces of the interlock portions 55C. In addition, the movable mirrors 5C and 5AC and the opening 31bC can be constituted as another modification example by replacing arbitrary parts in the foregoing modification examples with each other. The same applies to the fixed mirror 6C and the opening 37aC.

Moreover, in the foregoing embodiment, a movable mirror and a fixed mirror have been described as examples of optical elements to be mounted on the base BC. In this example, the optical surface is a mirror surface. However, the optical element which becomes a mounting target is not limited to a mirror. For example, an arbitrary element such as a grating, an optical filter, or the like can be adopted.

In addition, the shapes of the mirror portions 51C and 61C and the mirror surfaces 51aC and 61aC are not limited to a circular shape and may be a rectangular shape or other shapes. In addition, the annular region CAC does not have to be formed in the elastic portion 52C. The following are appendixes of the foregoing third embodiment.

[Appendix 14]
An optical module including:
an optical element; and
a base on which the optical element is mounted, in which the optical element has
an optical portion which has an optical surface,
an elastic portion which is provided around the optical portion, and
a pair of support portions to which an elastic force is applied and in which a distance therebetween is able to be changed in accordance with elastic deformation of the elastic portion,
the base has
a main surface, and
a mounting region in which an opening communicating with the main surface is provided,
the support portion includes
an interlock portion which is inserted into the opening in a state where an elastic force of the elastic portion is applied, and
a contact portion which comes into contact with the mounting region in a state where the interlock portion is inserted into the opening, and
the optical element is supported in the mounting region by a reaction force of the elastic force applied from an inner surface of the opening to the interlock portion in a state where the optical surface intersects the main surface and is bonded to the mounting region in the contact portion.

[Appendix 15]
The optical module according to appendix 14, in which
the support portion includes a protrusion portion which is bifurcated from the interlock portion and protrudes to the base side, and
the contact portion includes a distal end portion of the protrusion portion,

[Appendix 16]
The optical module according to appendix 14 or 15, in which
the contact portion includes a side surface of the interlock portion facing the inner surface of the opening,

[Appendix 17]
The optical module according to any one of appendixes 14 to 16, in which
the base has a support layer and a device layer which is provided on the support layer and includes the main surface and the mounting region,
the opening penetrates the device layer in a direction intersecting the main surface, and
the interlock portion is bent to come into contact with a pair of edge portions of the opening in a direction intersecting the main surface.

[Appendix 18]
The optical module according to any one of appendixes 14 to 17, in which
the inner surface of the opening includes
a pair of inclined surfaces which is inclined such that a distance therebetween increases from one end toward the other end when viewed in a direction intersecting the main surface, and
a reference surface which extends along a reference line connecting the other end of one inclined surface and the other end of the other inclined surface to each other, and
the contact portion includes a side surface of the interlock portion facing the reference surface.

[Appendix 19]
The optical module according to appendix 17, further including:
a fixed mirror which is mounted in at least one of the support layer, the device layer, and an intermediate layer which is provided between the support layer and the device layer; and
a beam splitter which is mounted in at least one of the support layer, the device layer, and the intermediate layer, in which
the optical element is a movable mirror which includes the optical surface serving as a mirror surface,
the device layer has a driving region which is connected to the mounting region, and
the movable mirror, the fixed mirror, and the beam splitter are disposed such that an interference optical system is constituted.

[Appendix 20]
The optical module according to appendix 19, in which
the base has the intermediate layer which is provided between the support layer and the device layer,
the support layer is a first silicon layer of an SOI substrate,
the device layer is a second silicon layer of the SOI substrate, and
the intermediate layer is an insulating layer of the SOI substrate.

[Appendix 21]
The optical module according to appendix 19 or 20, further including:

a light incident unit which is disposed such that measurement light is incident on the interference optical system from outside; and a light emission unit which is disposed such that the measurement light is emitted from the interference optical system to the outside.

The optical module according to the first embodiment, the optical module according to the second embodiment, and the optical module according to the third embodiment described above can be subjected to modification in which an arbitrary element thereof is added to and/or replaced with each other.

INDUSTRIAL APPLICABILITY

It is possible to provide an optical module in which reliable mounting of a movable mirror with respect to a device layer is realized.

REFERENCE SIGNS LIST

1A Optical module
2A Support layer
3A Device layer
4A Intermediate layer
5A Movable mirror
6A Fixed mirror
7A Beam splitter
8A Light incident unit
9A Light emission unit
10A Interference optical system
21A Opening (second opening)
23A Recess portion (second recess portion)
31A Mounting region
32A Driving region
38A Recess portion (first recess portion)
41A Opening (first opening)
51aA Mirror surface
S1A Space
1B Optical module
2B Support layer
3B Device layer
4B Intermediate layer
5B Movable mirror
6B Fixed mirror
7B Beam splitter
8B Light incident unit
9B Light emission unit
10B Interference optical system
31B Mounting region
31bB First opening
31cB Second opening
32B Driving region
51B Mirror portion
51aB Mirror surface
52B Elastic portion
53B Support portion
56B Interlock portion (protrusion portion)
57B Folded portion
BB Base
BaB First surface
BbB Second surface
SAB Inclined surface
SAaB One end
SAbB The other end
1C Optical module
2C Support layer
3C Device layer
4C Intermediate layer
5C, 5AC Movable mirror (optical element)
6C Fixed mirror (optical element)
7C Beam splitter
8C Light incident unit
9C Light emission unit
10C Interference optical system
31C, 37C Mounting region
31bC, 37aC Opening
32C Driving region
51C, 61C Mirror portion (optical portion)
51aC, 61aC Mirror surface (optical surface)
52C, 62C Elastic portion
53C, 63C Connecting portion
54C, 64C Leg portion
55C, 65C Interlock portion
55aC, 55bC, 65aC, 65bC Inclined surface
56C, 66C Support portion
57C, 67C Connecting portion
58C, 68C Contact portion
SLC Inclined surface
SLaC One end
SLbC The other end
SRC Reference surface
BLC Reference line

The invention claimed is:

1. An optical module comprising:
a support layer;
a device layer which is provided on the support layer; and
a movable mirror which is mounted in the device layer,
wherein the device layer has
a mounting region which is penetrated by the movable mirror, and
a driving region which is connected to the mounting region,
wherein a space corresponding to at least the mounting region and the driving region is formed between the support layer and the device layer,
wherein a portion of the movable mirror is positioned in the space, and
wherein the movable mirror is fixed to the mounting region such that the movable mirror penetrates the mounting region both in a driving state of the movable mirror and in a non-driving state of the movable mirror.

2. The optical module according to claim 1, further comprising:
an intermediate layer which is provided between the support layer and the device layer,
wherein a first opening is formed in the intermediate layer,
wherein a recess portion or a second opening is formed in the support layer,
wherein the space includes a region inside the first opening and a region inside the recess portion, or a region inside the first opening and a region inside the second opening, and
wherein the portion of the movable mirror is positioned in the region inside the recess portion or the region inside the second opening.

3. The optical module according to claim 2,
wherein the support layer is a first silicon layer of an SOI substrate,
wherein the device layer is a second silicon layer of the SOI substrate, and
wherein the intermediate layer is an insulating layer of the SOI substrate.

4. The optical module according to claim 1,
wherein a recess portion or an opening is formed in the support layer,
wherein the space includes a region inside the recess portion or a region inside the opening, and
wherein the portion of the movable mirror is positioned in the region inside the recess portion or the region inside the opening.

5. The optical module according to claim 1,
wherein a recess portion is formed in the device layer,
wherein the space includes a region inside the recess portion,
wherein the portion of the movable mirror is positioned in the region inside the recess portion.

6. The optical module according to claim 1,
wherein a first recess portion is formed in the device layer,
wherein a second recess portion or an opening is formed in the support layer,
wherein the space includes a region inside the first recess portion and a region inside the second recess portion, or a region inside the first recess portion and a region inside the opening, and
wherein the portion of the movable mirror is positioned in the region inside the second recess portion or the region inside the opening.

7. The optical module according to claim 1,
wherein a mirror surface of the movable mirror is positioned on a side opposite to the support layer with respect to the device layer.

8. The optical module according to claim 1, further comprising:
a fixed mirror which is mounted in at least one of the support layer, the device layer, and an intermediate layer which is provided between the support layer and the device layer; and
a beam splitter which is mounted in at least one of the support layer, the device layer, and the intermediate layer,
wherein the movable mirror, the fixed mirror, and the beam splitter are disposed such that an interference optical system is constituted.

9. The optical module according to claim 8, further comprising:
a light incident unit which is disposed such that measurement light is incident on the interference optical system from outside; and
a light emission unit which is disposed such that the measurement light is emitted from the interference optical system to the outside.

10. An optical module comprising:
a support layer;
a device layer which is provided on the support layer;
a movable mirror which is mounted in the device layer;
a fixed mirror which is mounted in at least one of the support layer, the device layer, and an intermediate layer which is provided between the support layer and the device layer; and
a beam splitter which is mounted in at least one of the support layer, the device layer, and the intermediate layer,
wherein the movable mirror, the fixed mirror, and the beam splitter are disposed such that an interference optical system is constituted,
wherein the device layer has
a mounting region which is penetrated by the movable mirror, and
a driving region which is connected to the mounting region,
wherein a space corresponding to at least the mounting region and the driving region is formed between the support layer and the device layer, and
wherein a portion of the movable mirror is positioned in the space.

11. The optical module according to claim 10, further comprising:
a light incident unit which is disposed such that measurement light is incident on the interference optical system from outside; and
a light emission unit which is disposed such that the measurement light is emitted from the interference optical system to the outside.

* * * * *